(12) United States Patent
Katakura et al.

(10) Patent No.: US 7,203,714 B1
(45) Date of Patent: Apr. 10, 2007

(54) LOGIC CIRCUIT

(75) Inventors: Hiroshi Katakura, Kawasaki (JP); Yasuhiko Nakashima, Kyoto (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/522,470

(22) Filed: Mar. 9, 2000

(30) Foreign Application Priority Data

Mar. 16, 1999 (JP) .................................. 11-070580

(51) Int. Cl.
*G06F 15/00* (2006.01)
(52) U.S. Cl. .................................... 708/200
(58) Field of Classification Search ............... 708/234, 708/232, 318, 700–714, 670, 200; 326/38, 326/52, 113; 379/294
See application file for complete search history.

(56) References Cited

U.S. PATENT DOCUMENTS

| | | | | |
|---|---|---|---|---|
| 4,064,421 A | * | 12/1977 | Gajski et al. ............... | 708/234 |
| 4,566,064 A | * | 1/1986 | Whitaker ..................... | 326/38 |
| 4,621,338 A | * | 11/1986 | Uhlenhoff .................... | 708/702 |
| 4,622,648 A | | 11/1986 | Whitaker | |
| 4,700,323 A | * | 10/1987 | Renner et al. .............. | 708/318 |
| 4,740,906 A | * | 4/1988 | Renner et al. .............. | 708/318 |
| 4,792,909 A | * | 12/1988 | Serlet .......................... | 716/10 |
| 4,866,655 A | * | 9/1989 | Nishiyama et al. ......... | 708/670 |
| 4,870,302 A | * | 9/1989 | Freeman ..................... | 708/232 |
| 4,916,627 A | * | 4/1990 | Hathaway .................... | 716/6 |
| 5,040,139 A | * | 8/1991 | Tran ............................ | 708/628 |
| RE34,363 E | * | 8/1993 | Freeman ..................... | 379/294 |
| 5,272,662 A | * | 12/1993 | Scriber et al. .............. | 708/714 |
| 5,430,390 A | * | 7/1995 | Chan et al. .................. | 326/38 |
| 5,450,022 A | * | 9/1995 | New ............................ | 326/39 |
| 5,523,707 A | * | 6/1996 | Levy et al. .................. | 326/52 |
| 5,982,198 A | * | 11/1999 | Fulkerson ................... | 326/119 |
| 5,986,468 A | * | 11/1999 | Chan et al. .................. | 326/40 |
| 6,005,418 A | * | 12/1999 | Taki ............................ | 326/113 |
| 6,012,079 A | * | 1/2000 | Song ............................ | 708/714 |
| 6,051,031 A | * | 4/2000 | Shubat et al. ................ | 716/3 |

(Continued)

FOREIGN PATENT DOCUMENTS

EP          0 647 030 A2        4/1995

(Continued)

OTHER PUBLICATIONS

Notification of Reasons for Refusal; Japanese Patent Application HEI 11-070580; Translation of the Office Action mailed Jul. 20, 2004.

(Continued)

*Primary Examiner*—Meng-Al T. An
*Assistant Examiner*—Chat C. Do
(74) *Attorney, Agent, or Firm*—Westerman, Hattori, Daniels & Adrian, LLP.

(57) ABSTRACT

A CMOS logic circuit is disclosed wherein the number of kinds of basic parts is suppressed to five to allow designing of a circuit which operates at a high speed and repetitiveness of wiring lines is increased to allow designing of a circuit which is simple in circuit scale and high in expandability and besides the time required for adjustment of components is reduced significantly to reduce the man-hours for arrangement significantly to reduce the man-hours for development significantly and the same basic parts are used so as to achieve augmentation of the yield and promote reduction of the production cost.

1 Claim, 30 Drawing Sheets

U.S. PATENT DOCUMENTS 6,078,191 A * 6/2000 Chan et al. .................. 326/40
6,130,559 A * 10/2000 Balsara et al. .............. 708/670

FOREIGN PATENT DOCUMENTS

| JP | 59-226 | 1/1984 |
| JP | 59-201527 | 11/1984 |
| JP | 60-37822 | 2/1985 |
| JP | 63-94713 | 4/1988 |
| JP | 2-293894 | 12/1990 |
| JP | 4-326617 | 11/1992 |
| JP | 4340127 | 11/1992 |
| JP | 6-187129 | 7/1994 |
| JP | 9-162722 | 6/1997 |
| WO | WO 96/08761 | 3/1996 |

OTHER PUBLICATIONS

Notice of Reasons of Rejection from Japanese Patent Office in Application No. 11-070580 mailed Apr. 13, 2004 and translation.
Notification of Reason(s) of Refusal mailed Jun. 20, 2006.

* cited by examiner

FIG. 4

| A | XA | B | XB | OR (GE) | AND (GT) | NAND (LE) | NOR (LT) |
|---|----|---|----|---------|----------|-----------|----------|
| 0 | 1  | 0 | 1  | 1       | 0        | 1         | 0        |
| 0 | 1  | 1 | 0  | 0       | 0        | 1         | 1        |
| 1 | 0  | 0 | 1  | 1       | 1        | 0         | 0        |
| 1 | 0  | 1 | 0  | 1       | 0        | 1         | 0        |

FIG. 12

| A | XB | (B) | GT=CARRY |
|---|----|-----|----------|
| 0 | 0  | 1   | 0        |
| 0 | 1  | 0   | 0        |
| 1 | 0  | 1   | 1        |
| 1 | 1  | 0   | 0        |

FIG. 18(a)

| INPUT | | | OUTPUT | |
|---|---|---|---|---|
| S | XS | A1 | X1 | |
| 0 | 1 | 0 | 1 | |
| 0 | 1 | 1 | 0 | |
| 1 | 0 | 0 | 0 | |
| 1 | 0 | 1 | 0 | |
| 0 | 0 | X | — | INPUT INHIBITED |
| 1 | 1 | X | — | INPUT INHIBITED |

FIG. 18(b)

| INPUT | | | OUTPUT | |
|---|---|---|---|---|
| S | XS | A2 | X2 | |
| 0 | 1 | 0 | 1 | |
| 0 | 1 | 1 | 0 | |
| 1 | 0 | 0 | 1 | |
| 1 | 0 | 1 | 1 | |
| 0 | 0 | X | — | INPUT INHIBITED |
| 1 | 1 | X | — | INPUT INHIBITED |

FIG. 19

| INPUT | | | | OUTPUT | |
|---|---|---|---|---|---|
| S | XS | A1 | A2 | X1 | X2 |
| XA<1> | A<1> | XA<0> | A<0> | | |
| 0 | 1 | 0 | 1 | 1 | 0 |
| 0 | 1 | 1 | 0 | 0 | 1 |
| 1 | 0 | 0 | 1 | 0 | 1 |
| 1 | 0 | 1 | 0 | 0 | 1 |

FIG. 21

| INPUT | | | | | | OUTPUT |
|---|---|---|---|---|---|---|
| I | XI | S | XS | A | XA | X |
| 0 | 1 | 0 | 1 | 0 | 1 | 0 |
| 0 | 1 | 0 | 1 | 1 | 0 | 1 |
| 0 | 1 | 1 | 0 | 0 | 1 | 0 |
| 0 | 1 | 1 | 0 | 1 | 0 | 1 |
| 1 | 0 | 0 | 1 | 0 | 1 | 0 |
| 1 | 0 | 0 | 1 | 1 | 0 | 1 |
| 1 | 0 | 1 | 0 | 0 | 1 | 1 |
| 1 | 0 | 1 | 0 | 1 | 0 | 0 | ns
LOGIC CIRCUIT

BACKGROUND OF THE INVENTION

1) Field of the Invention

This invention relates to a logic circuit suitable for use with a magnitude comparison circuit, a carrier production circuit, a full adder circuit and an increment circuit.

2) Description of the Related Art

A great number of magnitude comparison circuits, carry generation circuits, full adder circuits and increment circuits are used as basic circuits in a processor. The processor requires a large number of basic circuits in order to perform addition and subtraction with operation commands. For example, a magnitude comparison circuit is used for floating point arithmetic. In particular, when floating point arithmetic is performed, positioning of two parts including a characteristic and a mantissa of a numeral must be performed. Therefore, the magnitude comparison circuit is used when it is required to compare two parts of a numeral to discriminate which one of the two parts is a characteristic or a mantissa in order to perform the positioning. An adder circuit is used, in order to perform address calculation to effect load/store, to add two or three kinds of operands to determine an address to load data from a memory. A carry generation circuit is used to make it possible to perform high speed arithmetic where the bit length on an adder circuit is great. Further, an increment circuit is used principally for a command register and has an increment of several lower figures which varies at random. In this point, the increment circuit is different from an ordinary counter circuit. In particular, an increment circuit having a great bit length of 64 bits is used. Therefore, an ordinary counter such as a register is not used for the increment circuit. Further, while the counter circuit increments one by one, the increment circuit has an increment which exhibits a variation among 2, 4, 8, 16 and so forth.

Since the working speeds of such basic circuits as described above determine the processing speed of the processor, they must be constructed as circuits which operate at high speeds. However, since generally the bit widths of the circuits are different depending upon places where they are used, many kinds of magnitude comparison circuits, carrier production circuits, adder circuits and increment circuits must be developed. As the technology progresses year by year, it is demanded to efficiently develop those kinds of circuits which have different bit widths and operate at high speeds. Therefore, minimized numbers of leaf cells are required to be used to construct circuits which operate at high speeds.

The leaf cell (also called functional cell) is a cell of a hierarchy in which layout thereof must be performed on the transistor level and is a cell of the lowest layer of a module which exhibits a function. For example, a module in a hierarchy below a circuit which has a 64-bit addition function is a 16-bit adder circuit, and a module of a hierarchy below the circuit having the 16-bit addition function is a 4-bit adder circuit. And, where there is no module in a hierarchy below the circuit having the 4-bit addition function, the 4-bit adder circuit is formed from a leaf cell of the lowest hierarchy.

Now, an example of an adder circuit is described with reference to FIGS. 26 to 29 and an example of an increment circuit is described with reference to FIG. 30.

First, since a look-ahead carry full adder circuit is used for an adder circuit, the adder circuit requires a great number of parts. The look-ahead carry full adder circuit signifies a circuit which performs arithmetic using a carry generation function G and a carry propagation function P for a unit of a block which is formed from 4 groups each formed from 4 bits. The reason why the look-ahead carry full adder circuit just described is used is that a carry propagation adder circuit cannot perform high speed processing. In particular, the carry propagation adder circuit performs addition simply and propagates a carry signal successively from the lowest order figure to the highest order figure and requires excessive time for the addition. In contrast, the look-ahead carry full adder circuit is used so that processing of the carry can be performed at a high speed. This is described more specifically with reference to FIGS. 26 to 29.

FIG. 26 is a block diagram showing an example of a functional block of an 8-bit look-ahead carry full adder circuit. Referring to FIG. 26, the 8-bit look-ahead carry full adder circuit 90 shown includes a carry generation/propagation unit 91, an 8-bit CLA (look-ahead carry) unit 92 and a sum unit 93.

An 8-bit signal A [$A_7 A_6 A_5 A_4 A_3 A_2 A_1 A_0$] and another 8-bit signal B [$B_7 B_6 B_5 B_4 B_3 B_2 B_1 B_0$] are inputted to the carry generation/propagation unit 91, and a carry for each bit number n is outputted in accordance with the following expression from the 8-bit CLA unit 92:

$$C_{n+1} = C_n \cdot P_n + G_n$$

where $G_n$ is the carry signal, $P_n$ is a carry propagation function, and $C_n$ is a carry generation function. Results of the arithmetic of the 8-bit CLA unit 92 are supplied as a plurality of carries to the sum unit 93, and results of addition from the carries are outputted from the sum unit 93.

The units 91 to 93 have such constructions as shown in FIGS. 27 to 29, respectively. In particular, FIG. 27 is a block diagram showing a detailed construction of the carry generation/propagation unit 91; FIG. 28 is a block diagram showing a general construction of a 4-bit CLA unit; and FIG. 29 is a block diagram showing a general construction of the sum unit. As can be seen from FIGS. 27 to 29, each of the units includes a large number of logic gates.

Similarly, FIG. 30 is a block diagram showing a construction of a 16-bit increment circuit which employs a multi-input AND gate. Referring to FIG. 30, a gate 94 logically exclusively ORs a result of half addition arithmetic at each of the 0th to nth figures ($0 \leq n < 16$) and a carry signal from the lower order figures and outputs a result of the logical exclusive ORing as a full addition arithmetic result. The "carry signal from the lower order figures" is, for example, a signal denoted by C<1> in FIG. 30, and the signal C<1> is determined as an AND value of all of the 15 bits A<1>, A<2>, A<3>, . . . , A<15> lower than the 0th figure (A<0>). Similarly, the gate 94 logically exclusively ORs a half addition arithmetic result at the first figure (A<1>) and a carry signal C<2> determined from an AND value of all of the 14 bits A<2>, A<3>, . . . , A<15>. Further, a carry signal C<13> at the 12th figure from the lower order figures is an AND value of the 3 bits A<13>, A<14>, A<15>; a carry signal C<14> at the 13th figure from the lower order figures is an AND value of the 2 bits A<14>, A<15>; and a carry signal C<15> at the 14th figure from the lower figures is a value of the 15th bit itself. Accordingly, a large number of AND gates are required to determine AND values at the individual figures.

However, since such an adder circuit or an increment circuit as described above requires many kinds of basic circuits and has a complicated structure, it has a subject to be solved in that the processing speed is low. For example, the 4-bit CLA unit shown in FIG. 28 has a complicated structure and requires many kinds of leaf cells. In particular, as seen from a broken line block, the unit shown includes ten AND gates and four OR gates, and where a multi-input gate circuit employs a NOR gate or the like to invert an OR output, the speed is retarded because a delay of propagation by one clock is caused by the NOR gate or the like. The reason is that two PMOS (P-channel Metal Oxide Semiconductor) FETs (Field Effect Transistors) are connected in series. Further, as seen from FIG. 30, also the increment circuit includes many basic parts and has a complicated structure with a comparatively low degree of repetitiveness of wiring lines, and consequently, many man-hours are required for the layout (arrangement) of the gates and so forth.

Meanwhile, many proposals have been made in order to raise the speed of an entire circuit. Japanese Patent Laid-Open No. 187129/1994 (hereinafter referred to as document 1) discloses a technique wherein, in order to provide a semiconductor device wherein logic circuits such as full adders and so forth having a high speed and a small circuit scale are integrated, a logic production section composed of four NMOS transistors and a latch circuit composed of two PMOS transistors are combined to form a high speed logic circuit including a small number of elements as a basic circuit and such basic circuits are combined to form several function circuits such as a full adder. The document 1, however, does not disclose a technique for expanding the function circuits.

In order to achieve reduction of the number of elements used and augmentation of the operation speed, a technique regarding a pass transistor logic circuit is disclosed in Japanese Patent Laid-Open No. 162722/1997 (hereinafter referred to as document 2). The object of the document 2 is such as follows. In particular, it is an object of the document 2 to provide a pass transistor logic circuit which exhibits an improved H level and simultaneously allows operation with a low power supply voltage without using a pull-up circuit, reduces the load to an outputting circuit in the preceding stage to achieve augmentations of the operation speed, prevention of failure in transmission of a signal to a next stage and augmentation of the resistance to noise, suppresses the number of stages of transistors in a logical arithmetic system of a logic circuit composed only of pass transistors as far as possible to augment the operation speed while comparatively complicated logic can be implemented and particularly logic which cannot be implemented readily with a logic circuit which is formed only from pass transistors can also be augmented comparatively readily, and allows implementation of a logic circuit which includes a reduced number of necessary elements and operates with a comparatively high operation speed even in comparison with an alternative circuit formed from a CMOS (Complementary Metal Oxide Semiconductor) logic circuit. According to the technique of the document 2, however, a plurality of pass transistors whose outputs exhibit on or off in response to logical values of inputs thereto are connected in series or in parallel to form a circuit which performs logical AND arithmetic or logical OR arithmetic to obtain a desired logic circuit. Therefore, the technique of the document 2 still is complicated in construction and lacks in expandability.

Different techniques relating to a pass transistor are disclosed in U.S. Pat. No. 4,566,064 (hereinafter referred to as document 3), Japanese Patent Laid-Open No. 226/1984 (hereinafter referred to as document 4) and U.S. Pat. No. 4,622,648 (hereinafter referred to as document 5). The techniques disclosed in the documents 3 to 5 have an object to provide a novel logic circuit construction method. According to the techniques of the documents 3 to 5, a pass transistor is used to form a logic circuit, and the regularity of resultant logic circuits formed in this manner is increased to the maximum. Where logic circuits obtained using the techniques are used to form a combination circuit, the combination circuit is augmented significantly in terms of the configuration, power and operation speed when compared with ordinary logic circuits. However, the documents 3 to 5 do not disclose a functional circuit such as an adder circuit, a magnitude comparison circuit, an increment circuit or a like circuit.

Meanwhile, a technique for reducing the number of transistors which form an EXOR or EXNOR circuit is disclosed in Japanese Patent Laid-Open No. 201527/1984 (hereinafter referred to as document 6) and U.S. Pat. No. 4,621,338 (hereinafter referred to as document 7) which has claimed the priority based on an application based on which also the document 6 has claimed the priority. However, the documents 6 and 7 are directed toward providing an EXOR or EXNOR circuit which requires a smaller number of transistors than an ordinary device and providing a CMOS full adder stage in which such an EXOR or EXNOR circuit is used, and do not disclose a technique relating to high speed operation or expandability.

In addition, the documents mentioned above do not disclose any technique for saving time required for tuning (adjustment) of components. In particular, where a great number of components are involved, there is a subject to be solved in that much time is required for tuning of the components. Besides, if it is tried to form adder circuits of different bit lengths for an increment circuit which are formed from adder circuits of different bit lengths such as a 64-bit adder circuit and a 4-bit adder circuit, much variation is required for circuit arrangement. Therefore, in order to evaluate a circuit ready for new technology, many basic circuits such as leaf cells must be re-evaluated and connected. Thus, there is a subject to be solved in that the efficiency in development is low.

SUMMARY OF THE INVENTION

It is an object of the present invention to provide a logic circuit wherein the number of kinds of basic parts is suppressed to five so that a circuit which operates at a high speed can be designed.

It is another object of the present invention to provide a logic circuit wherein repetitiveness of wiring lines is increased so that a circuit which is simple in circuit scale and has a high degree of expandability can be designed.

It is a further object of the present invention to provide a logic circuit wherein the time required for tuning of components is reduced significantly to reduce the man-hours for layout significantly and reduce the man-hours for development significantly.

It is a still further object of the present invention to provide a logic circuit wherein the same basic parts are used so that augmentation of the yield can be achieved and reduction of the production cost can be promoted.

In order to attain the objects described above, according to an aspect of the present invention, there is provided a logic circuit, comprising a first inversion section for inverting a first input signal having one of positive logic and negative logic and outputting the inverted signal, a second inversion section for inverting a second input signal having the other of the positive logic and the negative logic and outputting the inverted signal, and a transmission section for selectively outputting one of the output of the first inversion section and the output of the second inversion section in accordance with a logical value which depends upon an externally controllable selection signal and an inverted signal of the selection signal.

The logic circuit having the construction described is advantageous in that it operates at a high speed. Further, since it includes double inverters, the isolation between a circuit following the transmission section and another circuit preceding to the first and second inversion sections is strengthened. Furthermore, since the necessity for provision of an inverter circuit in the circuit preceding to the first and second inversion sections is eliminated, there is an advantage that the circuit configuration can be simplified.

The logic circuit may further comprise a first switching section provided on an input side of the first inversion section and capable of performing switching of whether the first input signal should be passed or blocked in accordance with an external control signal, and a second switching section provided on an input side of the second inversion section and capable of performing switching of whether the second input signal should be passed or blocked in accordance with the external control signal.

The logic circuit having the construction just described operates at a high speed. Further, since it includes double inverters, the isolation between a circuit following the transmission section and another circuit preceding to the first and second switching sections is strengthened. Furthermore, since the necessity for provision of an inverter circuit in the circuit preceding to the first and second switching sections is eliminated, there is an advantage that the circuit configuration can be simplified.

According to another aspect of the present invention, there is provided a logic circuit, comprising a first inversion section for inverting a first input signal and outputting the inverted signal, a second inversion section for inverting a second input signal and outputting the inverted signal, a first outputting section for selectively outputting one of the output of the first inversion section and the output of the second inversion section in accordance with a logical value which depends upon an externally controllable first selection signal and an inverted signal of the first selection signal, and a second outputting section for selectively outputting one of the output of the first inversion section and the output of the second inversion section in accordance with a logical value which depends upon an externally controllable second selection signal and an inverted signal of the second selection signal.

Also the logic circuit having the construction described is advantageous in that it can achieve high speed operation, strengthening of the isolation and simplification in circuit configuration.

According to a further aspect of the present invention, there is provided a logic circuit, comprising a first inversion section for inverting a first input signal and outputting the inverted signal, a second inversion section for inverting a second input signal and outputting the inverted signal, and a transmission section capable of discriminating a magnitude relationship of 1 bit between the first input signal and the second input signal and outputting a result of the discrimination using a plurality of status signals.

Also the logic circuit having the construction described is advantageous in that it can achieve high speed operation, strengthening of the isolation and simplification in circuit configuration.

The transmission section may include a first gate section for indicating whether or not the first input signal is equal to or greater than the second input signal, a second gate section for indicating whether or not the first input signal is greater than the second input signal, a third gate section for indicating whether or not the first input signal is equal to or smaller than the second input signal, and a fourth gate section for indicating whether or not the first input signal is smaller than the second input signal.

With the logic circuit, since the double inverters are formed from CMOS logics, there is an advantage that high speed operation and strengthening of the isolation can be achieved. The logic circuit is further advantageous in that it can be simplified in circuit configuration.

According a still further aspect of the present invention, there is provided a logic circuit, comprising a first comparison section for receiving a first input signal of $n_1$ bits and a second input signal of $n_1$ bits, performing magnitude comparison between a predetermined number of bits of the first input signal and the predetermined number of bits of the second input signal and outputting results of the comparison of the predetermined number of bits as a $p_1$th comparison result, a $p_2$th comparison result, a $p_3$th comparison result and a $p_4$th comparison result using a plurality of status signals, $n_1$ being an integer equal to 2 to the $m_1$th power, $m_1$ being an even number equal to or greater than 2, a second comparison section for performing magnitude comparison between a number of bits equal to twice the predetermined number of bits of the first input signal and a number of bits equal to twice the predetermined number of bits of the second input signal from the $p_1$th comparison result and the $p_2$th comparison result and outputting a result of the comparison of the predetermined number of bits as a $p_5$th comparison result using the plurality of status signals and for performing magnitude comparison between a number of bits equal to twice the predetermined number of bits of the first input signal and a number of bits equal to twice the predetermined number of bits of the second input signal from the $p_3$th comparison result and the $p_4$th comparison result and outputting a result of the comparison of the predetermined number of bits as a $p_6$th comparison result using the plurality of status signals, and a third comparison section for performing magnitude comparison between the $n_1$ bits of the first input signal and the $n_1$ bits of the second input signal from the $p_5$th comparison result and the $p_6$th comparison result and outputting a result of the comparison of the $n_1$ bits using the plurality of status signals.

The logic circuit having the construction described is simplified in circuit configuration and can make much use of repetitiveness of wiring lines. Further, a circuit configuration having a high degree of expandability can be produced and magnitude comparison circuits having different bit widths can be designed simply and efficiently. Consequently, the layout man-hours upon development can be reduced significantly and the development man-hours can be reduced significantly, and besides it is possible to design a circuit having a high degree of expandability. Further, since the number of parts can be suppressed, the time required for tuning of parts is reduced significantly when compared with a circuit which includes many parts. Further, since the same leaf cells can be used, the logic circuit is advantageous in that it contributes to augmentation of the yield and so forth upon production. Furthermore, since each of the leaf cells normally produces two kinds of signals of a regular phase signal and an inverted phase signal in the inside thereof, there is an advantage that the entire circuit operates at a high speed.

According to a yet further aspect of the present invention, there is provided a logic circuit, comprising a half addition arithmetic section for receiving a first input signal of $n_2$ bits and an inverted signal of a second input signal of $n_2$ bits and performing half addition arithmetic of the first input signal and the inverted signal of the second input signal, $n_2$ being an integer equal to 2 to the $m_2$th power, $m_2$ being an even number equal to or greater than 2, a first arithmetic section for performing full addition arithmetic of the first input signal and the inverted signal of the second input signal separately for each predetermined number of bits and outputting a result of the full addition arithmetic as a $q_1$th carry, a $q_2$th carry, a $q_3$th carry and a $q_4$th carry using a plurality of status signals, a second arithmetic section for outputting logical AND information of the $q_1$th carry and the $q_2$th carry as a $q_5$th carry using the plurality of status signals and outputting logical AND information of the $q_3$th carry and the $q_4$th carry as a $q_6$th carry using the plurality of status signals, a third arithmetic section for outputting logical AND information of the carries of all of the $n_2$ bits as a $q_7$th carry using the plurality of status signals from at least the $q_5$th carry and the $q_6$th carry and, and a fourth arithmetic section for performing logical exclusive ORing of the output of the half addition arithmetic section and the $q_7$th carry and outputting a full addition arithmetic result.

With the logic circuit having the construction described, adder circuits and magnitude comparison circuits of different bit widths can be obtained simply and efficiently and besides circuits which operate at a high speed can be designed. Further, since the same leaf cells are used, the yield and so forth upon production are improved. Furthermore, since the number of kinds of leaf cells can be suppressed, the development man-hours for leaf cells is reduced significantly, and besides, since the circuit scale is reduced as a whole, a layout can be designed with increased repetitiveness of wiring lines, and consequently, the man-hours can be reduced remarkably.

According to a yet further aspect of the present invention, there is provided a logic circuit, comprising a first inversion section for inverting a first input signal and outputting the inverted signal, a second inversion section for inverting the inverted signal of the first input signal and outputting a resulting signal, a first outputting section for performing NANDing arithmetic between the output of the first inversion section and a second input signal and outputting a resulting signal, and a second outputting section for performing NANDing arithmetic between the output of the second inversion section and an inverted signal of the second input signal and outputting a resulting signal, the first outputting section and the second outputting section being switched with the second input signal and the inverted signal of the second input signal.

The logic circuit having the construction described is advantageous in that, if input signals are applied appropriately to the first and second inversion sections, then the logic circuit can output a logical AND value and an inverted value of the AND value of the two high order bits based on positive logic and negative logic values of the 2 high order bits inputted thereto. Further, since the double inverters of the logic circuit are formed from CMOS logics, the logic circuit operates at a high speed, and besides, the isolation between a circuit on the output side and another circuit preceding to the logic circuit is strengthened. Furthermore, since the necessity for provision of an inverter circuit in the circuit preceding to the logic circuit is eliminated, there is an advantage that the burden on the circuit in the preceding stage can be reduced and the circuit configuration can be simplified.

According to a yet further aspect of the present invention, there is provided a logic circuit, comprising a first carry generation section for receiving a first input signal A<0: $n_3$> of $n_3$ bits and an inverted signal XA<0: $n_3$> of the first input signal of $n_3$ bits and outputting a first logical AND result and a first logical AND inversion result as a logical AND result at least of bits A<0> to A<2 to the $m_3$th power−1> from the first input signal bits A<0: 2 to the $m_3$th power−1> and the inverted signal bits XA<0: 2 to the $m_3$th power−1>, $n_3$ being an integer equal to 2 to the $m_3$th power, $m_3$ being an even number equal to or greater than 2, a second carry generation section for outputting a second logical AND result and a second logical AND inversion result as a logical AND result at least of bits A<2 to the $m_3$th power> to A<2×2 to the $m_3$th power−1> from the first input signal bits A<2 to the $m_3$th power: 2×2 to the $m_3$th power−1> and the inverted signal bits XA<2 to the $m_3$th power: 2×2 to the $m_3$th power−1>, a third carry generation section for outputting a third logical AND result and a third logical AND inversion result as a logical AND result at least of bits A<2×2 to the $m_3$th power> to A<3×2 to the $m_3$th power−1> from the first input signal bits A<2×2 to the $m_3$th power: 3×2 to the $m_3$th power−1> and the inverted signal bits XA<2×2 to the $m_3$th power: 3×2 to the $m_3$th power−1>, a fourth carry generation section for outputting a fourth logical AND result and a fourth logical AND inversion result as a logical AND result at least of bits A<3×2 to the $m_3$th power> to A<4×2 to the $m_3$th power−1> from the first input signal bits A<3×2 to the $m_3$th power: 4×2 to the $m_3$th power−1> and the inverted signal bits XA<3×2 to the $m_3$th power: 4×2 to the $m_3$th power−1>, a first logical AND generation section for receiving the first logical AND result and the first logical AND inversion result as well as the second logical AND result and the second logical AND inversion result and outputting a fifth logical AND result and a fifth logical AND inversion result as a logical AND result at least of the bits A<0> to A<2×2 to the $m_3$th power−1>, a second logical AND generation section for receiving the third logical AND result and the third logical AND inversion result as well as the fourth logical AND result and the fourth logical AND inversion result and outputting a sixth logical AND result and a sixth logical AND inversion result as a logical AND result at least of the bits A<2×2 to the $m_3$th power> to A<4×2 to the $m_3$th power−1>, a third logical AND generation section for outputting a seventh logical AND result and a seventh logical AND inversion section as a logical AND result at least of the bits A<0> to A<2×2 to the $m_3$th power−1> from the fifth logical AND result and the fifth logical AND inversion result as well as the sixth logical AND result and the sixth logical AND inversion result, a fourth logical AND generation section for outputting an eighth logical AND result and an eighth logical AND inversion result as a logical AND result at least of the bits A<2 to the $m_3$th power> to A<3×2 to the $m_3$th power−1> from the second logical AND result and the second logical AND inversion result as well as the sixth logical AND result and the sixth logical AND inversion result, and a full addition arithmetic section for outputting a full addition arithmetic result of $n_3$ bits from a first gate signal of $n_3$ bits which includes the seventh logical AND result, the eighth logical AND result, the sixth logical AND result and the fourth logical AND result and a second gate signal of $n_3$ bits which includes the seventh logical AND inversion result, the eighth logical AND inversion result, the sixth logical AND inversion result and the fourth logical AND result.

The logic circuit having the construction described is simple in circuit configuration, and a designer can design a circuit which is simple and efficient. Consequently, the layout man-hours upon development can be reduced significantly and the development man-hours can be reduced significantly. Further, since the number of parts can be suppressed, the time required for tuning of parts is reduced significantly when compared with a circuit which includes many parts. Further, since the same leaf cells can be used, the logic circuit is advantageous in that it contributes to augmentation of the yield and so forth upon production. Furthermore, since two kinds of signals of a regular phase signal and an inverted phase signal are normally produced and used in the inside of each of the leaf cells, there is an advantage that the entire circuit operates at a high speed.

The plurality of status signals may include a first gate signal for indicating whether or not the first input signal is equal to or greater than the second input signal, a second gate signal for indicating whether or not the first input signal is greater than the second input signal, a third gate signal for indicating whether or not the first input signal is equal to or smaller than the second input signal, and a fourth gate signal for indicating whether or not the first input signal is smaller than the second input signal.

The logic circuit having the construction described is advantageous in that it operates at a high speed and besides the individual cells can be linked to each other readily. Further, by utilizing same status signals for different output signals, the linking property between the cells is raised, and this increases the expandability of the circuit. Further, the hierarchy can be made deeper.

The above and other objects, features and advantages of the present invention will become apparent from the following description and the appended claims, taken in conjunction with the accompanying drawings in which like parts or elements denoted by like reference symbols.

BRIEF DESCRIPTION OF THE DRAWINGS

FIG. 4 is a diagrammatic view illustrating logic values of a cell LGEN;

FIG. 12 is a diagrammatic view illustrating logic values of another cell LGEN;

FIG. 18(a) is a diagrammatic view illustrating logic values at input side terminals S, XS, A1 and an output side terminal X1 of a cell A001;

FIG. 18(b) is a diagrammatic view illustrating logic values at input side terminals S, XS, A2 and an output side terminal X2 of the cell A001;

FIG. 19 is a diagrammatic view illustrating logic values of the fourth leaf cell according to the embodiment of the present invention;

FIG. 21 is a diagrammatic view illustrating logic values of a cell A002 according to the embodiment of the present invention;

DESCRIPTION OF THE PREFERRED
EMBODIMENT

A. First Embodiment of the Invention

Figure 1:
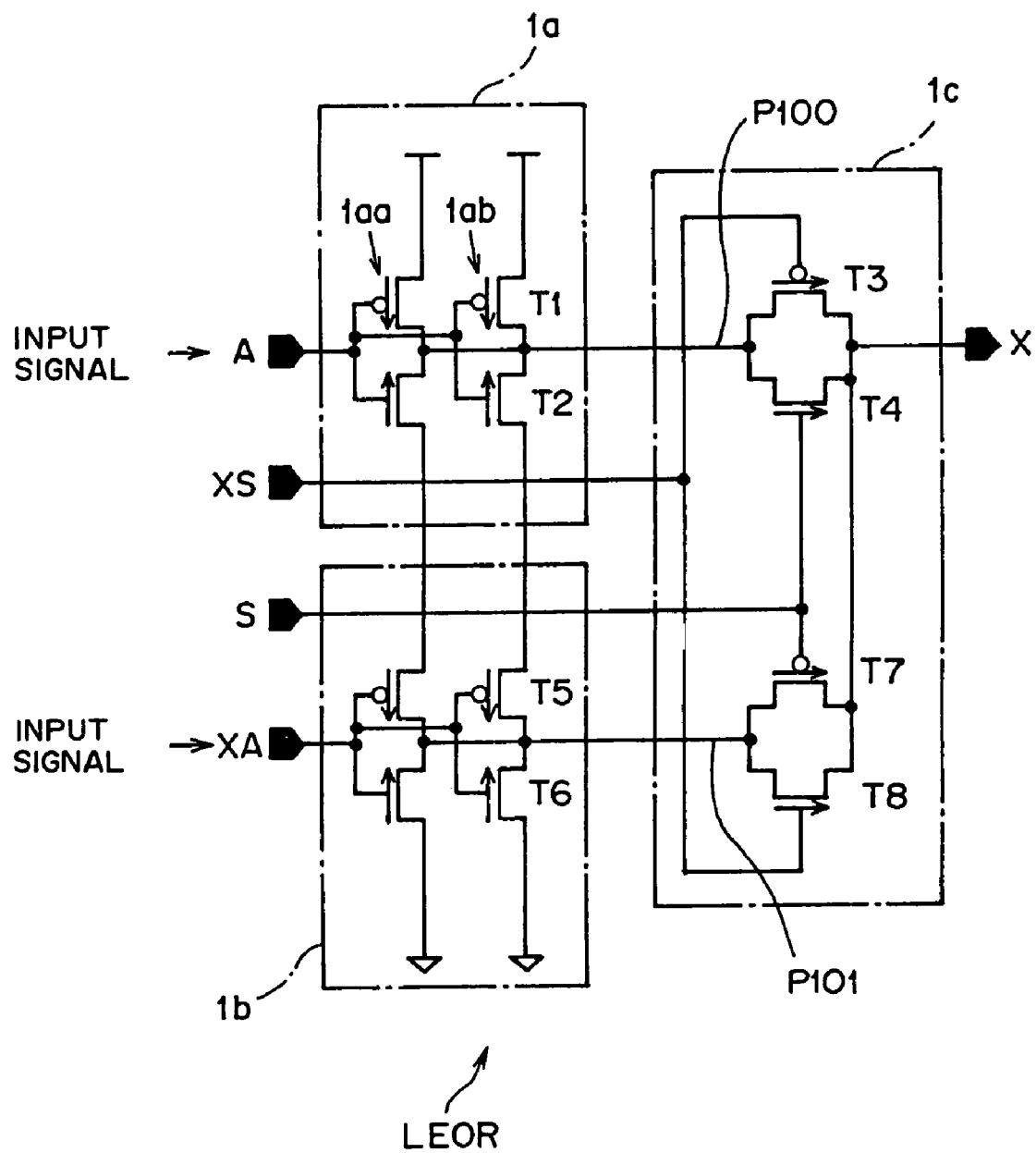
FIG. 1 is a block diagram showing a construction of a first leaf cell according to an embodiment of the present invention.

FIG. 1 is a block diagram showing a construction of a first leaf cell according to an embodiment of the present invention. Referring to FIG. 1, the cell LEOR shown is a CMOS logic circuit composed of a first inversion section 1a, a second inversion section 1b, and a transmission section 1c, and has terminals A, XS, S, XA and X.

The first inversion section 1a inverts a first input signal having one of positive logic and negative logic and outputs the inverted signal. The first inversion section 1a includes two CMOS logics 1aa and 1ab connected in parallel. A signal inputted from the terminal A is inputted to the transistor gates of the two CMOS logics 1aa and 1ab. When the input signal from the terminal A is 1, a gate T1 has an off state and a gate T2 has an on state, and a signal line P100 has a ground potential. On the other hand, when the input signal from the terminal A is 0, the gate T1 is on and the gate T2 is off, and the signal line P100 has a high bias. The signal line P100 thus outputs the input signal with the inverted logic value, and the two CMOS logics 1aa and 1ab function as a double inverter circuit. It is to be noted that the mark ○ at the gate T1 represents an inversion operation. It is to be noted that the gates T1 and T2 or like transistors in pair may be hereinafter referred to as pair transistors.

The second inversion section 1b inverts a second input signal having the other of the positive logic and the negative logic and outputs the inverted signal. The second inversion section 1b includes two CMOS logics connected in parallel and functions as a double inverter circuit. The transmission section 1c selectively outputs one of an output of the first inversion section 1a and an output of the second inversion section 1b in accordance with a logical value provided by an externally controllable selection signal and an inverted signal of the selection signal and is formed from pair transistors T3, T4 and T7, T8.

In the cell LEOR, an input signal is inputted from the terminal A of the first inversion section 1a to the two CMOS logics and inverted by and outputted from the CMOS logics. Meanwhile, the inverted signal of the input signal is inputted from the terminal XA of the second inversion section 1b to the two CMOS logics and is inverted by and outputted from the CMOS logics. Then, when the selection signal from the terminal S is 1 and the inverted signal of the selection signal from the terminal XS is 0, the pair transistors T3, T4 in the transmission section 1c exhibit an on-state while the pair transistors T7, T8 exhibit an off state, and an input inversion signal on the signal line P100 in the transmission section 1c is outputted from the output terminal X. On the contrary when the selection signal from the terminal S is 0 and the inverted signal of the selection signal from the terminal XS is 1, the pair transistors T3, T4 exhibit an off-state and the pair transistors T7, T8 exhibit an on-state, and an input inversion signal on another signal line P101 in the transmission section 1c is outputted from the output terminal X. Accordingly, the cell LEOR functions as a selector circuit which selectively outputs one of two input signals in accordance with a control signal. Further, the transmission section 1c functions as a driver which outputs the logical value of 0 or 1.

The cell LEOR is advantageous in that it operates at a high speed because the double inverters thereof are formed from CMOS logics in this manner. Further, since the cell LEOR includes double inverters, the isolation (reverse current prevention) between a circuit following the transmission section 1c and another circuit preceding to the cell LEOR is strengthened. Furthermore, the cell LEOR eliminates the necessity for provision of an inverter circuit in the circuit preceding to the cell LEOR, and consequently, it is advantageous in that the circuit configuration can be simplified.

Figure 2:
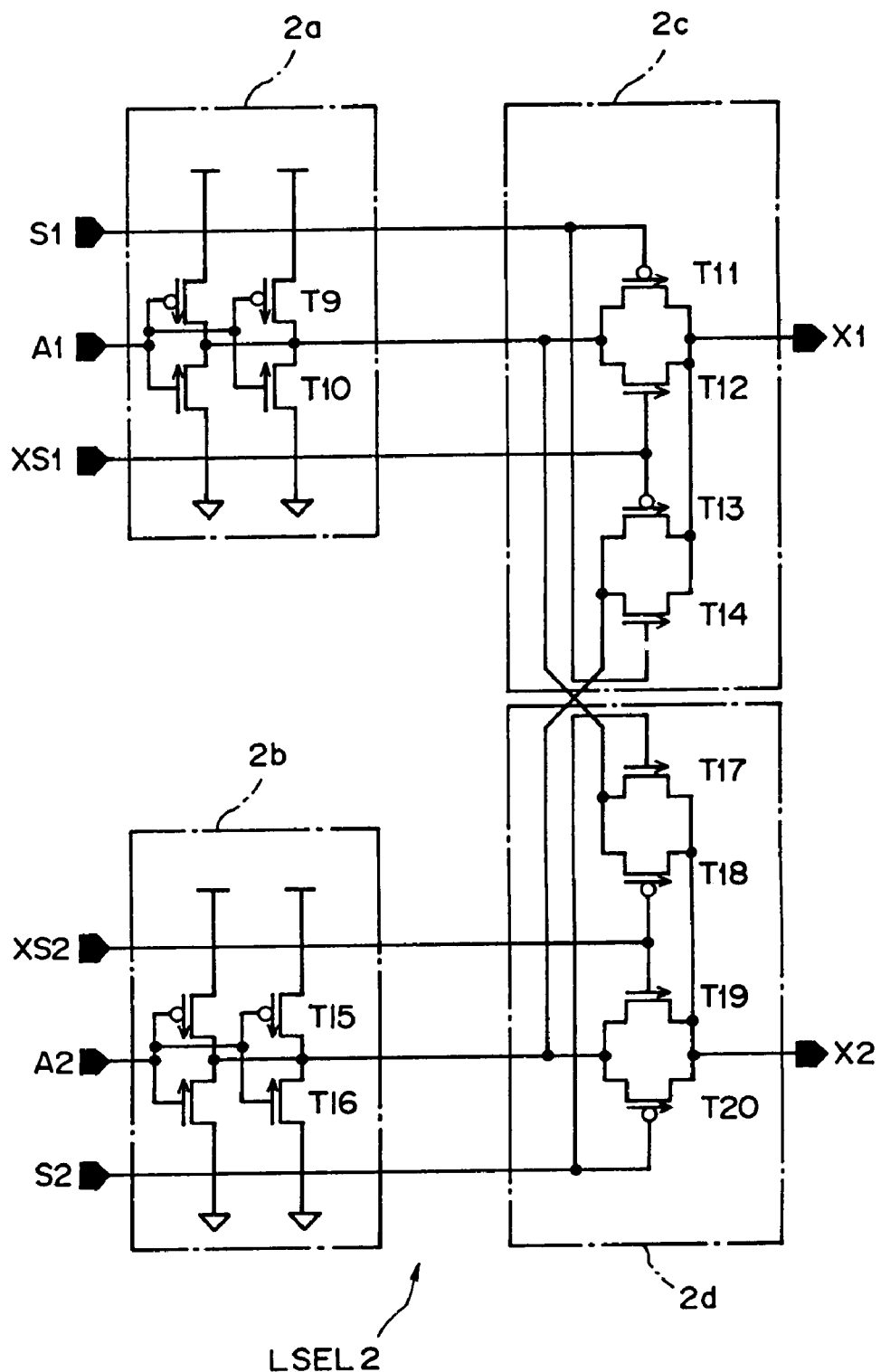
FIG. 2 is a block diagram showing a construction of a second leaf cell according to the embodiment of the present invention.

FIG. 2 is a block diagram showing a construction of a second leaf cell according to the embodiment of the present invention. Referring to FIG. 2, the cell LSEL2 shown is a CMOS logic circuit composed of a first inversion section 2a, a second inversion section 2b, a first outputting section 2c and a second outputting section 2d and has terminals S1, A1, XS1, S2, A2, XS2, X1 and X2. The reference symbols S1, A1, XS1, S2, A2, XS2, X1 and X2 may sometimes denote signals at the respective terminals.

The first inversion section 2a outputs a signal XA1 inverted from a first input signal A1 and is composed of two CMOS logics connected in parallel. The second inversion section 2b outputs a signal XA2 inverted from a second input signal A2 and is composed of two CMOS logics connected in parallel. Each of the first inversion section 2a and the second inversion section 2b functions as a double inverter circuit. The first outputting section 2c selectively outputs one of an output XA1 of the first inversion section 2a and an output XA2 of the second inversion section 2b in accordance with a logic value which depends upon an externally controllable first selection signal S1 and an inverted signal XS1 of the first selection signal S1. The second outputting section 2d selectively outputs one of the output XA1 of the first inversion section 2a and the output XA2 of the second inversion section 2b in accordance with an externally controllable second selection signal S2 and an inverted signal XS2 of the second selection signal S2.

When the first selection signal S1 is 0 and the inverted signal XS1 of the first selection signal S1 is 1, gates T11 and T12 are on and gates T13 and T14 are off, and the inverted signal XA1 of the first input signal A1 is outputted to the output terminal X1 of the first outputting section 2c. On the contrary, when the first selection signal S1 is 1 and the inverted signal XS1 of the first selection signal S1 is 0, the gates T11 and T12 are off and the gates T13 and T14 are on, and the inverted signal XA2 of the input signal A2 is outputted to the output terminal X1 of the first outputting section 2c.

Similarly, when the second selection signal S2 is 0 and the inverted signal XS2 of the second selection signal S2 is 1, gates T17 and T18 are off and gates T19 and T20 are on, and the inverted signal XA2 of the input signal A2 is outputted to the output terminal X2 of the second outputting section 2d. On the contrary, when the second selection signal S2 is 1 and the inverted signal XS2 of the second selection signal S2 is 0, the gates T17 and T18 are on and the gates T19 and T20 are off, and the inverted signal XA1 of the input signal A1 is outputted to the output terminal X2 of the second outputting section 2d. Accordingly, the cell LSEL2 functions as a selector which selectively outputs one of the inverted signals XA1 and XA2 of the two input signals A1 and A2 in accordance with the first selection signal S1 and the second selection signal S2.

In this manner, the first outputting section 2c and the second outputting section 2d of the cell LSEL2 commonly use the double inverter circuits for obtaining inverted signals, and consequently, the cell LSEL2 can be produced in a reduced circuit scale. Further, since the circuits in the stage preceding to the first outputting section 2c and the second outputting section 2d do not have a complicated circuit configuration and may be formed with low loads, the cell LSEL2 can be formed in a simple circuit configuration.

Figure 3:
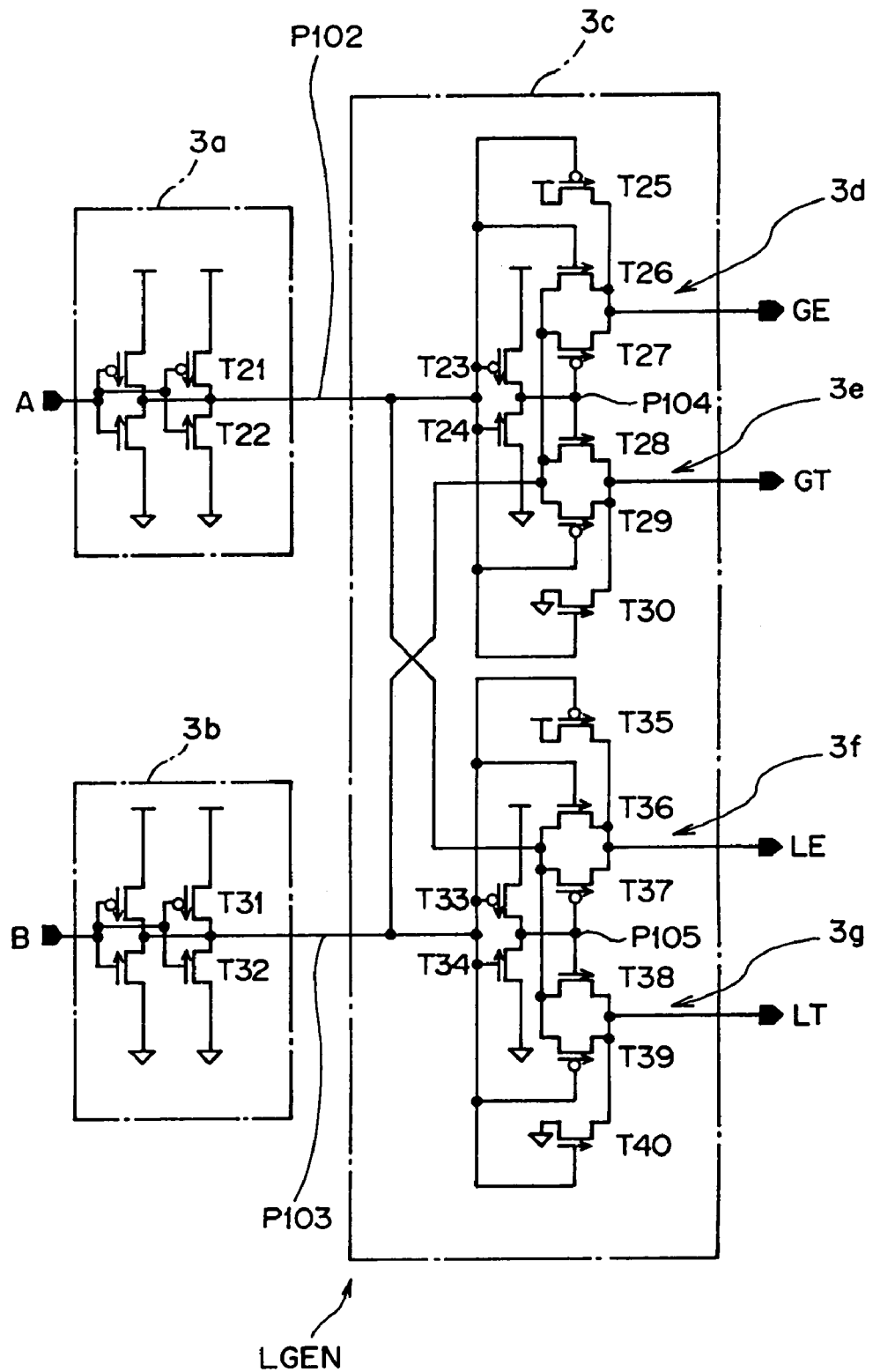
FIG. 3 is a block diagram showing a construction of a third leaf cell according to the embodiment of the present invention.

FIG. 3 is a block diagram showing a construction of a third leaf cell according to the embodiment of the present invention. Referring to FIG. 3, the cell LGEN shown is a CMOS logic circuit composed of a first inversion section 3a, a second inversion section 3b and a transmission section 3c, and has input terminals A1 and A2 and output terminals GE, GT, LE and LT. Also the reference symbols A1, A2, GE, GT, LE and LT are sometimes used to denote signals at the respective terminals.

The first inversion section 3a inverts a first input signal A (signal from the terminal A) and outputs the inverted signal. The second inversion section 3b inverts a second input signal B (signal from the terminal B) and outputs the inverted signal. Each of the first inversion section 3a and the second inversion section 3b functions as a double inverter circuit. The transmission section 3c can discriminate a relationship in magnitude of one bit between the first input signal A and the second input signal B and output a result of the discrimination using four kinds of status signals. The transmission section 3c is composed of a first gate section 3d, a second gate section 3e, a third gate section 3f and a fourth gate section 3g. The four kinds of status signals are four different status signals of GE (Greater or Equal), GT (Greater Than), LE (Less or Equal) and LT (Less Than). For example, when comparison discrimination in magnitude between a bit $J_1$ and another bit $J_2$ is to be performed, if $J_1=1$ and $J_2=0$ are given, then since $J_1 \geq J_2$, only the GE signal exhibits 1 while the other signals GT, LE and LT exhibit 0. Then, the GE signal is outputted from the first gate section 3d; the GT signal is outputted from the second gate section 3e; the LE signal is outputted from the third gate section 3f; and the LT signal is outputted from the fourth gate section 3g.

In particular, the first gate section 3d indicates whether or not the input signal A is equal to or higher than the input signal B (A≧B), and outputs 1, for example, when the input signal A is 1 and the input signal B is 0, when the input signal A is 1 and the input signal B is 1, or when the input signal A is 0 and the input signal B is 0. The second gate section 3e indicates whether or not the input signal A is higher than the input signal B (A>B), and outputs 1, for example, when the input signal A is 1 and the input signal B is 0. The third gate section 3f indicates whether or not the input signal A is equal to or lower than the input signal B (A≦B) and outputs 1, for example, when the input signal A is 0 and the input signal B is 1, when the input signal A is 1 and the input signal B is 1 or when the input signal A is 0 and the input signal B is 0. The fourth gate section 3g indicates whether or not the input signal A is lower than the input signal B (A<B) and outputs 1, for example, when the input signal A is 0 and the input signal B is 1.

FIG. 4 is a diagrammatic view illustrating logical values of the cell LGEN described above. A relationship between magnitude comparison results between the signals A and B and logical arithmetic is described below with reference to the logical value table shown in FIG. 4. The symbol A appearing in FIG. 4 represents a logical value of the first input signal and XA represents an inverted logical value of the first input signal, and B represents a logical value of the second input signal and XB represents an inverted logical value of the second input signal. The symbols OR(GE), AND(GT), NAND(LE) and NOR(LT) represent output logic values of the first gate section 3d, second gate section 3e, third gate section 3f and fourth gate section 3g, respectively. In the column denoted by OR(GE) in FIG. 4, the value 1 appears when A is equal to or greater than B, and this coincides with a result of ORing arithmetic between A and XB. In the column denoted by AND(GT) in FIG. 4, the value 1 appears when A is greater than B, and this coincides with a result of ANDing operation between A and XB. In the column denoted by NAND(LE) in FIG. 4, the value 1 appears when A is equal to or smaller than B, and this coincides with a result of NANDing arithmetic between A and XB. In the column denoted by NOR(LT) in FIG. 4, the value 1 appears when A is smaller then B, and this coincides with a result of NORing arithmetic between A and XB. Thus, a result of magnitude comparison of one bit is represented by a result of logical arithmetic between A and XB. In other words, the cell LGEN functions as a magnitude comparison circuit which performs magnitude comparison between the input signal A and the input signal B by comparison between the input signal A and the inverted signal XB of the input signal B.

Where the four kinds of status signals are used in this manner, there are advantages that the circuit operates at a high speed and that connection between cells is facilitated. In particular, as the output signal uses the same status signals, the connection facility between cells is increased, and this increases the expandability of the circuit. Consequently, the depth of the hierarchy of the circuit can be increased.

Referring back to FIG. 3, when the input signal A is 1 and the input signal B is 0, the gates operate in the following manner. Since a signal line P102 shown in FIG. 3 exhibits 0, the gates directly connected to the signal line P102 exhibit the following logical values. In particular, a gate T23 is on; another gate T24 is off; a further gate T25 is on; a still further gate T26 is off; a yet further gate T29 is on; and a yet further gate T30 is off. Meanwhile, since the gate T23 is off and another signal line P104 has a high bias state, another gate T27 exhibits an off-state and a further gate T28 exhibits an on-state. Accordingly, a high bias is applied to the first gate section 3d through the gate T25, and "1" is outputted from the first gate section 3d. Further, since the gates T28 and T29 both exhibit an on-state, "1" on a further signal line P103 is outputted to the second gate section 3e.

Further, since the signal line P103 shown in FIG. 3 exhibits 1, the gates directly connected to the signal line P103 exhibit the following logical values. In particular, a gate T33 is off; another gate T34 is on; a further gate T35 is off; a still further gate T36 is on; a yet further gate T39 is off; and a yet further gate T40 is on. Further, since the gate T33 is off and the gate T34 is on, another gate T37 is grounded and turned on, and consequently, a further gate T38 is turned off. Accordingly, since the gates T36 and T37 are on, "0" on the signal line P102 is outputted to the third gate section 3f. Further, since the gate T40 is grounded, "0" is outputted to the fourth gate section 3g.

For any other combination of the bits A and B, the gates logically operate similarly as described above except that different logical values are inputted to the gates, and accordingly, detailed description of the operations of the gates is omitted here.

In this manner, in the cell LGEN, logical values on the signal lines P102 and P103 are inputted to the transmission section 3c and the logical values and inverted logical values of them are used in pairs in the transmission section 3c. Therefore, the cell LGEN is advantageous in that inversion processing for inverting positive phase signals again is not required and the processing speed is augmented. Further, since the outputs of the first inversion section and the second inversion section are used commonly by the upper and lower side blocks, there is an advantage that the circuit scale can be reduced. Furthermore, thanks to the presence of the gate sections T21, T22, T31 and T32 of FIG. 3, the isolation between the input side and the output side is improved very much, and possible leakage of a signal of the output side to the input side is eliminated.

Now, a magnitude comparison circuit is described as an arithmetic circuit which uses the three kinds of leaf cells described above.

Figure 5:
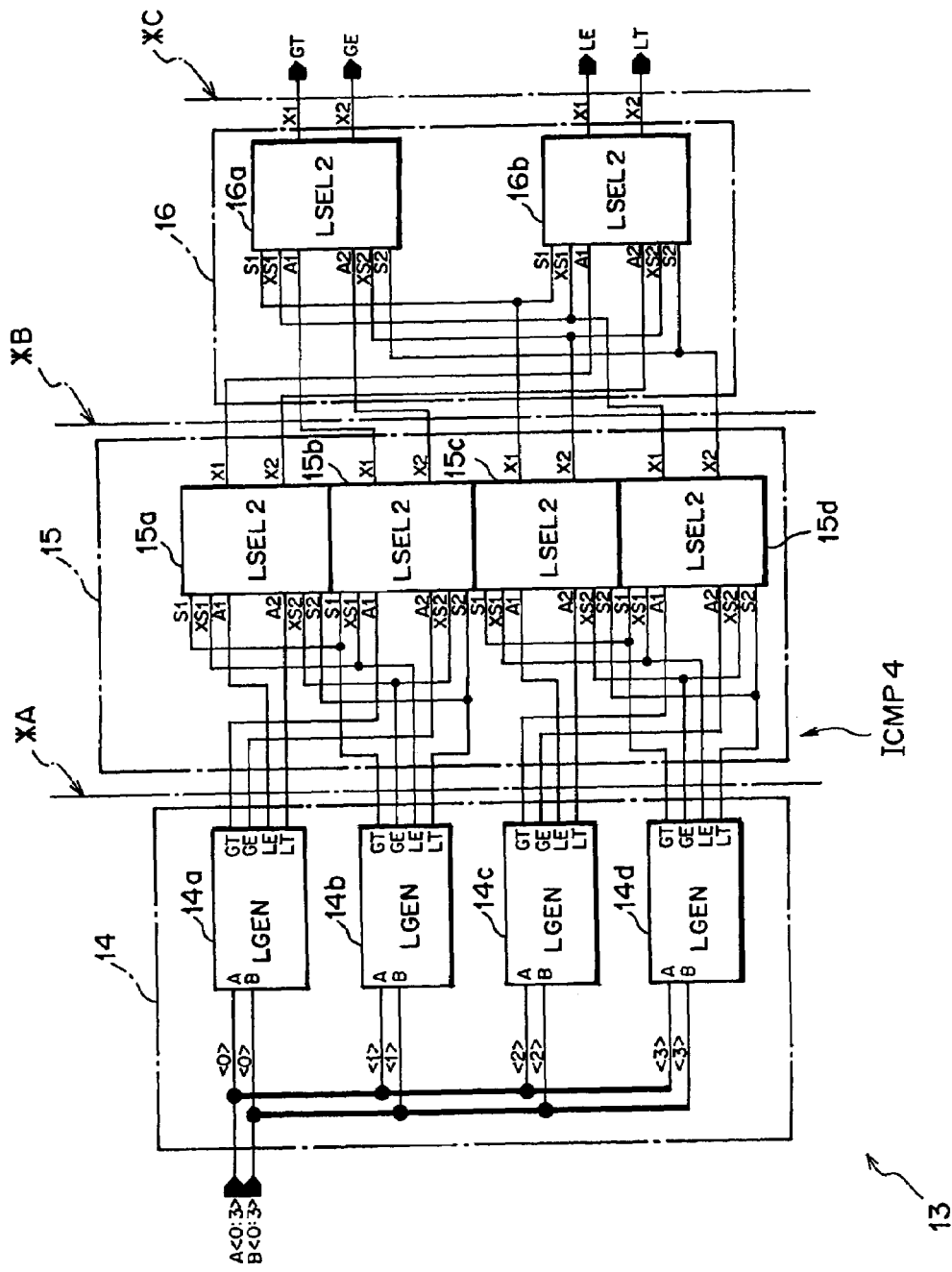
FIG. 5 is a block diagram showing a construction of a 4-bit magnitude comparison circuit according to the embodiment of the present invention.

FIG. 5 is a block diagram showing a construction of a 4-bit magnitude comparison circuit according to the embodiment of the present invention. Referring to FIG. 5, the 4-bit magnitude comparison circuit (ICMP4) 13 is a CMOS logic circuit which compares 4-bit signals in magnitude and outputs four kinds of status signals GE, GT, LE and LT. The 4-bit magnitude comparison circuit 13 includes a first carry generation section 14, a second carry generation section 15, and a third carry generation section 16. It is to be noted here that, in FIG. 5, reference symbols A<0: 3> and B<0: 3> denote 4-bit signals different from each other, and GT, GE, LE and LT denote output signals different from one another. Also reference symbols <0>, <1>, <2> and <3> denote different signals.

The first carry generation section 14 receives a 4-bit input signal A<0: 3> and another 4-bit input signal B<0: 3>, performs comparison between the 4-bit input signal A<0: 3> and the 4-bit input signal B<0: 3> in magnitude for each bit and outputs results of the comparison of the individual bits as a first comparison result, a second comparison result, a third comparison result and a fourth comparison result using the four kinds of status signals. The first carry generation section 14 includes four magnitude discrimination circuits 14a, 14b, 14c and 14d, each of which is formed from a cell LGEN described hereinabove. Two kinds of signals A and B (denoted by <0><0>, <1><1>, <2><2>, <3><3> in FIG. 5) are inputted to the input terminals A, B of the magnitude discrimination circuits 14a, 14b, 14c, 14d, respectively.

The second carry generation section 15 performs comparison in magnitude between the two high order bits A<0: 1> of the first input signal and the two high order bits B<0: 1> of the second input signal from the first comparison result and the second comparison result and output results of the comparison of the 2 bits as a fifth comparison result using the four kinds of status signals. Further, the second carry generation section 15 performs comparison in magnitude between the two low order bits A<2: 3> of the first input signal and the two low order bits B<2: 3> of the second input signal from the third comparison result and the fourth comparison result and output results of the comparison of the 2 bits as a sixth comparison result using the four kinds of status signals. The second carry generation section 15 includes four selector circuits 15a, 15b, 15c and 15d, each of which is formed from a cell LSEL2 described hereinabove. It is to be noted that the two high order bit comparison function is exhibited by the two selector circuits 15a and 15b while the two low order bit comparison function is exhibited by the two selector circuits 15c and 15d.

The third carry generation section 16 performs comparison in magnitude between the four bits A<0: 3> of the first input signal and the two four bits B<0: 3> of the second input signal from the fifth comparison result and the sixth comparison result and outputs a result of the comparison of the 4 bits using the four kinds of status signals. The third carry generation section 16 includes two selector circuits 16a and 16b, each of which is formed from a cell LSEL2 described hereinabove.

In the 4-bit magnitude comparison circuit 13 described above, an input signal A<0: 3> and another input signal B<0: 3> are inputted to the first carry generation section 14. In the first carry generation section 14, the magnitude discrimination circuits 14a performs comparison discrimination in magnitude between the bit A<0> and the bit B<0> and outputs a first comparison result using the four kinds of status signals GE, GT, LE and LT (refer to an alternate long and short dash line *A in FIG. 5). Similarly, the magnitude discrimination circuit 14b performs comparison discrimination in magnitude between the bit A<1> and the bit B<1> and outputs a second comparison result using the four kinds of status signals GE, GT, LE and LT. Also, the magnitude discrimination circuit 14c performs comparison discrimination in magnitude between the bit A<2> and the bit B<2> and outputs a third comparison result using the four kinds of status signals GE, GT, LE and LT, and the magnitude discrimination circuit 14d performs comparison discrimination in magnitude between the bit A<3> and the bit B<3> and outputs a fourth comparison result using the four kinds of status signals GE, GT, LE and LT.

Subsequently, connection destinations of the output signals of the first carry generation section 14 are described. For the convenience of description below, signal terminals of the cells LSEL2 in the second carry generation section 15 are defined in the following manner. In particular, A1, A2, S, XS1, S2 and XS2 are referred to as first input terminal, second input terminal, first selection signal terminal, first selection signal inversion terminal, second selection signal terminal and second selection signal inversion terminal, respectively.

A GT signal from the cell LGEN 14a in the first carry generation section 14 is inputted to the fist input terminal A1 of the selector circuit 15b; a GE signal is inputted to the second input signal A2 of the selector circuit 15b; an LE signal is inputted to the first input terminal A1 of the selector circuit 15a; and an LT signal is inputted to the second input signal A2 of the selector circuit 15a. Meanwhile, connection destinations of the second comparison result from the cell LGEN 14b in the first carry generation section 14 are such as follows. In particular, the GT signal is inputted to the first selection signal terminal S1 of the selector circuit 15a and the first selection signal terminal S1 of the selector circuit 15b; the GE signal is inputted to the second selection signal inversion terminal XS2 of the selector circuit 15a and the second selection signal inversion terminal XS2 of the selector circuit 15b; the LE signal is inputted to the first selection signal inversion terminal XS1 of the selector circuits 15a and the first selection signal inversion terminal XS1 of the selector circuit 15b; and the LT signal is inputted to the second selection signal terminal S2 of the selector circuit 15a and the second selection signal terminal S2 of the selector circuit 15b.

The selector circuits 15a and 15b cooperate to perform magnitude comparison discrimination between the two high order bits A<0: 1> of the first input signal and the two high order bits B<0: 1> of the second input signal. Results of the comparison of the 2 bits are outputted as a fifth comparison result from the output terminals X1 and X2 of the selector circuit 15a and the output terminals X1 and X2 of the selector circuit 15b using the four kinds of status signals (refer to an alternate long and short dash line *B in FIG. 5).

Similar comparison is performed for the two low order bits A<2; 3>. In particular, as seen from FIG. 5, the four kinds of status signals of the third comparison result and the fourth comparison result are inputted from predetermined terminals to the input terminals of the selector circuits 15c and 15*d* in the second carry generation section 15. Then, the two selector circuits 15*c* and 15*d* perform magnitude comparison discrimination between the two low order bits A<2: 3> of the first input signal and the two low order bits B<2: 3> of the second input signal and outputs a result of the comparison of the 2 bits as a sixth comparison result from the output terminals X1 and X2 of the selector circuit 15*c* and the output terminals X1 and X2 of the selector circuit 15*d* using the four kinds of status signals.

Further, the four kinds of status signals of the fifth comparison result are inputted to predetermined terminals of the selector circuits 16*a* and 16*b* in the third carry generation section 16. In particular, the output terminal X1 of the selector circuit 15*a* is inputted to the first input terminal A1 of the selector circuit 16*b*; the output terminal X2 of the selector circuit 15*a* is inputted to the second input signal A2 of the selector circuit 16*b*; the output terminal X1 of the selector circuit 15*b* is inputted to the first input terminal A1 of the selector circuit 16*a*; and the output terminal X2 of the selector circuit 15*b* is inputted to the second input signal A2 of the selector circuit 16*a*. Also the four kinds of status signals of the sixth comparison result are inputted similarly. In particular, the output terminal X1 of the selector circuit 15*c* is inputted to the first selection signals S1 of the selector circuits 16*a* and 16*b*; the output terminal X2 of the selector circuit 15*c* is inputted to the second selection signal inversion terminals XA2 of the selector circuits 16*a* and 16*b*; the output terminal X1 of the selector circuit 15*d* is inputted to the first selection signal inversion terminals XS1 of the selector circuits 16*a* and 16*b*; and the output terminal X2 of the selector circuit 15*d* is inputted to the second selection signal terminals S2 of the selector circuits 16*a* and 16*b*.

Then, the third carry generation section 16 performs magnitude comparison discrimination between the input signal A<0: 3> and the input signal B<0: 3> from the fifth comparison result and the sixth comparison result, and outputs a comparison result of the 4 bits using the four kinds of status signals (GE, GT, LE, LT) (refer to an alternate long and short dash line *C in FIG. 5).

Since the 4-bit magnitude comparison circuit 13 is formed from the cells LGEN and LSEL2 and two kinds of signals of a positive phase signal and an inverted phase signal are normally produced and used in the cells in this manner, it has an advantage that high speed circuit operation can be achieved. Further, since such cells LGEN and LSEL2 as described above are used, the 4-bit magnitude comparison circuit 13 has a simple circuit configuration.

Figure 6:
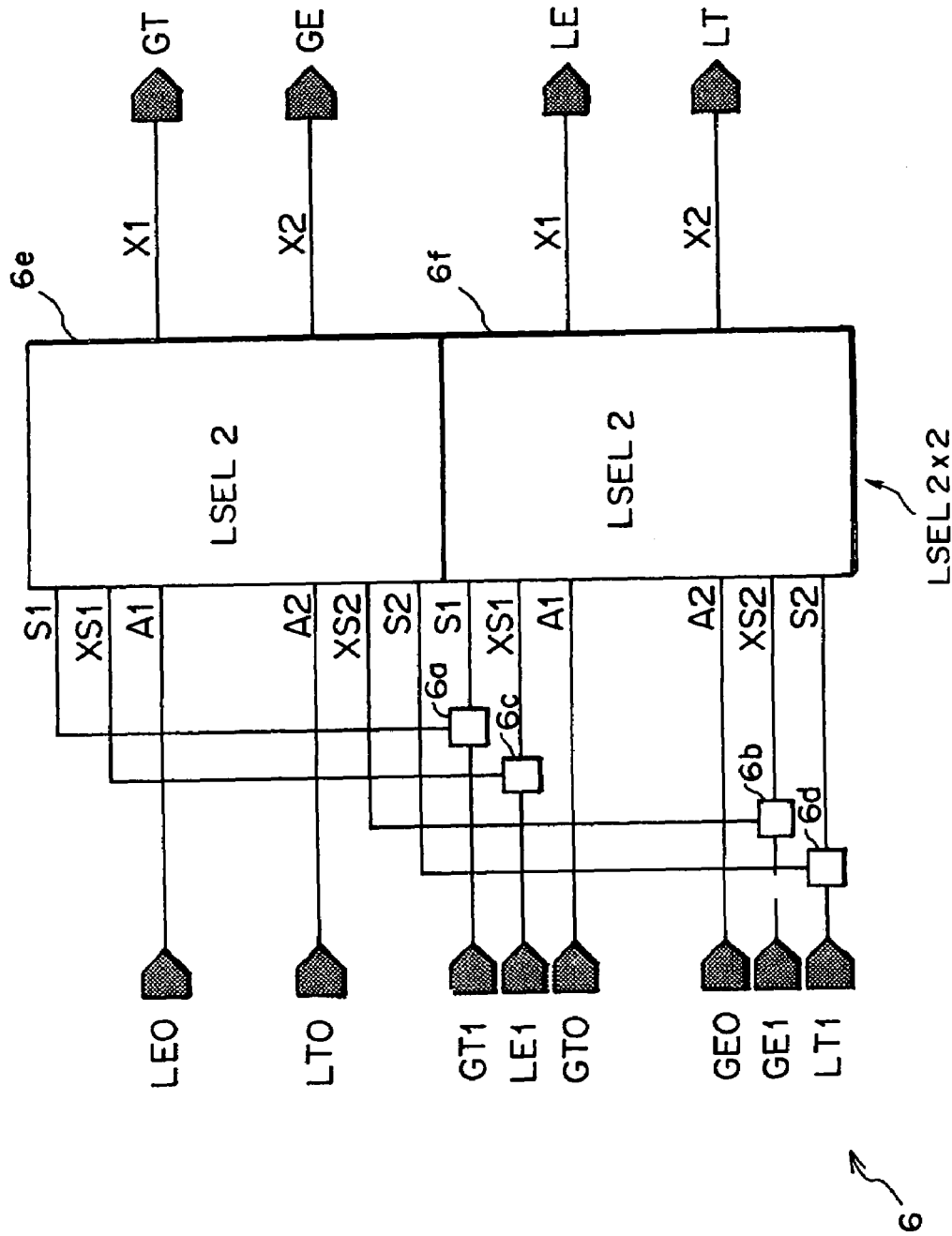
FIG. 6 is a block diagram showing a construction of a link selector circuit according to the embodiment of the present invention.

It is to be noted that it is possible to use some other circuit representation. FIG. 6 is a block diagram showing a construction of a link selector circuit according to the embodiment of the present invention. Referring to FIG. 6, the link selector circuit (LSEL2×2) 6 is composed of to such cells LSEL2 as shown in FIG. 2 connected to each other, and includes a first branch section 6*a*, a second branch section 6*b*, a third branch section 6*c*, a fourth branch section 6*d*, and a pair of selector circuits 6*e* and 6*f*.

The first branch section 6*a* receives two kinds of comparison result information using four kinds of status signals (GE0, GT0, LE0, LT0 and GE1, GT1, LE1, LT1) and branches the GT1 signal; the second branch section 6*b* branches the GE1 signal; the third branch section 6*c* branches the LE1 signal; and the fourth branch section 6*d* branches the LT1 signal. The selector circuit 6*e* receives signals outputted from the first branch section 6*a*, second branch section 6*b*, third branch section 6*c* and fourth branch section 6*d*, and the LE0 signal and the LT0 signal. The selector circuit 6*f* receives signals outputted from the first branch section 6*a*, second branch section 6*b*, third branch section 6*c* and fourth branch section 6*d*, and the GT0 signal and the GE0 signal. Each of the selectors 6*e* and 6*f* is formed from a cell LSEL2 described hereinabove.

Figure 7:
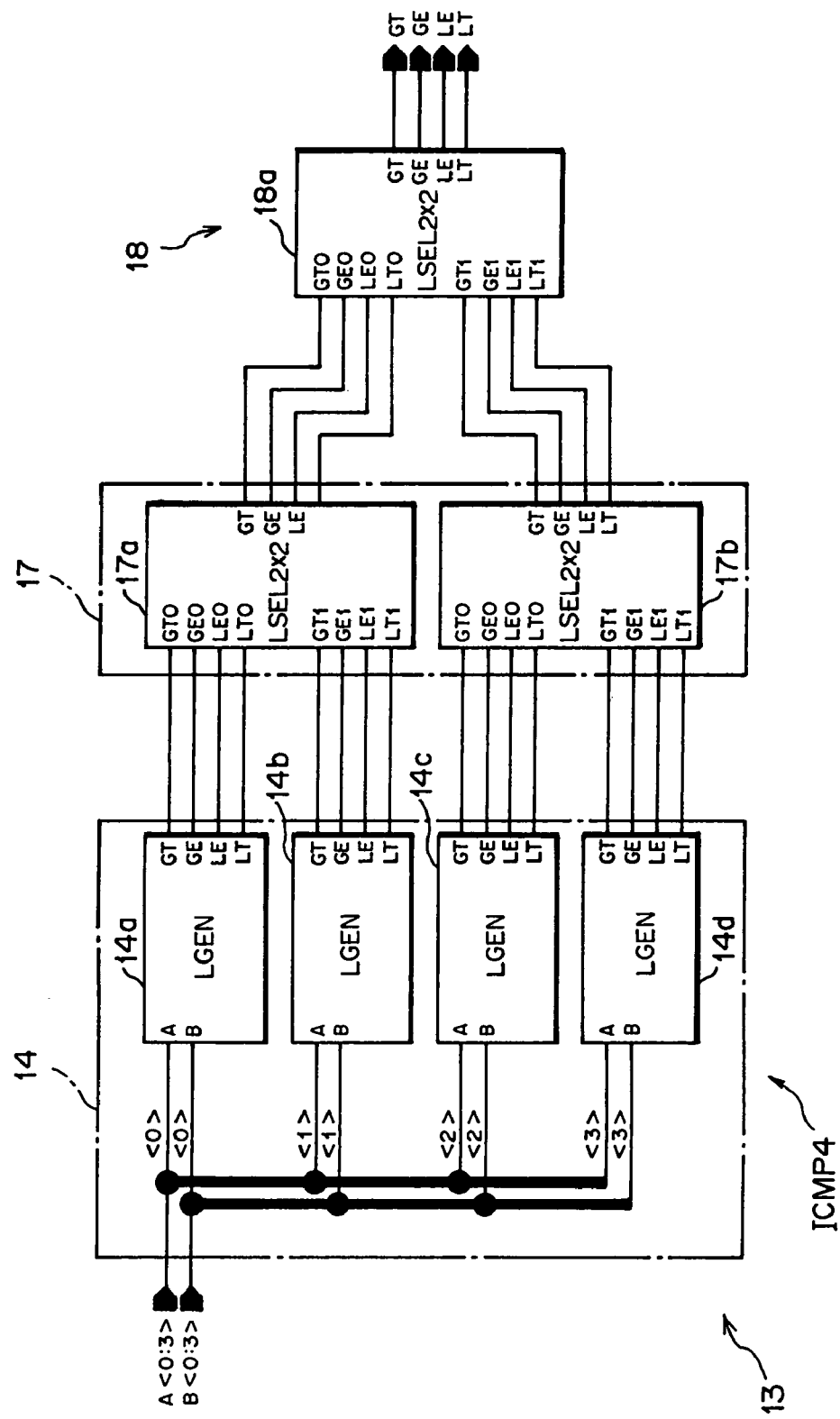
FIG. 7 is a block diagram showing a construction of a 4-bit magnitude comparison circuit according to the embodiment of the present invention.

If the 4-bit magnitude comparison circuit 13 of FIG. 5 is re-arranged using the link selector circuit 6, then such a circuit configuration as shown in FIG. 7 is obtained. FIG. 7 is a block diagram showing a construction of the 4-bit magnitude comparison circuit (ICMP4) 13 according to the embodiment of the present invention. A second carry generation section 17 shown in FIG. 7 corresponds to the second carry generation section 15 shown in FIG. 5, and a third carry generation section 18 corresponds to the third carry generation section 16 shown in FIG. 5. Referring to FIG. 7, the second carry generation section 17 is composed of a link selector circuit 17*a* which receives the first comparison result and the second comparison result as input signals and outputs the fifth comparison result, and a link selector circuit 17*b* which receives the third comparison result and the fourth comparison result as input signals and outputs the sixth comparison result, and the third carry generation section 18 is composed of a link selector circuit 18*a* which receives the fifth comparison result and the sixth comparison result as input signals and outputs a result of comparison of the four bits. It is to be noted that, while some other elements may possibly be denoted by like reference symbols to those given above, they have similar or equivalent functions to those described above, and therefore, overlapping description of them is omitted herein. Employment of the link selector circuit 6 makes it possible to design a circuit having a high degree of expandability.

Now, a circuit which performs magnitude comparison of 16 bits is described with reference to FIGS. 8 and 9.

Figure 8:
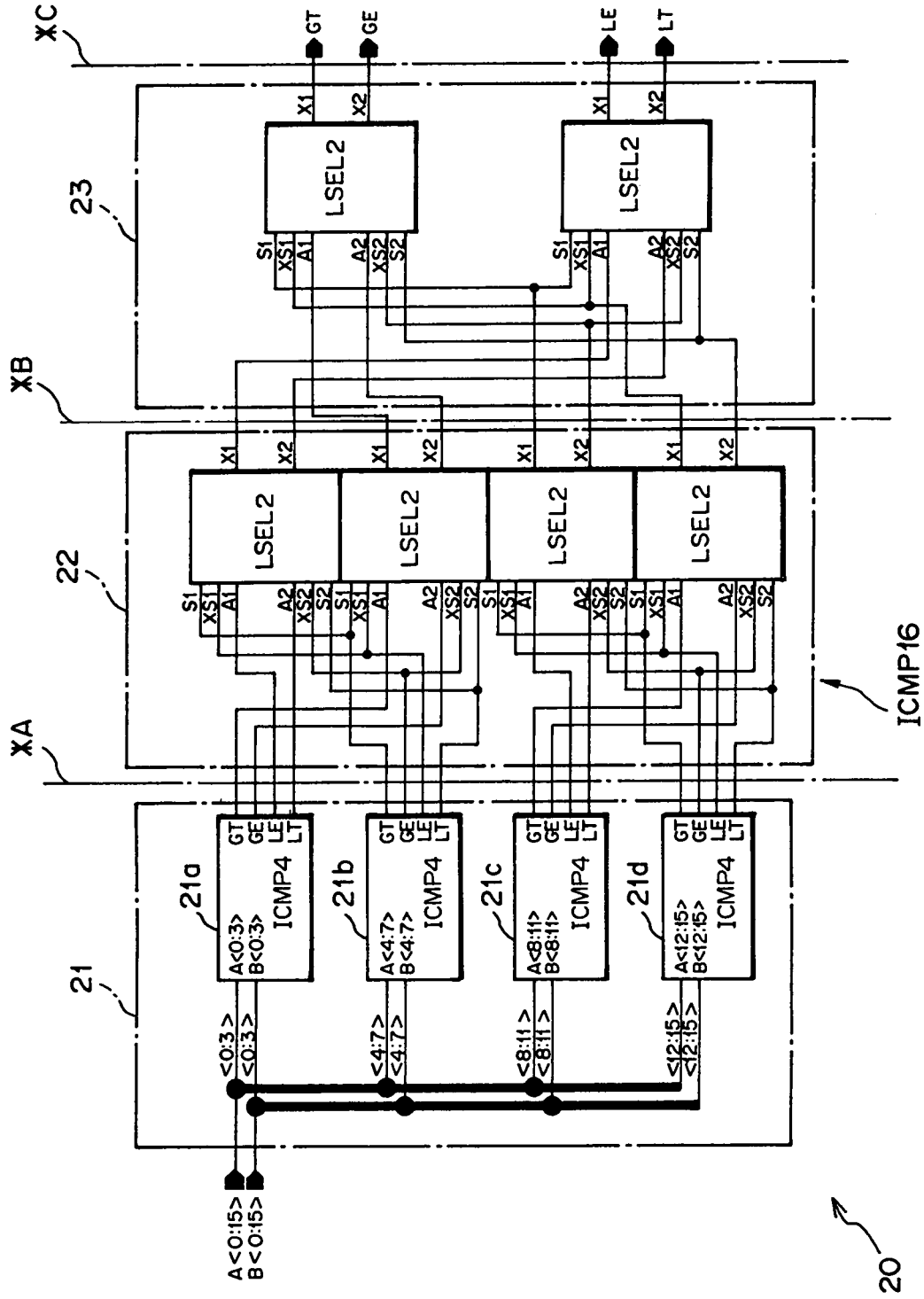
FIG. 8 is a block diagram showing a construction of a 16-bit magnitude comparison circuit according to the embodiment of the present invention.

FIG. 8 is a block diagram showing a construction of a 16-bit magnitude comparison circuit according to the embodiment of the present invention. Referring to FIG. 8, the 16-bit magnitude comparison circuit (ICPM16) 20 compares 16-bit signals with each other in magnitude and outputs four kinds of status signals GE, GT, LE and LT. The 16-bit magnitude comparison circuit 20 is composed of a first comparison section 21, a second comparison section 22, and a third comparison section 23. In FIG. 8, reference symbol A<0: 15> denotes an input signal of 16 bits and B<0: 15> denotes another input signal of 16 bits, and GT, GE, LE and LT appearing in FIG. 8 denote output signals. The same references may also be used as the names of the signal terminals. The input signals A<0: 15> and B<0: 15> are divided into 4 bits A<0: 3> and B<0: 3>, 4 bits A<4: 7> and B<4: 7>, 4 bits A<8: 11> and B<8: 11>, and 4 bits A<12: 15> and B<12: 15> in the first comparison section 21.

The first comparison section 21 receives a 16-bit input signal A<0:15> and another 16-bit input signal B<0:15>, performs magnitude comparison between the four high order bits A<0: 3> of the former input signal and the four high order bits B<0: 3> of the latter input signal, and outputs a result of the comparison of the four bits as a first comparison result, a second comparison result, a third comparison result and a fourth comparison result using the four kinds of status signals. The first comparison section 21 is composed of four kinds of 4-bit magnitude comparison circuits 21*a*, 21*b*, 21*c* and 21*d*, each of which is formed from the 4-bit magnitude comparison circuit 13 (refer to FIG. 5 or 7) described hereinabove.

The second comparison section 22 performs magnitude comparison between the eight high order bits A<0: 7> of the input signal A<0: 15> and the eight high order bits B<0: 7> of the input signal B<0: 15> from the first comparison result and the second comparison result and outputs a result of the comparison of the eight high order bits as a fifth comparison result using the four kinds of status signals. Further, the second comparison section 22 performs magnitude comparison between the eight low order bits A<8: 15> of the input signal A<0: 15> and the eight low order bits B<8: 15> of the input signal B<0: 15> from the third comparison result and the fourth comparison result and outputs a result of the comparison of the eight low order bits as a sixth comparison result using the four kinds of status signals. The second comparison section 22 is composed of four such cells LSEL2 as described hereinabove. The third comparison section 23 performs magnitude comparison between the 16 bits of the input signal A<0: 15> and the 16 bits of the input signal B<0: 15> from the fifth comparison result and the sixth comparison result and outputs a result of the comparison of the 16 bits using the four kinds of status signals. The third comparison section 23 is composed of two cells LSEL2.

In the 16-bit magnitude comparison circuit 20 described above, such magnitude relationships of 4 bits as described hereinabove with reference to FIG. 5 are determined on an alternate long and short dash line *A in FIG. 8; magnitude relationships of 8 bits are determined on another alternate long and short dash line *B; and a magnitude relationship of 16 bits is determined on a further alternate long and short dash line *C.

Figure 9:
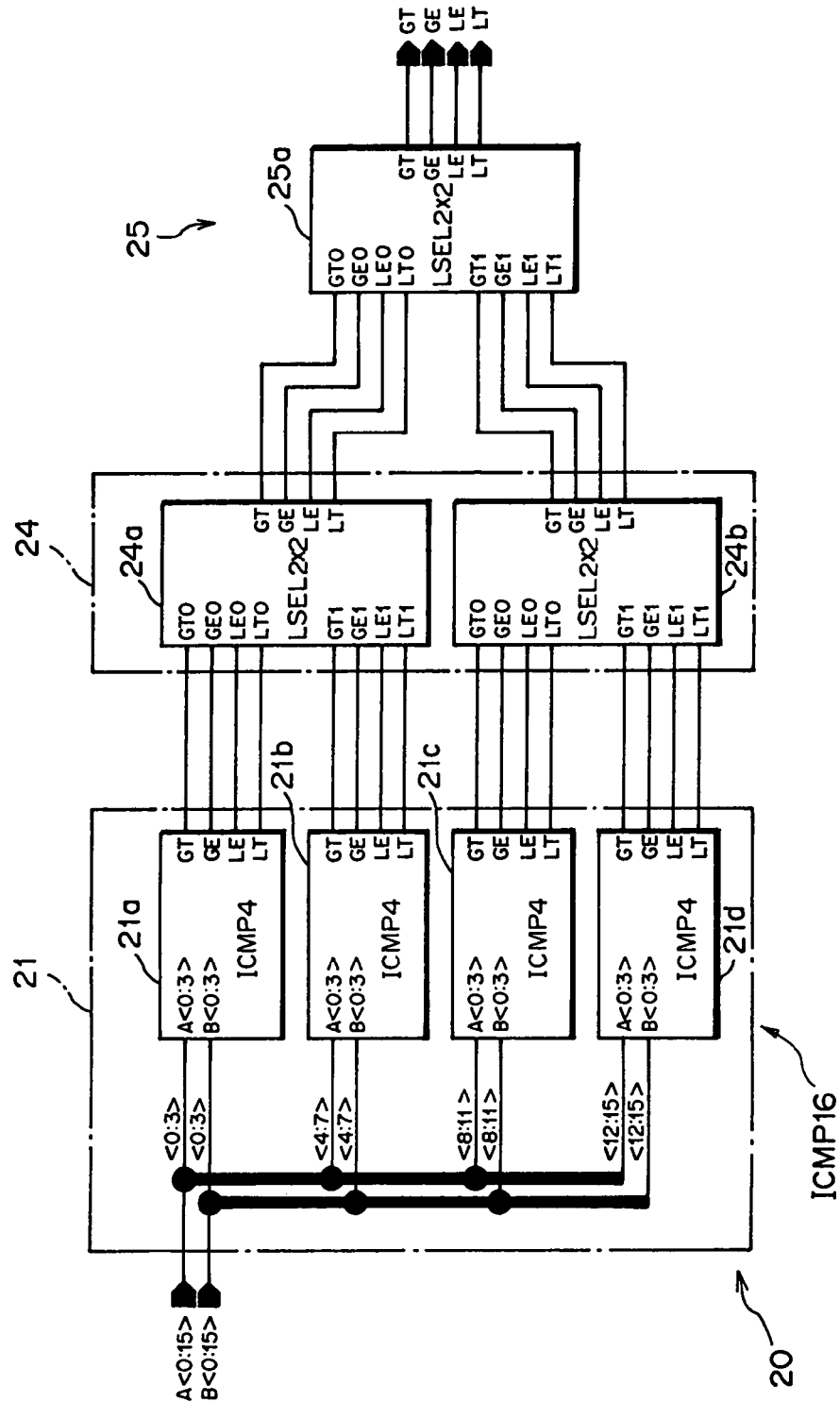
FIG. 9 is a block diagram showing a construction of another 16-bit magnitude comparison circuit according to the embodiment of the present invention.

If the 16-bit magnitude comparison circuit 20 of FIG. 8 is re-arranged using the link selector circuit 6 shown in FIG. 6, then such a circuit configuration as shown in FIG. 9 is obtained. FIG. 9 is a block diagram showing a construction of the 16-bit magnitude comparison circuit (ICMP16) 20 according to the embodiment of the present invention. A second comparison section 24 shown in FIG. 9 corresponds to the second comparison section 22 shown in FIG. 8, and a third comparison section 25 corresponds to the third comparison section 23 shown in FIG. 8. Referring to FIG. 9, the second comparison section 24 is composed of a link selector circuit 24a which receives the first comparison result and the second comparison result as input signals and outputs the fifth comparison result, and a link selector circuit 24b which receives the third comparison result and the fourth comparison result as input signals and outputs the sixth comparison result, and the third comparison section 25 is composed of a link selector circuit 25a which receives the fifth comparison result and the sixth comparison result as input signals and outputs a result of the comparison of the 16 bits. It is to be noted that, while some other elements may possibly be denoted by like reference symbols to those given above, they have similar or equivalent functions to those described above, and therefore, overlapping description of them is omitted herein.

Flows of signals are described with reference to FIG. 9. In particular, an input signal A<0: 15> and another input signal B<0: 15> are inputted to the first comparison section 21. In the first comparison section 21, the 4-bit magnitude comparison circuit (ICMP4) 21a performs magnitude comparison discrimination between the bits A<0: 3> and B<0: 3> and outputs a first comparison result using the four kinds of status signals GE, GT, LE and LT. Similarly, the 4-bit magnitude discrimination circuit 21b performs magnitude comparison discrimination between the bits A<4: 7> and B<4: 7> and outputs a second comparison result using the four kinds of status signals GE, GT, LE and LT; the 4-bit magnitude discrimination circuit 21c performs magnitude comparison discrimination between the bits A<8: 11> and B<8: 11> and outputs a third comparison result using the four kinds of status signals GE, GT, LE and LT; and the 4-bit magnitude discrimination circuit 21d performs magnitude comparison discrimination between the bits A<12: 15> and B<12: 15> and outputs a fourth comparison result using the four kinds of status signals GE, GT, LE and LT.

The first comparison result and the second comparison result are inputted to the link selector circuit 24a, by which magnitude comparison discrimination between the bits A<0: 7> and B<0: 7> is performed, and a result of the comparison of the 8 bits is outputted as a fifth comparison result using the four kinds of status signals. Similarly, the third comparison result and the fourth comparison result are inputted to the link selector circuit 24b, by which magnitude comparison discrimination between the bits A<8: 15> and B<8: 15> is performed, and a result of the comparison of the 8 bits is outputted as a sixth comparison result using the four kinds of status signals. Then, the third comparison section 25 performs magnitude comparison discrimination between the signals A<0: 15> and B<0: 15> from the fifth comparison result and the sixth comparison result and outputs a comparison result of the 16 bits using the four kinds of status signals (GE, GT, LE, LT).

Since the 16-bit magnitude comparison circuit 20 is constructed without varying the basic constructions of the 4-bit magnitude comparison circuits 21a, 21b, 21c and 21d and the link selector circuits 24a, 24b and 25a and besides makes much use of repetitiveness of wiring lines in this manner, it is advantageous in that it can be formed with a simple circuit configuration. Consequently, the layout man-hours upon development can be reduced significantly and the development man-hours can be reduced significantly, and besides it is possible to design a circuit having a high degree of expandability. Further, since the number of parts can be suppressed, the time required for tuning of parts is reduced significantly when compared with a circuit which includes many parts. Furthermore, since the 4-bit magnitude comparison circuits 21a, 21b, 21c and 21d and the link selector circuits 24a, 24b and 25a are formed from cells LGEN and LSEL2, respectively, and each of the leaf cells normally produces two kinds of signals of a regular phase signal and an inverted phase signal in the inside thereof as described hereinabove, there is an advantage that the entire circuit operates at a high speed.

Figure 10:
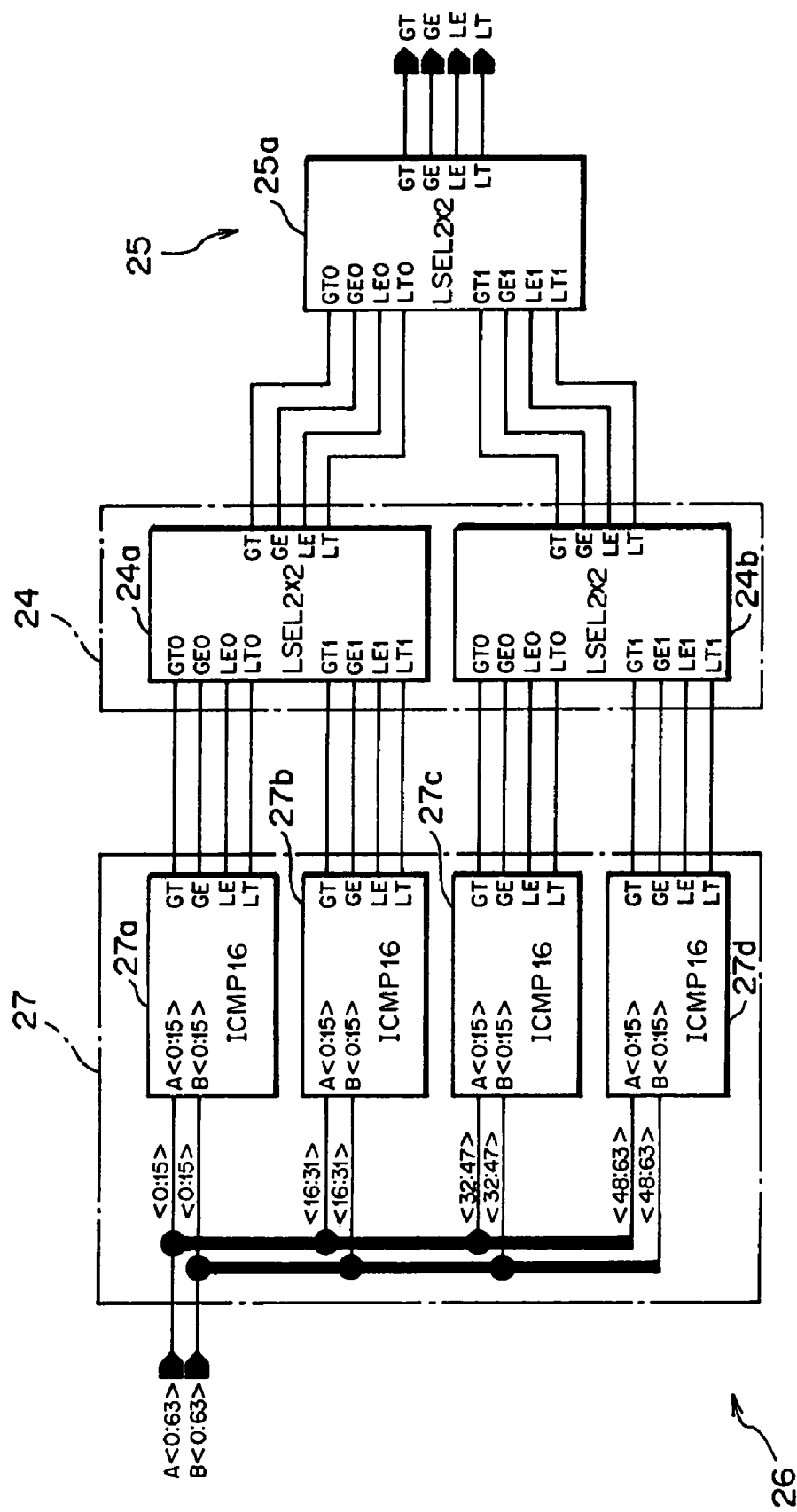
FIG. 10 is a block diagram showing an $n_1$-bit ($n_1$=64) magnitude comparison circuit according to the embodiment of the present invention.

A magnitude comparison circuit wherein the construction described above is expanded to general $n_1$ bits is described taking a magnitude comparison circuit wherein $n_1=64$ as an example. The symbol $n_1$ represents 4, 16, 64, 256, . . . , 2 to the $m_1$th power (m is an even number equal to or greater than 2). However, the expansion to any number of bits is possible. For example, the expansion to 200 bits is possible if predetermined bits of 256 bits are used. FIG. 10 is a block diagram showing a construction of an $n_1$-bit ($n_1=64$) magnitude comparison circuit according to the embodiment of the present invention. Referring to FIG. 10, the 64-bit magnitude comparison circuit 26 shown performs magnitude comparison of 64 bits and outputs a result of the comparison using the four kinds of status signals GE, GT, LE and LT. The 64-bit magnitude comparison circuit 26 is composed of a first comparison section 27, a second comparison section 24, and a third comparison section 25. In FIG. 10, reference symbol A<0: 63> denotes an input signal of 64 bits and B<0: 63> denotes another input signal of 64 bits, and GT, GE, LE and LT appearing in FIG. 10 denote output signals. The same references may also be used as the names of signal terminals.

The first comparison section 27 receives a 64-bit input signal A<0: 63> and another 64-bit input signal B<0: 63>, performs magnitude comparison between the 16 bits A<0: 15> of the former input signal and the 16 bits B<0: 15> of the latter input signal, and further performs magnitude comparison between the 16 bits A<16: 31> and B<16: 31>, A<32: 47> and B<32: 47>, and A<48: 63> and B<48: 63>, and outputs a result of the comparison of the 64 bits as a $p_1$th comparison result, a $p_2$th comparison result, a $p_3$th comparison result and a $p_4$th comparison result using the four kinds of status signals. The first comparison section 27 is composed of four 16-bit magnitude comparison circuits 27a, 27b, 27c and 27d, each of which is formed from a 16-bit magnitude comparison circuit 20 (refer to FIG. 8 or 9) described hereinabove.

The second comparison section 24 performs magnitude comparison between the bits A<0: 31> whose bit number is twice that of the 16 bits A<0: 15> of the input signal and the bits B<0: 31> whose bit number is twice that of the 16 bits B<0: 15> of the input signal from the $p_1$th comparison result and the $p_2$th comparison result and outputs a result of the comparison of the 32 bits as a $p_5$th comparison result using the four kinds of status signals. Further, the second comparison section 24 performs magnitude comparison between the bits A<32: 63> whose bit number is twice that of the 16 bits A<32: 47> of the input signal and the bits B<32: 63> whose bit number is twice that of the 16 bits B<32: 47> of the input signal from the $p_3$th comparison result and the $p_4$th comparison result and outputs a result of the comparison of the 32 bits as a $p_6$th comparison result using the four kinds of status signals. Also those functions are exhibited by the link selector circuits 24a and 24b described hereinabove.

Further, the third comparison section 25 performs magnitude comparison between the 64 bits of the input signal A<0: 63> and the 64 bits of the input signal B<0: 63> from the $p_5$th comparison result and the $p_6$th comparison result and outputs a comparison result of the 64 bits using the four kinds of status signals. Also this function is exhibited by the link selector circuit 25a described hereinabove.

Consequently, the 64 bits of the input signal A<0: 63> and the 64 bits of the input signal B<0: 63> are branched into four groups by the first comparison section 27, and magnitude comparison discrimination is performed for the four branched 16-bit signals by the 16-bit magnitude comparison circuits 27a, 27b, 27c and 27d. Consequently, a $p_1$th comparison result, a $p_2$th comparison result, a $p_3$th comparison result and a $p_4$th comparison result are outputted using the four kinds of status signals from the 16-bit magnitude comparison circuits 27a, 27b, 27c and 27d, respectively. The $p_1$th comparison result and the $p_2$th comparison result are inputted to the link selector circuit 24a, by which magnitude comparison discrimination between the bits A<0: 31> and B<0: 31> is performed, and a comparison result of the 32 bits is outputted as a $p_5$th comparison result using the four kinds of status signals from the link selector circuit 24a. Similarly, the $p_3$th comparison result and the $p_4$th comparison result are inputted to the link selector circuit 24b, by which magnitude comparison discrimination between the bits A<32: 63> and B<32: 63> is performed, and a comparison result of the 32 bits is outputted as a $p_6$th comparison result using the four kinds of status signals from the link selector circuit 24b. Further, the third comparison section 25 performs magnitude comparison discrimination between the bits A<0: 63> and B<0: 63> from the $p_5$th comparison result and the $p_6$th comparison result and outputs a comparison result of the 64 bits using the four kinds of status signals (GE, GT, LE and LT).

Since generally a magnitude comparison circuit for $n_1$ bits is formed from 16-bit magnitude comparison circuits (ICMP16) and cells LSEL2 in this manner, it is simple in circuit configuration and repetitiveness of wiring lines can be utilized well. Further, a circuit configuration having a high degree of expandability can be produced and magnitude comparison circuits for different bit widths can be designed simply and efficiently. Consequently, the layout man-hours upon development can be reduced significantly and the development man-hours can be reduced significantly, and besides it is possible to design a circuit having a high degree of expandability. Further, since the number of parts can be suppressed, the time required for tuning of parts is reduced significantly when compared with a circuit which includes many parts. Further, since the same leaf cells can be used, the magnitude comparison circuit is advantageous in that it contributes to augmentation of the yield and so forth upon production. Furthermore, since each of the leaf cells normally produces two kinds of signals of a regular phase signal and an inverted phase signal in the inside thereof as described hereinabove, there is an advantage that the entire circuit operates at a high speed.

Figure 11:
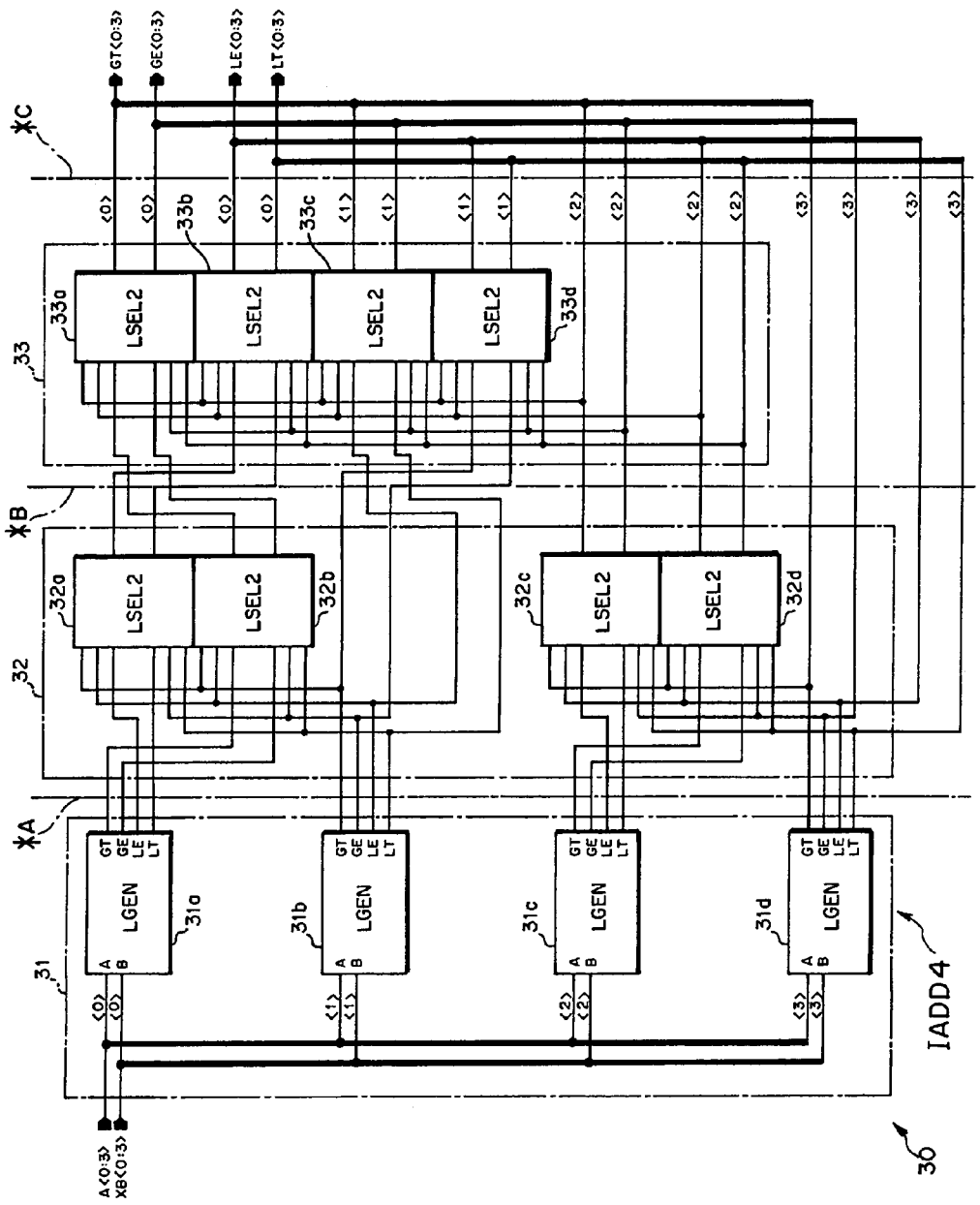
FIG. 11 is a block diagram showing a construction of a 4-bit full adder circuit according to the embodiment of the present invention.

Subsequently, an adder circuit as a functional circuit which uses the three kinds of leaf cells described above is described. FIG. 11 is a block diagram showing a construction of a 4-bit full adder circuit according to the embodiment of the present invention. The 4-bit full adder circuit is different from the 4-bit magnitude comparison circuit shown in FIG. 5 in that it additionally includes a circuit in the block construction in the third stage. It is to be noted here that, in FIG. 11, reference symbol A<0: 3> denotes an input terminal or an input signal, and XB<0: 3> denotes another input terminal or an inverted signal of another input signal.

Referring to FIG. 11, the 4-bit full adder circuit (IADD4) 30 shown is a CMOS logic circuit which performs full addition arithmetic of 4 bits and outputs the four kinds of status signals GE, GT, LE and LT. The 4-bit full adder circuit 30 includes a first carry generation section 31, a second carry generation section 32, a third carry generation section 33, and a fourth carry generation section 34.

The first carry generation section 31 receives a 4-bit input signal A<0: 3> and an inverted signal XB<0:3> of another 4-bit input signal, performs magnitude comparison for each one bit and outputs results of the magnitude comparison of the individual bits as a first carry, a second carry, a third carry and a fourth carry using a plurality of status signals. The first carry generation section 31 includes four magnitude discrimination circuits 31a, 31b, 31c and 31d, each of which is formed from a cell LGEN described hereinabove.

Figure 12:
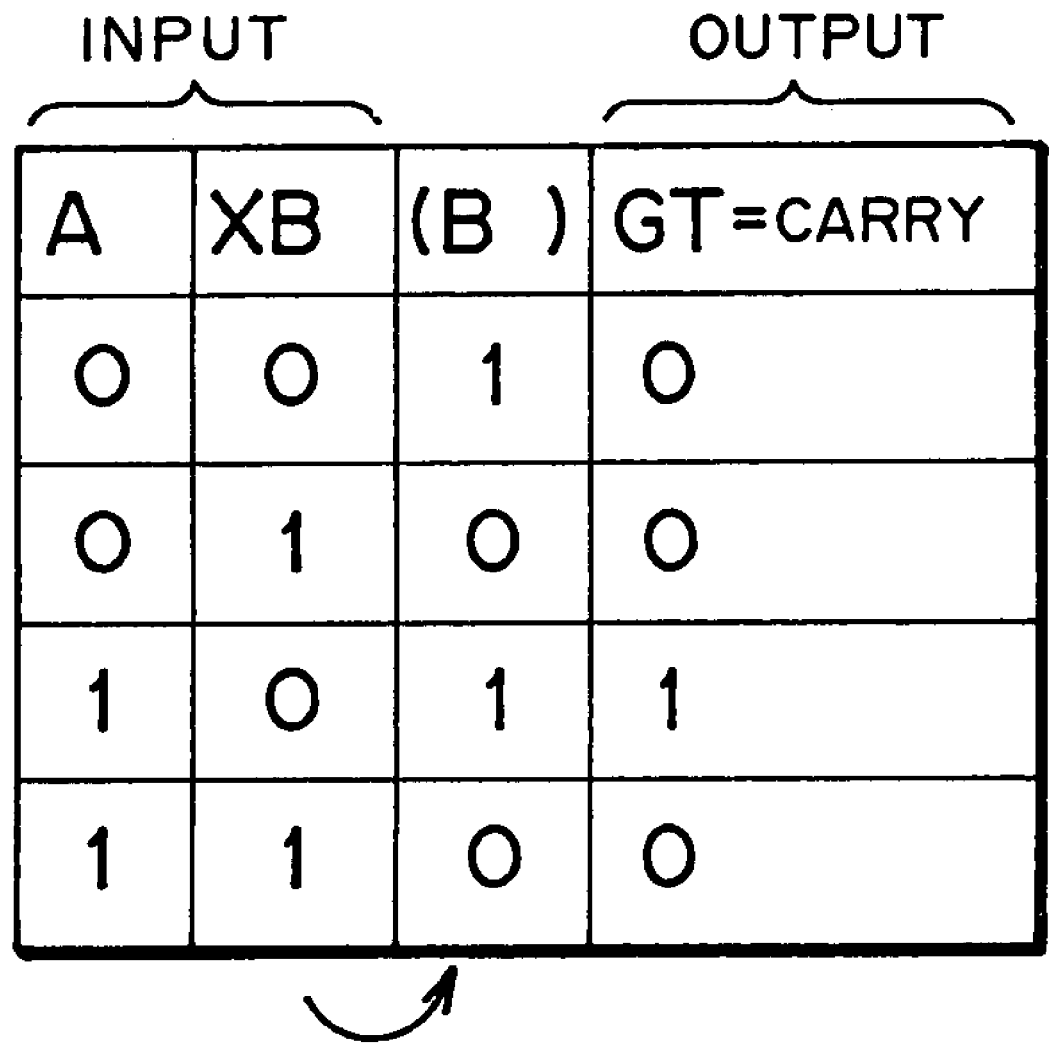

FIG. 12 is a diagrammatic view illustrating logical values of the cell LGEN when notice is take of the cell LGEN as a full adder circuit of 1 bit. Since a carry is outputted only when the input signals are (A, B)=(1, 1), arithmetic wherein 1 is outputted only with the combination just described and 0 is outputted with any other combination is required. Therefore, the GT signal which exhibits the same logical values is used.

Referring back to FIG. 11, the second carry generation section 32 outputs logical AND information of the first carry and the second carry as a fifth carry using the four kinds of status signals and outputs logical AND information of the third carry and the fourth carry as a sixth carry using the four kinds of status signals. The second carry generation section 32 is composed of four selector circuits 32a, 32b, 32c and 32d, each of which is formed from a cell LSEL2 described hereinabove. It is to be noted that also each of the four selector circuits 32a, 32b, 32c and 32d has, although not shown in FIG. 11, input terminals S1, XS1 and A1 and input terminals S2, XS2 and A2 and has output terminals X1 and X2 similarly to those shown in FIG. 5. The two selector circuits 32a and 32b cooperate to perform logical ANDing of full addition arithmetic results of the two high order bits of the first input signal and the second input signal from the first carry and the second carry and outputs a result of the logical ANDing as a fifth carry. Similarly, the two selector circuits 32c and 32d cooperate to perform logical ANDing of full addition arithmetic results of the two low order bits of the first input signal and the second input signal from the third carry and the fourth carry and outputs a result of the logical ANDing as a sixth carry.

The third carry generation section 33 outputs logical AND information of the first carry, second carry, third carry and fourth carry as a seventh carry from the fifth carry and the sixth carry using the four kinds of status signals, and outputs logical AND information of the second carry, third carry and fourth carry as an eighth carry from the second carry and the sixth carry using the four kinds of status signals. The third carry generation section 33 is composed of four selector circuits 33a, 33b, 33c and 33d, each of which is formed from a cell LSEL2 described hereinabove. The logical AND information signifies a logically ANDed value or values. Then, the 4-bit full adder circuit 30 outputs the fourth carry, sixth carry, seventh carry and eighth carry using the four kinds of status signals GE<0: 3>, GT<0: 3>, LE<0: 3> and LT<0: 3>.

Figure 13:
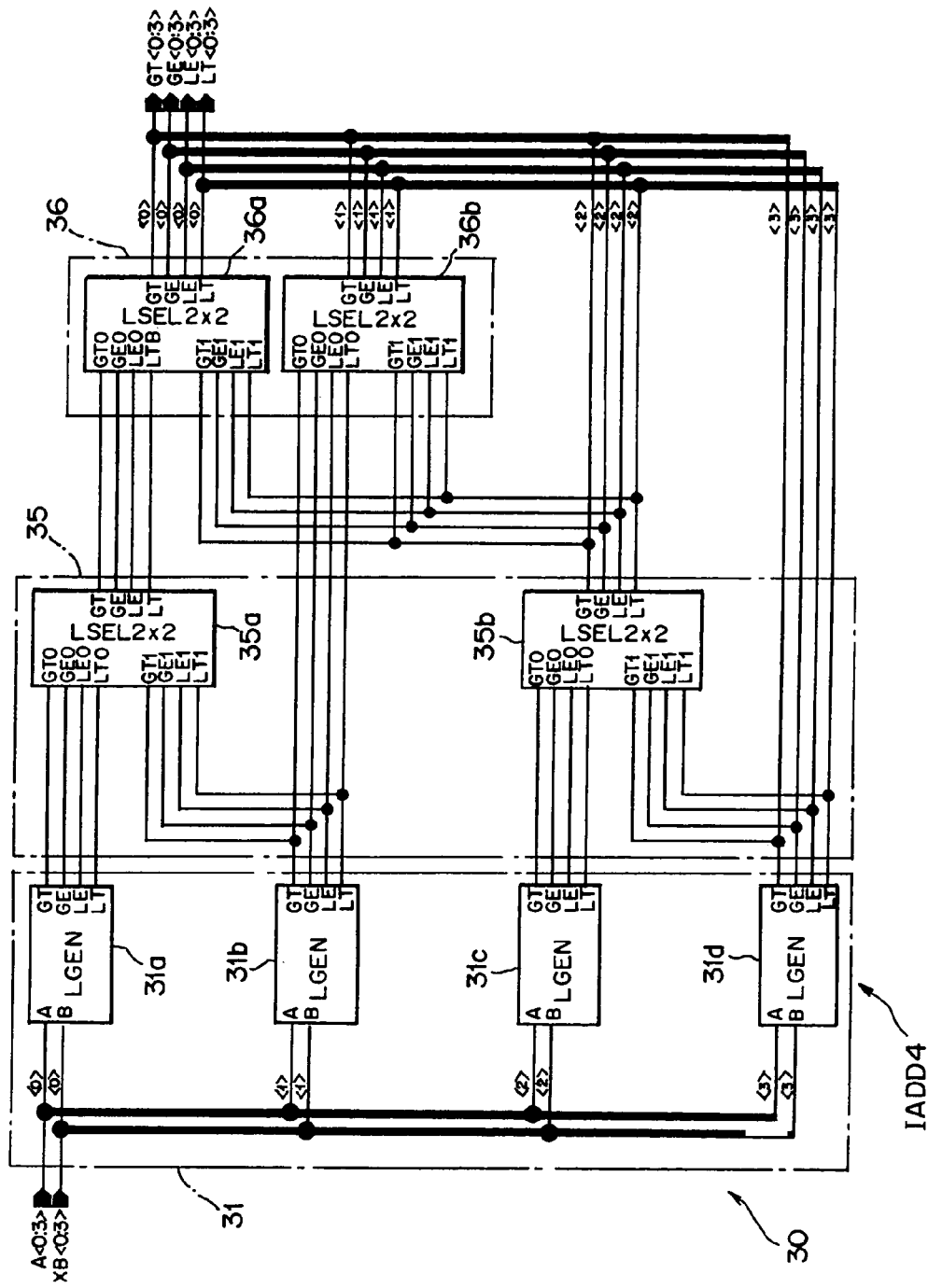
FIG. 13 is a block diagram showing a construction of a 4-bit full adder circuit according to the embodiment of the present invention.

If the 4-bit full adder circuit 30 of FIG. 11 is re-arranged using the link selector circuit 6 shown in FIG. 6, then such a circuit configuration as shown in FIG. 13 is obtained. FIG. 13 is a block diagram showing a construction of a 4-bit full adder circuit (IADD4) according to the embodiment of the present invention. A second carry generation section 35 shown in FIG. 13 corresponds to the second carry generation section 32 shown in FIG. 11, and a third carry generation section 36 corresponds to the third carry generation section 33 shown in FIG. 11. Referring to FIG. 13, the second carry generation section 35 is composed of a link selector circuit 35a which receives the first carry and the second carry as input signals and outputs the fifth carry, and another link selector circuit 35b which receives the third carry and the fourth carry as input signals and outputs the sixth carry, and the third carry generation section 36 is composed of a link selector circuit 36a which receives the fifth carry and the sixth carry as input signals and outputs the seventy carry, and another link selector circuit 36b which receives the second carry and the sixth carry as input signals and outputs the eighth carry. It is to be noted that, while some other elements may possibly be denoted by like reference symbols to those given above, they have similar or equivalent functions to those described above, and therefore, overlapping description of them is omitted herein.

Flows of signals when full addition arithmetic of an input signal A<0:3> and another input signal B<0:3> is performed are described below with reference to FIG. 13. In particular, an input signal A<0:3> and an inverted signal XB<0:3> of another input signal are inputted to the first carry generation section 31. In the first carry generation section 31, the magnitude comparison discrimination circuit 31a performs magnitude comparison discrimination between the bits A<0> and XB<0> to perform full addition arithmetic of the bits A<0> and B<0>. Information of whether or not a carry appears then is outputted as a first carry using the four kinds of status signals GE, GT, LE and LT. Similarly, the magnitude comparison discrimination circuit 31b performs magnitude comparison discrimination of the bits A<1> and XB<1> to perform full addition arithmetic of the bits A<1> and B<1>, and outputs presence or absence of a carry then as a second carry using the four kinds of status signals GE. GT, LE and LT. The magnitude comparison discrimination circuit 31c performs magnitude comparison discrimination of the bits A<2> and XB<2> to perform full addition arithmetic of the bits A<2> and B<2>, and outputs presence or absence of a carry then as a third carry using the four kinds of status signals GE. GT, LE and LT, and also the magnitude comparison discrimination circuit 31d performs magnitude comparison discrimination of the bits A<3> and XB<3> to perform full addition arithmetic of the bits A<3> and B<3>, and outputs presence or absence of a carry then as a fourth carry using the four kinds of status signals GE. GT, LE and LT.

The first carry and the second carry are inputted to the link selector circuit 35a, by which the carry from the bits A<0> and B<0> and the carry from the bits A<1> and B<1> are logically ANDed, and a logical AND result then is outputted as a fifth carry using the four kinds of status signals. Similarly, the third carry and the fourth carry are inputted to the link selector circuit 35b, by which the carry from the bits A<2> and B<2> and the carry from the bits A<3> and B<3> are logically ANDed, and a logical AND result then is outputted as a sixth carry using the four kinds of status signals.

Further, the link selector circuit 36a in the third carry generation section 36 logically ANDs all of the four carries including the carry between the bits A<0> and B<0>, the carry between the bits A<1> and B<1>, the carry between the bits A<2> and B<2> and the carry between the bits A<3> and B<3> using the fifth carry and the sixth carry, and outputs a logical AND result then as a seventh carry using a status signal of 4 bits. Also, the link selector circuit 36b in the third carry generation section 36 logically ANDs the three carries including the carry between the bits A<1> and B<1>, the carry between the bits A<2> and B<2> and the carry between the bits A<3> and B<3> using the second carry and the sixth carry, and outputs a logical AND result then as an eighth carry using a status signal of 4 bits.

Then, the logical AND result of 4 bits of the carry between the bits A<0> and B<0>, the carry between the bits A<1> and B<1>, the carry between the bits A<2> and B<2> and the carry between the bits A<3> and B<3> is outputted to the terminal GT<0>. The logical AND result of 3 bits of the carry between the bits A<1> and B<1>, the carry between the bits A<2> and B<2> and the carry between the bits A<3> and B<3> is outputted to the terminal GT<1>. The logical AND result of 2 bits of the carry between the bits A<2> and B<2> and the carry between the bits A<3> and B<3> is outputted to the terminal GT<2>. The carry between the bits A<3> and B<3> is outputted to the terminal GT<3>.

In this manner, the 4-bit full adder circuit (IADD4) 30 merges logical AND results of the input signal A<0: 3> and the inverted signal B<0: 3> successively in the successive stages and outputs a full addition arithmetic result of all of the 4 bits from the final stage.

Since the 4-bit full adder circuit 30 is formed from cells LGEN and LSEL2 and two kinds of signals of a regular phase signal and an inverted phase signal are normally produced and used in the inside of each of the cells of the 4-bit full adder circuit 30 as described hereinabove, there is an advantage that the 4-bit full adder circuit 30 operates at a high speed. Further, since such cells LGEN and LSEL2 as described above are used, the 4-bit full adder circuit 30 is simple in circuit configuration.

Figure 14:
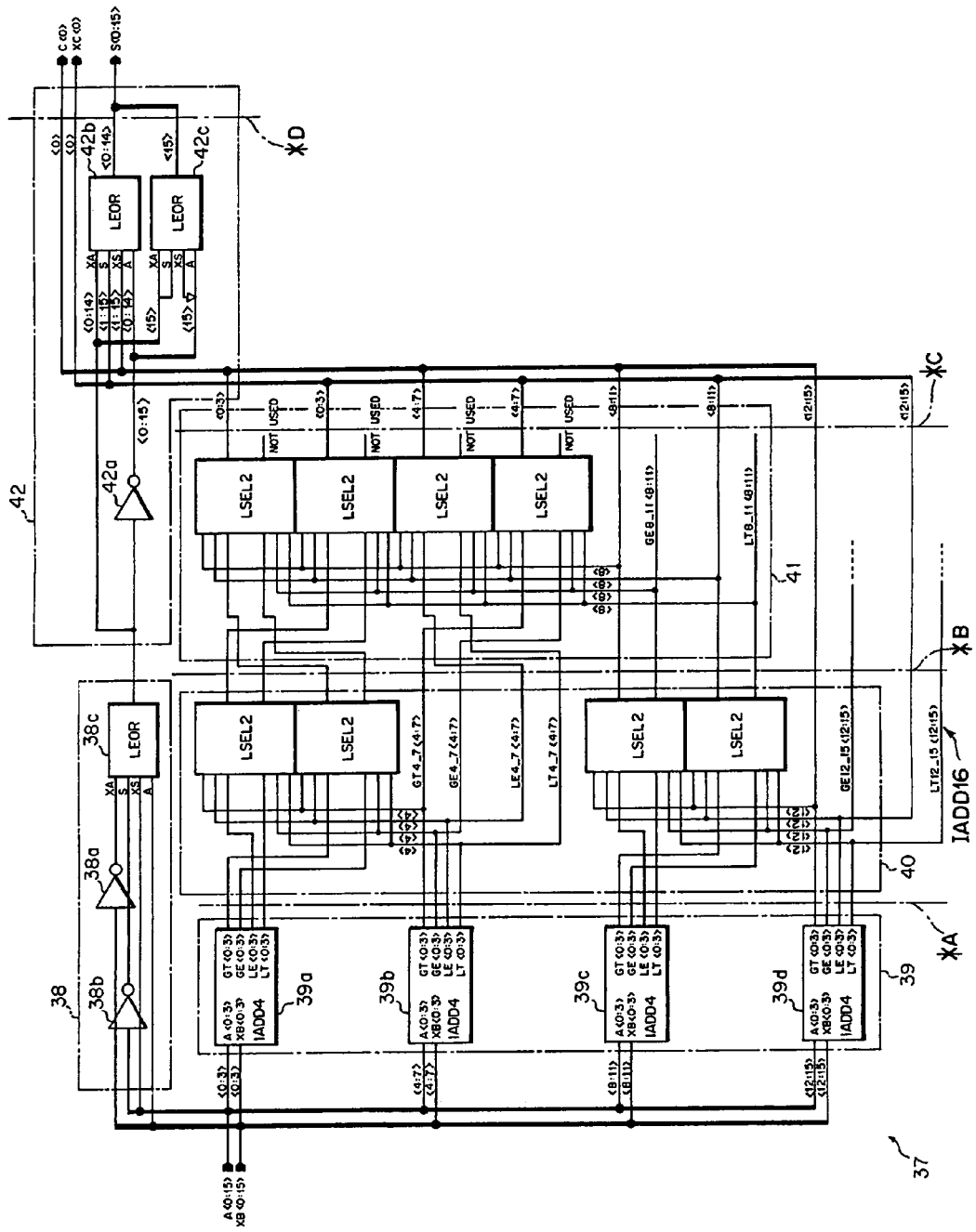
FIG. 14 is a block diagram showing a construction of a 16-bit full adder circuit according to the embodiment of the present invention.

Subsequently, a circuit which performs full addition arithmetic of 16 bits is described with reference to FIGS. 14 and 15. FIG. 14 is a block diagram showing a construction of a 16-bit full addition arithmetic circuit according to the embodiment of the present invention. Referring to FIG. 14, the 16-bit full addition arithmetic circuit (IADD16) 37 shown is a CMOS logic circuit which performs full addition arithmetic of 16 bits and is composed of a half addition arithmetic section 38, a first arithmetic section 39, a second arithmetic section 40, a third arithmetic section 41 and a fourth arithmetic section 42. It is to be noted that reference symbol A<0: 14> denotes an input terminal or an input signal, and XB<0: 16> denotes another input terminal or an inverted signal of another input signal.

The half addition arithmetic section 38 receives a first input signal A<0: 15> of 16 bits and an inverted signal XB<0: 15> of a second input signal of 16 bits and performs half addition arithmetic of the signals A<0: 15> and B<0: 15>. The half addition arithmetic section 38 includes a first inversion section 38a, a second inversion section 38b and a half addition processing section 38c. The first inversion section 38a outputs an inverted logic value of the signal A<0: 15> and is formed from an ordinary inverter. The second inversion section 38b outputs a signal B<0: 15> inverted from the inverted signal XB<0: 15> and is formed from an ordinary inverter. The half addition processing section 38c performs half addition arithmetic between the output XA<0: 15> of the first inversion section 38a and the output B<0: 15> of the second inversion section 38b and is formed from a cell LEOR described hereinabove.

The first arithmetic section 39 performs full addition arithmetic of the signals A<0: 15> and B<0: 15> separately for each four bits and outputs full addition arithmetic results for the four bits as a first carry, a second carry, a third carry and a fourth carry using the four kinds of status signals. The first arithmetic section 39 is composed of four 4-bit full adder circuits 39a, 39b, 39c and 39d, each of which is formed from a 4-bit full adder circuit (IADD4) described hereinabove. The second arithmetic section 40 outputs logical AND information of the first carry and the second carry as a fifth carry using the four kinds of status signals and outputs logical AND information of the third carry and the fourth carry as a sixth carry using the four kinds of status signals. The third arithmetic section 41 outputs logical AND information of all of the 16 bits at least from the fifth carry and the sixth carry as a seventh carry using the four kinds of status signals.

It is to be noted that each of the selector circuits (LSEL2) in the second arithmetic section 40 and the third arithmetic section 41 has input terminals S1, XS1 and 41 and input terminals S2, XS2 and A2, and output terminals X1 and X2 similarly to those shown in FIG. 5.

The fourth arithmetic section 42 performs logical exclusive ORing of the output of the half addition arithmetic section 38 and the seventh carry and outputs a full addition arithmetic result. The fourth arithmetic section 42 includes an inversion section 42a and full addition arithmetic outputting sections 42b and 42c. The inversion section 42a outputs an inverted logical value of an input signal and is formed from an inverter which, for example, may be selected from within a standard library equipped in a circuit designing tool. The full addition arithmetic outputting section 42b performs full addition arithmetic between the output of the inversion section 42a and the output of the third arithmetic section 41. The full addition arithmetic outputting section 42b is formed from a cell LEOR described hereinabove. The full addition arithmetic outputting section 42c performs full addition arithmetic between the output of the half addition arithmetic section 38 and the output of the inversion section 42a.

Figure 15:
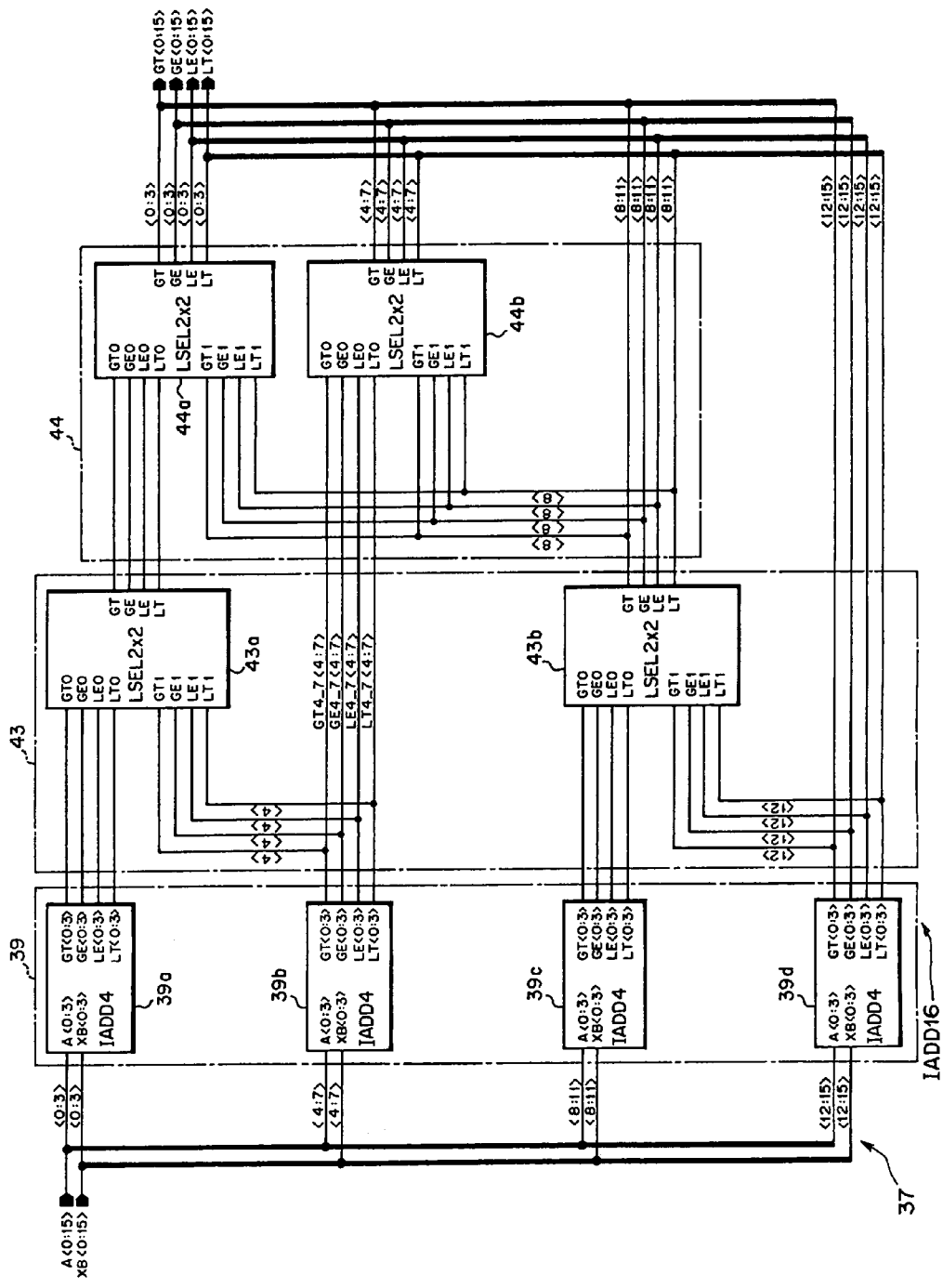
FIG. 15 is a block diagram showing a construction of a first arithmetic section, a second arithmetic section, and a third arithmetic section of another 16-bit full adder circuit according to the embodiment of the present invention.

If the first arithmetic section 39, second arithmetic section 40 and third arithmetic section 41 shown in FIG. 14 are re-arranged using the link selector circuit 6 shown in FIG. 6, then such a circuit configuration as shown in FIG. 15 is obtained. FIG. 15 is a block diagram showing a construction of the first arithmetic section 39, second arithmetic section 43 and third arithmetic section 44 of a 16-bit full adder circuit (IADD16) according to the embodiment of the present invention. A second arithmetic section 43 shown in FIG. 15 corresponds to the second arithmetic section 40 shown in FIG. 14, and a third arithmetic section 44 corresponds to the third arithmetic section 41 shown in FIG. 14. Referring to FIG. 15, the second arithmetic section 43 is composed of a link selector circuit 43a which receives the first carry and the second carry as input signals and outputs the fifth carry, and another link selector circuit 43b which receives the third carry and the fourth carry as input signals and outputs the sixth carry, and the third arithmetic section 44 is composed of a link selector circuit 44a which receives the fifth carry and the sixth carry as input signals and outputs the seventy carry, and a link selector circuit 44b which receives the second carry and the sixth carry as input signals and outputs the eighth carry. It is to be noted that, while some other elements may possibly be denoted by like reference symbols to those given above, they have similar or equivalent functions to those described above, and therefore, overlapping description of them is omitted herein.

Flows of signals are described with reference to FIG. 14. In particular, a first input signal A<0: 15> and an inverted signal XB<0: 15> of a second input signal B<0: 15> are inputted to the first arithmetic section 39. In the first arithmetic section 39, the 4-bit full adder circuit 39a performs full addition of the bits A<0: 3> and B<0: 3> and outputs a signal including logical AND information at least of the bits A<0>–B<0> as a first carry (refer to an alternate long and short dash line *A in FIG. 14). The 4-bit full adder circuit 39b performs full addition of the bits A<4: 7> and B<4: 7> and outputs a signal including logical AND information at least of the bits A<4>–B<4> as a second carry. The 4-bit full adder circuit 39c performs full addition of the bits A<8: 11> and B<8: 11> and outputs a signal including logical AND information at least of the bits A<8>–B<8> as a third carry. The 4-bit full adder circuit 39d performs full addition of the bits A<12: 15> and B<12: 15> and outputs a signal including logical AND information at least of the bits A<12>–B<12> as a fourth carry.

The first carry and the second carry are inputted to the second arithmetic section 40, by which the carry from the bits A<0: 3> and B<0: 3> and the carry from the bits A<4: 7> and B<4: 7> are logically ANDed, and a logical AND result then is outputted as a fifth carry which has the carry information from the bits A<0: 7> and B<0: 7> using the four kinds of status signals (refer to an alternate long and short dash line *B in FIG. 14). Similarly, the third carry and the fourth carry are inputted to the second arithmetic section 40, by which the carry from the bits A<8: 11> and B<8: 11> and the carry from the bits A<12: 15> and B<12: 15> are logically ANDed, and a logical AND result then is outputted as a sixth carry which has the carry information from the bits A<8: 15> and B<8: 15> using the four kinds of status signals. Further, the third arithmetic section 41 produces from the fifth carry and the sixth carry and outputs a seventh carry which has the carry information from the bits A<0: 15> and B<0: 15> (refer to an alternate long and short dash line *C in FIG. 14).

Meanwhile, the first input signal A<0: 15> and the inverted signal XB<0: 15> of the second input signal B<0:

15> are inputted to the half addition arithmetic section 38. In the half addition arithmetic section 38, the half addition processing section 38c performs half addition arithmetic of the signals A<0: 15> and B<0: 15>. The fourth arithmetic section 42 performs logical exclusive ORing of the half addition output of the half addition processing section 38c and the seventh carry from the third arithmetic section 41 and outputs a full addition arithmetic result (refer to an alternate long and short dash line *D in FIG. 14).

In this manner, since the 16-bit full adder circuit 37 is formed from 4-bit full adder circuits, cells LSEL2 and cells LEOR, it is advantageous in that it is simple in circuit configuration utilizing repetitiveness of wiring lines much. Further, the 16-bit full adder circuit 37 can be formed so as to receive a minimized number of input signals and so as to cope with various hierarchies from comparison of 1 bit to comparison of 16 bits. Consequently, the layout man-hours upon development can be reduced significantly and the development man-hours can be reduced significantly, and besides it is possible to design a circuit having a high degree of expandability. Further, since the number of parts can be suppressed, the time required for tuning of parts is reduced significantly when compared with a circuit which includes many parts. In particular, the 16-bit full addition arithmetic circuit 37 requires only tuning of parts limited to the several kinds and significantly reduces the man-hours for arrangement or layout transistors (graph patterning) upon development. Further, since the same leaf cells can be used, the 16-bit full addition arithmetic circuit 37 is advantageous in that it contributes to augmentation of the yield and so forth upon production. Furthermore, since two kinds of signals of a regular phase signal and an inverted phase signal are normally produced and used in the inside of each of the leaf cells as described hereinabove, there is an advantage that the entire circuit operates at a high speed.

Figure 16:
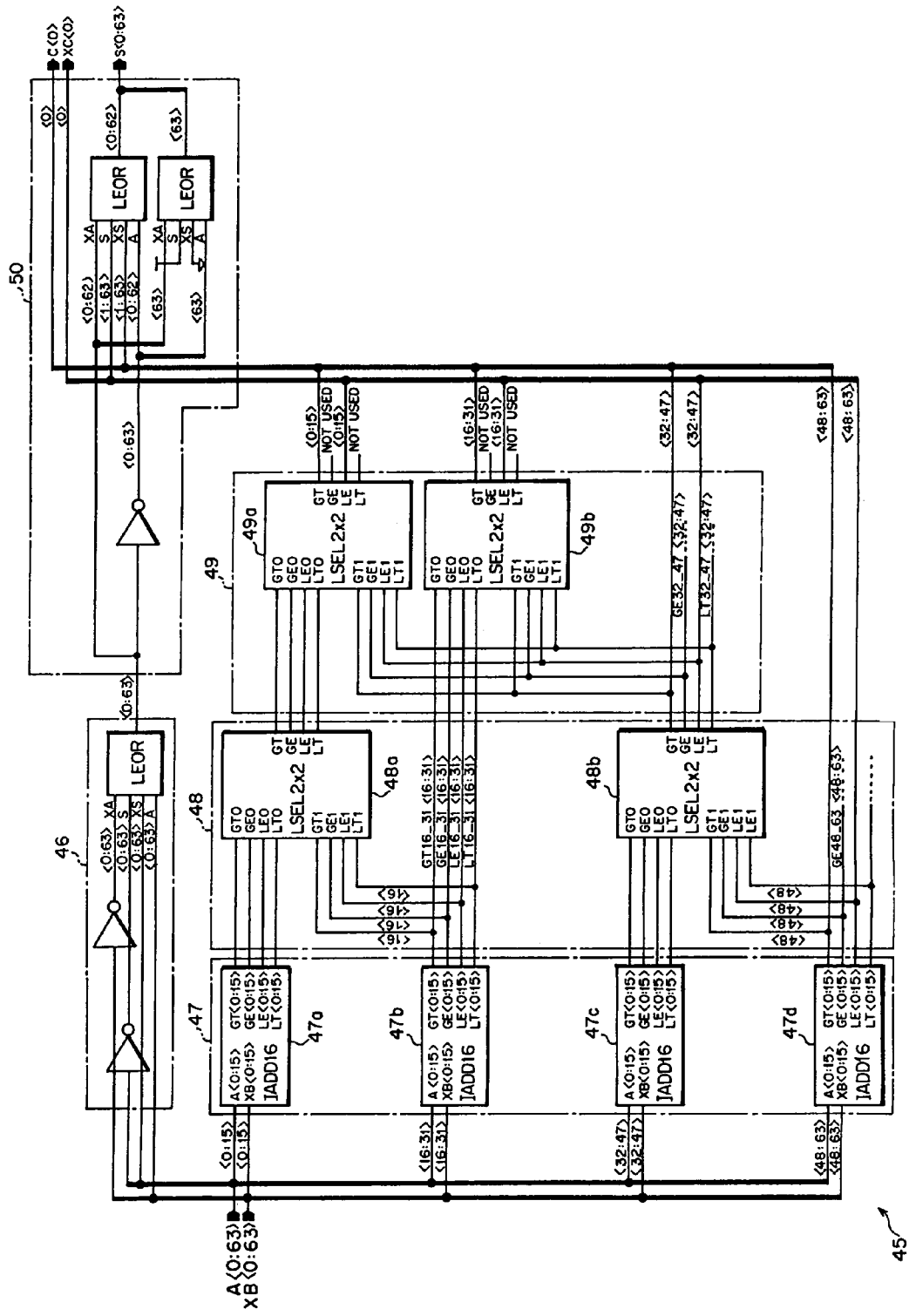
FIG. 16 is a block diagram showing a construction of an $n_2$-bit ($n_2$=64) full adder circuit according to the embodiment of the present invention.

A full adder circuit wherein the construction described above is expanded to that for general $n_2$ bits is described taking a full adder circuit wherein $n_2$=64 as an example. The symbol $n_2$ represents 4, 16, 64, 256, . . . , 2 to the $m_2$th power ($m_2$ is an even number equal to or greater than 2). However, the expansion to any number of bits is possible. For example, the expansion to 200 bits is possible if predetermined bits of 256 bits are used. FIG. 16 is a block diagram showing a construction of an $n_2$-bit ($n_2$=64) full adder circuit according to the embodiment of the present invention. Referring to FIG. 16, the 64-bit full adder circuit 45 shown is a CMOS logic circuit which performs full addition arithmetic of 64 bits and is composed of a half addition arithmetic section 46, a first arithmetic section 47, a second arithmetic section 48, a third arithmetic section 49 and a fourth arithmetic section 50. In FIG. 16, reference symbol A<0: 63> denotes an input terminal or an input signal and B<0: 63> denotes an inverted signal of another input terminal or another input signal.

The half addition arithmetic section 46 receives a first input signal A<0: 63> of 64 bits and an inverted signal XB<0: 63> of a second input signal of 64 bits and performs half addition arithmetic of the signals A<0: 63> and B<0: 63>.

The first arithmetic section 47 performs full addition arithmetic of the signals A<0: 63> and B<0: 63> separately for each 16 bits and outputs full addition arithmetic results as a $q_1$th carry, a $q_2$th carry, a $q_3$th carry and a $q_4$th carry using four kinds of status signals. The first arithmetic section 47 is composed of four 16-bit full adder circuits 47a, 47b, 47c and 47d. The second arithmetic section 48 outputs logical AND information of the $q_1$th carry and the $q_2$th carry as a $q_5$th carry using the four kinds of status signals and outputs logical AND information of the $q_3$th carry and the $q_4$th carry as a $q_6$th carry using the four kinds of status signals. The second arithmetic section 48 is composed of link selector circuits 48a and 48b. The third arithmetic section 49 produces at least from the $q_5$th carry and the $q_6$th carry and outputs logical AND information of the carries from all of the 64 bits as a $q_7$th using the four kinds of status signals. The fourth arithmetic section 50 performs logical exclusive ORing of the output of the half addition arithmetic section 46 and the $q_7$th carry and outputs a full addition arithmetic result. The fourth arithmetic section 50 is composed of a pair of link selector circuits 49a and 49b.

Flows of signals are described with reference to FIG. 16. In particular, a first input signal A<0: 63> and an inverted signal XB<0: 63> of a second input signal B<0: 63> are inputted to the first arithmetic section 47. In the first arithmetic section 47, the 16-bit full adder circuits 47a, 47b, 47c and 47d perform full addition separately for each 16 bits and output resulting carries as a $q_1$th carry, a $q_2$th carry, a $q_3$th carry and a $q_4$th carry of 16 bits, respectively. The $q_1$th carry and the $q_2$th carry are inputted to the second arithmetic section 48, by which the carry from the bits A<0: 15> and B<0: 15> and the carry from the bits <16: 31> and B<16: 31> are logically ANDed, and a result of the logical ANDing is outputted as a $q_5$th carry of 16 bits. Further, the $q_3$th carry and the $q_4$th carry are inputted to the second arithmetic section 48, by which the carry from the bits A<32: 47> and B<32: 47> and the carry from the bits A<48: 63> and B<48: 63> are logically ANDed, and a result of the logical ANDing is outputted as a $q_6$th carry of 16 bits. Furthermore, the third arithmetic section 49 produces from the $q_5$th carry and the $q_6$th carry and outputs a $q_7$th carry having at least the carry information of the bits A<0: 63> and B<0: 63>.

Meanwhile, the first input signal A<0: 63> and the inverted signal XB<0: 63> of the second input signal B<0: 63> are inputted to the half addition arithmetic section 46, by which half addition arithmetic of the bits A<0: 63> and B<0: 63> is performed, and a result of the half addition arithmetic is outputted from the half addition arithmetic section 46. The fourth arithmetic section 50 performs logical exclusive ORing of the half addition output of the half addition arithmetic section 46 and the $q_7$th carry from the third arithmetic section 49 and outputs a full addition arithmetic result.

In this manner, since the $n_2$-bit full adder circuit is formed from 16-bit full adder circuits (IADD16), cells LSEL2 and cells LEOR, adder circuits and magnitude comparison circuits of different bit widths can be obtained simply and efficiently and besides circuits which operate at a high speed can be designed. Further, since the same leaf cells are used, the yield and so forth upon production are improved. Furthermore, since the number of kinds of leaf cells can be suppressed, the development man-hours for leaf cells is reduced significantly, and besides, since the circuit scale is reduced as a whole, a layout can be designed with increased repetitiveness of wiring lines, and consequently, the man-hours can be reduced remarkably.

Subsequently, an increment circuit to which the present invention is applied is described. The increment circuit is used principally as a command register in a processor or the like and may have, for example, a 64-bit length. Further, the increment circuit counts up while the increment thereupon varies to 2, 4, 8, 16 and so forth and is different in this regard from a counter circuit formed from a register or the like and having a constant increment of 1. The increment circuit is composed of a carry generation circuit and a full adder circuit. As details of the increment circuit, leaf cells which form the carry generation circuit are first described with reference to FIGS. 17 to 21, and then a carry generation circuit is described with reference to FIGS. 22 and 23, whereafter an actual increment circuit is described with reference to FIGS. 24 and 25.

Figure 17:
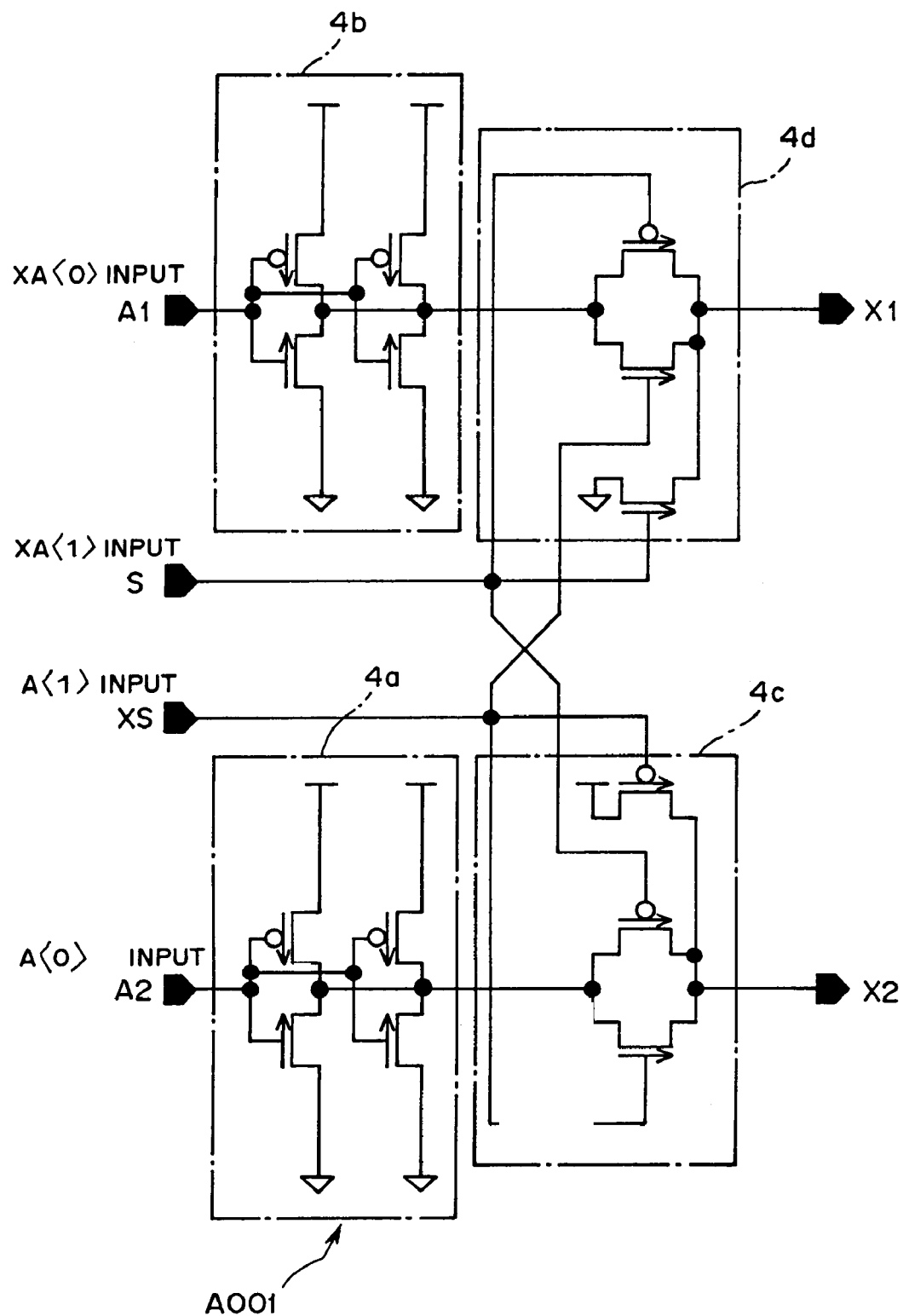
FIG. 17 is a block diagram showing a construction of a fourth leaf cell according to the embodiment of the present invention.

FIG. 17 is a block diagram showing a construction of a fourth leaf cell according to the embodiment of the present invention. Referring to FIG. 17, the cell A001 shown is a CMOS logic circuit for implementing the logic described below and includes a first inversion section 4a, a second inversion section 4b, a first outputting section 4c and a fourth outputting section 4d. The cell A001 shown in FIG. 17 has input terminals A1, S, XS and A2. A first signal of 2 bits A<0: 1> and a second signal of 2 bits XA<0: 1> are inputted to the cell A001.

The first inversion section 4a inverts the first input signal A<0> and outputs the inverted signal. The second inversion section 4b inverts an inverted signal XA<0> of the first input signal and outputs the inverted signal. The first outputting section 4c performs NANDing arithmetic of the output of the first inversion section 4a and the second input signal and outputs a resulting signal. The fourth outputting section 4d performs NANDing arithmetic of the output of the second inversion section 4b and an inverted signal of the second input signal and outputs a resulting signal. The first outputting section 4c and the fourth outputting section 4d are changed over with the second input signal A<1> and the inverted signal XA<1> of the second input signal, respectively. Outputs of the fourth outputting section 4d and the first outputting section 4c of the cell A001 are connected output terminals X1 and X2 of the cell A001, respectively.

FIG. 18(a) illustrates logical values at the input side terminals S, XS and A1 and the output side terminal X1 of the cell A001. FIG. 18(b) illustrates logical values at the input side terminals S, XS and A2 and the output side terminal X2 of the cell A001. It is inhibited that the same logical value be inputted to the terminal S and the terminal XS of the cell A001. Meanwhile, FIG. 19 illustrates logical values of the cell A001. More specifically, FIG. 19 illustrates logical values when the bits A<0>, XA<0>, A<1> and XA<1> are applied to the input terminals A2, A1, XS and S of the cell A001, respectively. As seen from FIG. 19, an ANDing arithmetic result of the bits A<0> and A<1> is outputted from the output terminal X1. Similarly, a NANDing arithmetic result of the bits A<0> and A<1> is outputted from the output terminal X2.

Consequently, if input signals are applied appropriately to the cell A001, then the cell A001 can output an AND value and an inverted value of the AND value of the bits A<0> and A<1> based on positive logic and negative logic values of the 2 bits A<0> and A<1> inputted thereto. Further, since the double inverters of the cell A001 are formed from CMOS logics in this manner, the cell A001 operates at a high speed, and besides, the isolation between a circuit on the output side and another circuit preceding to the cell A001 is strengthened. Furthermore, since the necessity for provision of an inverter circuit in a circuit preceding to the cell A001 is eliminated, there is an advantage that the burden on the circuit in the preceding stage can be reduced and the circuit configuration can be simplified.

Figure 20:
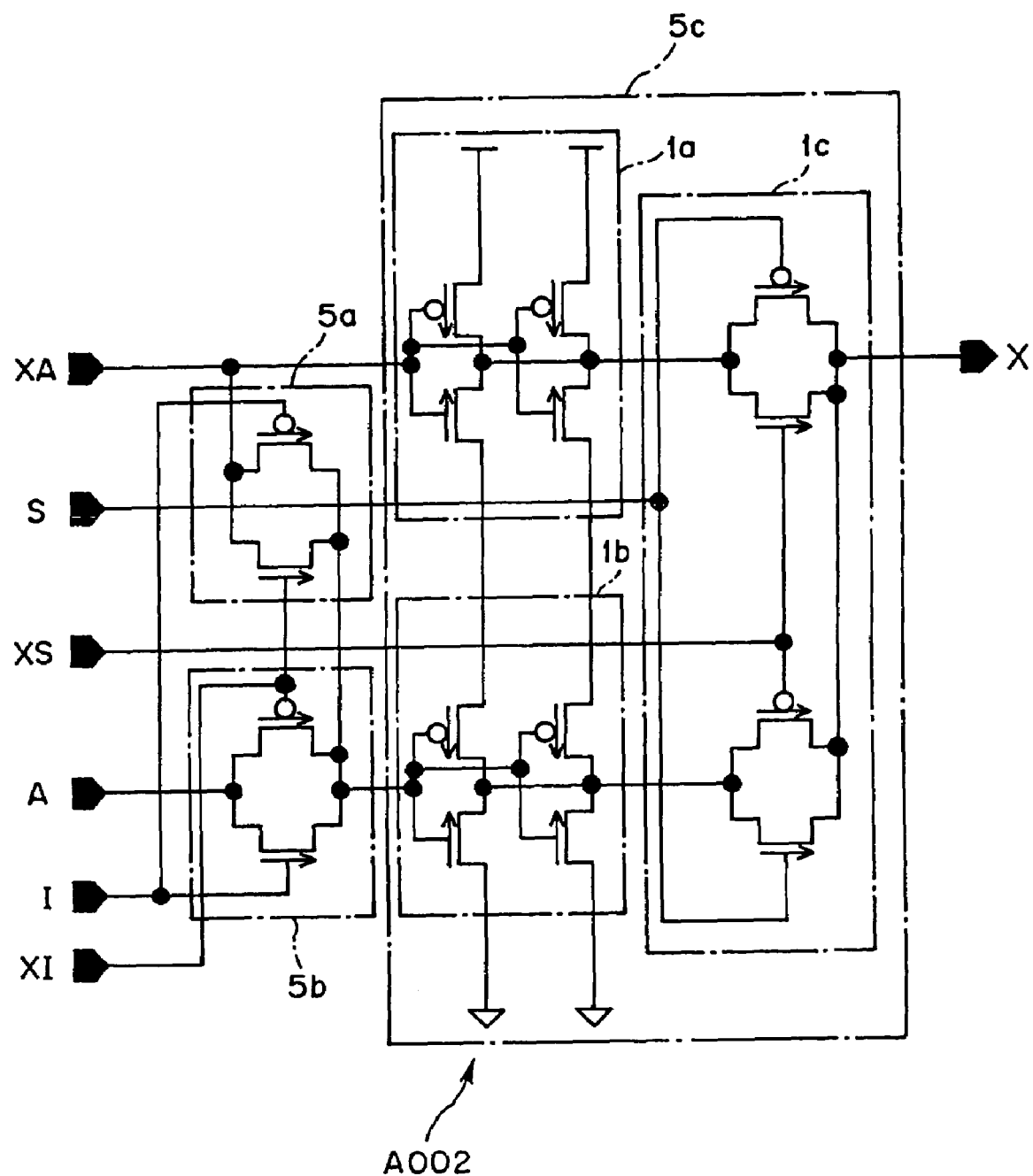
FIG. 20 is a block diagram showing a construction of a fifth leaf cell according to the embodiment of the present invention.

FIG. 20 is a block diagram showing a construction of a fifth leaf cell according to the embodiment of the present invention. Referring to FIG. 20, the cell A002 shown is a CMOS logic circuit for implementing the logic described below and includes a first switching section 5a, a second switching section 5b and a transmission section 5c. It is to be noted that, although reference symbols XA, S, XS, A, I and XI in FIG. 20 denote terminals, in the following description, they are sometimes used as signal names.

The first switching section 5a is provided on the input side of a first inversion section 1a in the transmission section 5c and can perform changing over of whether or not a first input signal XA is to be passed therethrough in accordance with external control signals I and XI. The first switching section 5a is formed from pair transistors. The second switching section 5b is provided on the input side of a second inversion section 1b in the transmission section 5c and can perform changing over of whether or not a second input signal A is to be passed therethrough in accordance with the external control signals I and XI. The second switching section 5b is formed from pair transistors. The transmission section 5c selectively outputs one of the outputs of the first switching section 5a and the second switching section 5b in accordance with a logic value which depends upon the externally controllable selection signal S and an inverted signal XS of the selection signal S. The transmission section 5c is formed from a cell LEOR described hereinabove. Subsequently, operation of the cell A002 is described with reference to a logical value table.

FIG. 21 is a view illustrating logical values of the cell A002. Referring to FIG. 21, when the control signals I and XI are I=0 and XI=1, the input signal A is outputted from the output terminal X, but when I=1 and XI=0, a logical exclusive OR value of the input signal A and the terminal S is outputted from the output terminal X. It is to be noted that, also with regard to the cell A002, it is inhibited to input the same logic value to the input terminals I and XI, the input terminals A and XA, and the input terminal S and XS similarly as in the cell A001.

Since the double inverters of the cell A002 are formed from CMOS logics in this manner, the cell A002 has an advantage that it operates at a high speed. Further, since the cell A002 has double inverters, the isolation between a circuit following the transmission section 5c and another circuit preceding to the cell A002 is strengthened. Furthermore, since the necessity for provision of an inverter circuit in a circuit preceding to the cell A002 is eliminated, there is an advantage that the circuit configuration can be simplified.

Figure 22:
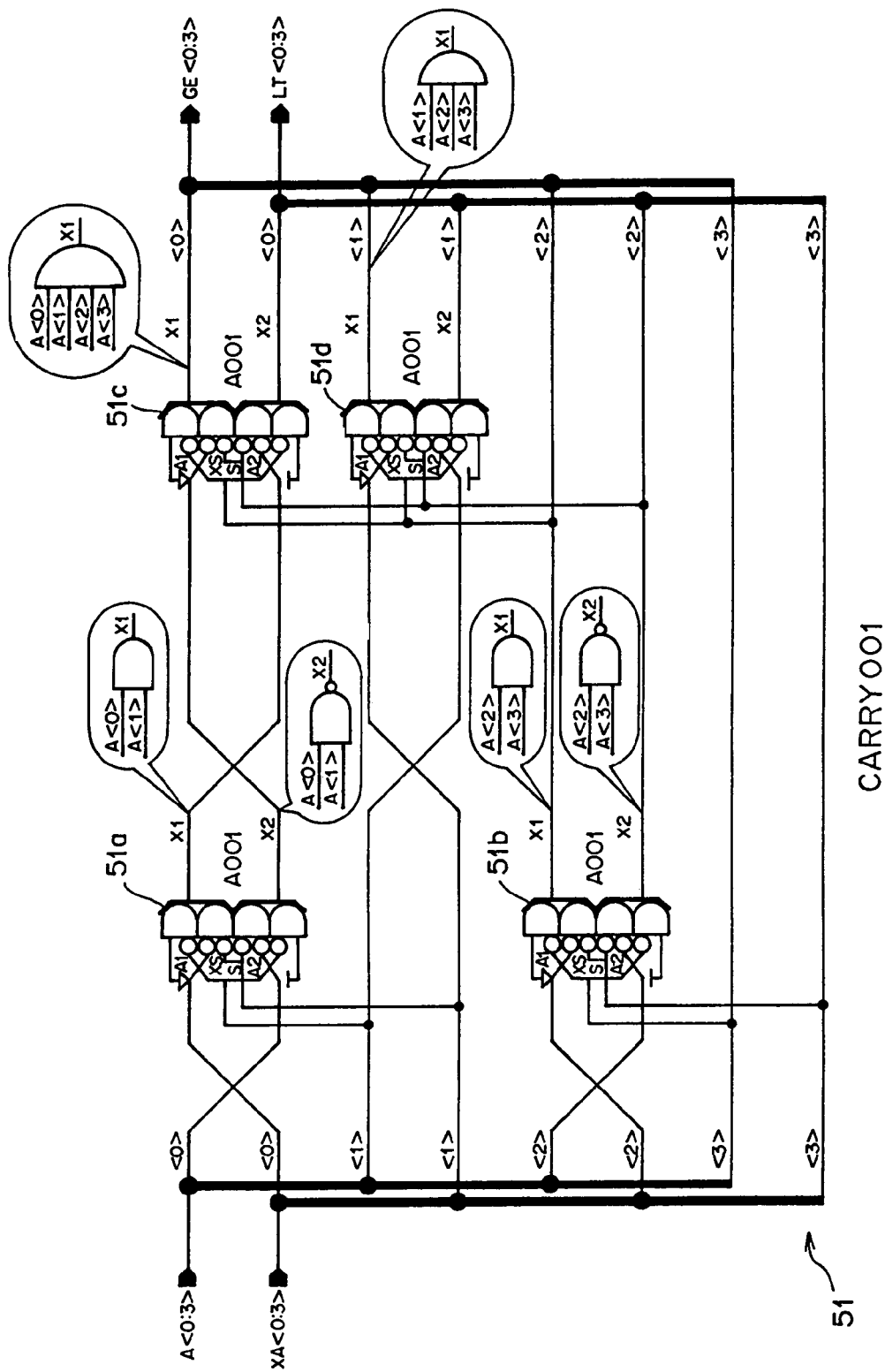
FIG. 22 is a block diagram showing a construction of a 4-bit carry generation circuit according to the embodiment of the present invention.

FIG. 22 is a block diagram showing a construction of a 4-bit carry generation circuit according to the embodiment of the present invention. Referring to FIG. 22, the 4-bit carry generation circuit (CARRY001) 51 shown is a CMOS logic circuit which receives a 4-bit signal A<0: 3> and an inverted signal XA<0:3> of the 4-bit signal A<0: 3> as input signals and outputs a carry GE<0: 3> from lower order bits appearing upon incrementing and an inverted value LT<0: 3> of the carry GE<0: 3>. The 4-bit carry generation circuit 51 is composed of a first logical AND generation section 51a, a second logical AND generation section 51b, a third logical AND generation section 51c and a fourth logical AND generation section 51d. It is to be noted that reference symbols A<0: 3>, XA<0: 3>, <0>, <1>, <2> and <3> denote different signals, and X1, X2, GE<0: 3> and LT<0: 3> denote different terminals.

The first logical AND generation section 51a receives the two high order bits A<0: 1> of the signal A<0: 3> and the two high order bits XA<0: 1> of the inverted signal XA<0: 3> as inputs thereto and outputs a first logical AND result (AND value of the bits A<0> and A<1>) and a first logical AND inversion result (NAND value of the bits A<0> and A<1>) as logical AND results of the two high order bits of the signal A<0: 3>. This function of the first logical AND generation section 51a is exhibited by the cell A001. Similarly, the second logical AND generation section 51*b* receives the two low order bits A<2: 3> of the signal A<0: 3> and the two low order bits XA<2: 3> of the inverted signal XA<0: 3> as inputs thereto and outputs a second logical AND result (AND value of the bits A<2> and A<3>) and a second logical AND inversion result (NAND value of the bits A<2> and A<3>) as logical AND results of the two low order bits of the signal A<0: 3>. Also this function of the second logical AND generation section 51*b* is exhibited by the cell A001.

The third logical AND generation section 51*c* receives the first logical AND result and the first logical AND inversion result as well as the second logical AND result and the second logical AND inversion result as inputs thereto and outputs a third logical AND result (AND value of the 4 bits A<0> to A<3>) and a third logical AND inversion result (NAND value of the 4 bits A<0> to A<3>) as logical AND results of the 4 bits of the signal A<0: 3>. This function of the third logical AND generation section 51*c* is exhibited by the cell A001. The fourth logical AND generation section 51*d* receives the bit A<1> and the inverted bit XA<1> as well as the third logical AND result and the third logical AND inversion result as inputs thereto and outputs a fourth logical AND result (AND value of the 3 bits A<1> to A<3>) and a fourth logical AND inversion result (NAND value of the 3 bits A<1> to A<3>) as logical AND results of the three high order bits of the signal A<0: 3>. This function of the fourth logical AND generation section 51*d* is exhibited by the cell A001. The 4-bit carry generation circuit 51 thus outputs the third logical AND result (AND value of the 4 bits A<0> to A<3>), the fourth logical AND result (AND value of the 3 bits A<1> to A<3>), the second logical AND result (AND value of the bits A<2> and A<3>) and the bit A<3> as a first gate signal of 4 bits, and outputs the third logical AND inversion result (NAND value of the 4 bits A<0> to A<3>), the fourth logical AND inversion result (NAND value of the 3 bits A<1> to A<3>), the second logical AND inversion result (NAND value of the bits A<2> and A<3>) and the bit XA<3> as a second gate signal of 4 bits.

Signal flows are described below with reference to FIG. 22. The first logical AND generation section 51*a* performs ANDing arithmetic of the bit A<0> and the bit A<1> and outputs a result of the ANDing arithmetic to the terminal X1 and further outputs an inverted value of the signal X1 to the terminal X2 (refer to the logical value table of FIG. 19). The second logical AND generation section 51*b* outputs an AND value of the bit A<2> and the bit A<3> to the terminal X1 and outputs an inverted value of the signal X1 to the terminal X2. Further, the third logical AND generation section 51*c* outputs an AND value of the logic value at the terminal X1 of the first logical AND generation section 51*a* and the logic value at the terminal X1 of the second logical AND generation section 51*b* to the terminal X1. Consequently, an AND value of the 4 bits A<0>, A<1>, A<2> and A<3> is outputted to the terminal X1. Simultaneously, an inverted value of the AND value X1 is outputted to the terminal X2. The fourth logical AND generation section 51*d* outputs an AND value of the logic value of the bit A<1> and the logic value at the terminal X1 of the second logical AND generation section 51*b* to the terminal X1. Consequently, an AND value of the 3 bits A<1>, A<2> and A<3> is outputted to the terminal X1. Thereupon, an inverted value of the AND value X1 is outputted to the terminal X2. Accordingly, the output signal GE<0: 3> and the output signal LT<0: 3> of the 4-bit carry generation circuit 51 exhibit the following logic values.

An AND value of all of the 4 bits of the signal A<0: 3> is outputted to the terminal GE<0>; an AND value of the 3 bits A<1: 3> is outputted to the terminal GE<1>; an AND value of the 2 bits A<2: 3> is outputted to the terminal GE<2>; and the value of the bit A<3> is outputted to the terminal GE<3>. Meanwhile, an inverted value of the AND value of all of the 4 bits of the signal A<0: 3> is outputted to the terminal LT<0>; an inverted value of the AND value of the 3 bits A<1: 3> is outputted to the terminal LT<1>; an inverted value of the AND value of the 2 bits A<2: 3> is outputted to the terminal LT<2>; and an inverted value of the value of the bit A<3> is outputted to the terminal LT<3>.

The 4-bit carry generation circuit 51 having the construction described above thus produces an AND value and a NAND value of the 4-bit signal A<0: 3> at a high speed and outputs the resulting values to the terminals GE<0: 3> and LE<0: 3>, respectively. Accordingly, since a carry (AND value of the bits A<0> to A<3>) necessary for counting up is delivered at a high speed to the next stage, for example, an increment circuit having a bit length longer than 4 bits can produce a carry, which appears as a result of addition of the four low order bits, at a high speed. Further, by expanding the circuit construction described above, a carry generation circuit of an N-bit length can be constructed.

Figure 23:
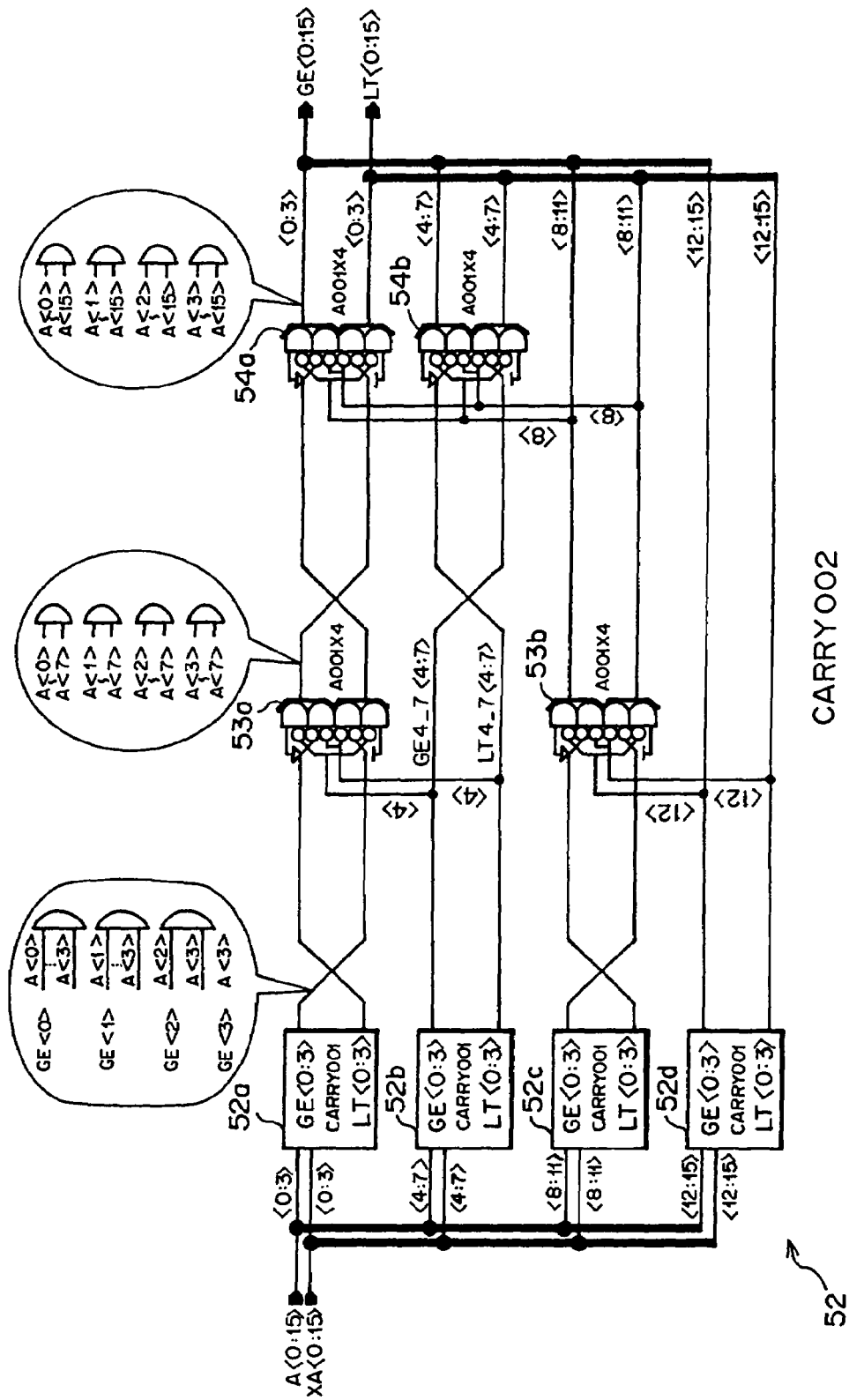
FIG. 23 is a block diagram showing a construction of a 16-bit carry generation circuit according to the embodiment of the present invention.

FIG. 23 is a block diagram showing a construction of a 16-bit carry generation circuit according to the embodiment of the present invention. Referring to FIG. 23, the 16-bit carry generation circuit (CARRY002) 52 shown is a CMOS logic circuit which receives a 16-bit signal A<0: 15> and an inverted signal XA<0: 15> of the signal A<0:15> and outputs a carry GE<0: 15> from low order bits, which appears as a result of incrementing, and an inverted value LT<0: 15> of the carry GE<0: 15>. The 16-bit carry generation circuit 52 includes a first carry generation section 52*a*, a second carry generation section 52*b*, a third carry generation section 52*c*, and a fourth carry generation section 52*d* as well as a first logical AND generation section 53*a*, a second logical AND generation section 53*b*, a third logical AND generation section 54*a* and a fourth logical AND generation section 54*b*. It is to be noted that reference symbols A<0:15>, XA<0:15>, <0: 3>, <4: 7>, <8: 11> and <12: 15> denote signals or terminals. Further, reference symbols A<0: 3>, XA<0: 3>, GE<0: 3> and LT<0: 3> in the CARRY002, A1, XS, S, A2, X1 and X2 in the cells A001 and GE<0: 15> and LT<0: 15> which are outputs of the 16-bit carry generation circuit 52 denote different terminals or signals.

The first carry generation section 52*a* receives a first input signal A<0: 15> of 16 bits and an inverted signal XA<0: 15> of the first input signal of 16 bits as inputs thereto and outputs an AND value at least of the bits A<0> to A<3> and an inverted value (NAND value) of the AND value as a first logical AND result and a first logical AND inversion result, respectively. The second carry generation section 52*b* outputs an AND value at least of the bits A<4> to A<7> and an inverted value of the AND value as a second logical AND result and a second logical AND inversion result, respectively. The third carry generation section 52*c* outputs an AND value at least of the bits A<8> to A<11> and an inverted value of the AND value as a third logical AND result and a third logical AND inversion result, respectively. The fourth carry generation section 52*d* outputs an AND value at least of the bits A<12> to A<15> and an inverted value of the AND value as a fourth logical AND result and a fourth logical AND inversion result, respectively. Each of the first carry generation section 52*a*, second carry generation section 52*b*, third carry generation section 52*c* and fourth carry generation section 52d is formed from a cell CARRY 001 described hereinabove.

The first logical AND generation section 53a produces from the first logical AND result and the second logical AND result and outputs a fifth logical AND result and a fifth logical AND inversion result as a result of an AND value at least of the bits A<0> to A<7>. The first logical AND generation section 53a is formed from four cells A001. The second logical AND generation section 53b produces from the third logical AND result and the fourth logical AND result and outputs a sixth logical AND result and a sixth logical AND inversion result as a result of an AND value at least of the bits A<8> to A<15>. The second logical AND generation section 53b is formed from four cells A001. The third logical AND generation section 54a produces from the fifth logical AND result, the fifth logical AND inversion result, the sixth logical AND result and the sixth logical AND inversion result and outputs a seventh logical AND result and a seventh logical AND inversion result as a result of an AND value at least of the bits A<0> to A<15>. The third logical AND generation section 54a is formed from four cells A001. The fourth logical AND generation section 54b produces from the second logical AND result, the second logical AND inversion result, the sixth logical AND result and the sixth logical AND inversion result and outputs an eighth logical AND result and an eighth logical AND inversion result as a result of an AND value at least of the bits A<4> to A<15>. The fourth logical AND generation section 54b is formed from four cells A001.

Thus, the 16-bit carry generation circuit 52 outputs the seventh logical AND result, the eighth logical AND result, the sixth logical AND result and the fourth logical AND result as a first gate signal of 16 bits, and outputs the seventh logical AND inversion result, the eighth logical AND inversion result, the sixth logical AND inversion result and the fourth logical AND result as a second gate signal of 16 bits.

Signal flows are described below with reference to FIG. 23. The first carry generation section 52a outputs an AND value of all of the 4 bits A<0: 3> to the terminal GE<0>, outputs an AND value of the 3 bits A<1: 3> to the terminal GE<1>, outputs an AND value of the 2 bits A<2: 3> to the terminal GE<2>, and outputs the value of the bit A<3> to the terminal GE<3>. The second carry generation section 52b outputs an AND value of all of the 4 bits A<4: 7> to the terminal GE<0>, outputs an AND value of the 3 bits A<5: 7> to the terminal GE<1>, outputs an AND value of the 2 bits A<6: 7> to the terminal GE<2>, and outputs the value of the bit A<7> to the terminal GE<3>. Similarly, the third carry generation section 52c outputs an AND value of all of the 4 bits A<8: 11> to the terminal GE<0>, outputs an AND value of the 3 bits A<9: 11> to the terminal GE<1>, outputs an AND value of the 2 bits A<10: 11> to the terminal GE<2>, and outputs the value of the bit A<11> to the terminal GE<3>. The fourth carry generation section 52d outputs an AND value of all of the 4 bits A<12: 15> to the terminal GE<0>, outputs an AND value of the 3 bits A<13: 15> to the terminal GE<1>, outputs an AND value of the 2 bits A<14: 15> to the terminal GE<2>, and outputs the value of the bit A<15> to the terminal GE<3>.

Further, the first logical AND generation section 53a receives the signals GE<0> to GE<3> of the first carry generation section 52a and the signal GE<4> from the second carry generation section 52b as inputs thereto. The signal GE<4> is an AND value of the bits A<4> to A<7>. Accordingly, the four cells A001 of the first logical AND generation section 53a output four kinds of logical values including an AND value of the bits A<0> to A<7>, an AND value of the bits A<1> to A<7>, an AND value of the bits A<2> to A<7> and an AND value of the bits A<3> to A<7> to the output terminals X1. Similarly, the second logical AND generation section 53b receives the signals GE<0> to GE<3> of the third carry generation section 52c and the signal GE<12> from the fourth carry generation section 52d as inputs thereto. The signal GE<12> is an AND value of the bits A<12> to A<15>. Accordingly, the four cells A001 of the second logical AND generation section 53b output four kinds of logical values including an AND value of the bits A<8> to A<15>, an AND value of the bits A<9> to A<15>, an AND value of the bits A<10> to A<15> and an AND value of the bits A<11> to A<15> to the output terminals X1.

Further, the third logical AND generation section 54a receives an AND value of the bits A<0> to A<7> at the terminal A2 thereof and receives the signal GE<8> at the terminal XS thereof. The signal GE<8> is an AND value of the bits A<8> to A<15>. Accordingly, the four cells A001 of the third logical AND generation section 54a output four kinds of logical values including an AND value of the bits A<0> to A<15>, an AND value of the bits A<1> to A<15>, an AND value of the bits A<2> to A<15> and an AND value of the bits A<3> to A<15> to the output terminals X1. The fourth logical AND generation section 54b receives an AND value of the bits A<4> to A<7> at the terminal A2 thereof and receives the signal GE<8> at the terminal XS thereof. The signal GE<8> is an AND value of the bits A<8> to A<15>. Accordingly, the four cells A001 of the fourth logical AND generation section 54b output four kinds of logical values including an AND value of the bits A<4> to A<15>, an AND value of the bits A<5> to A<15>, an AND value of the bits A<6> to A<15> and an AND value of the bits A<7> to A<15> to the output terminals From the foregoing, the output terminals GE<0:15> and LT<0:15> of the 16-bit carry generation circuit 52 exhibit the following logical values. In particular, the signal GE<0> is an AND value of all of the 16 bits A<0: 15>, and the signal LT<0> is an inverted value of the AND value of all of the 16 bits A<0: 15>; the signal GE<1> is an AND value of the 15 bits A<1: 15>, and the signal LT<1> is an inverted value of the AND value of the 15 bits A<1: 15>; . . . ; and the signal GE<14> is an AND value of the 2 bits A<14: 15>, and the signal LT<14> is an inverted value of the AND value of the 2 bits A<14: 15>. The signal GE<15> is a value of the bit A<15>, and the signal LT<1> is an inverted value of the value of the bit A<15>.

The 16-bit carry generation circuit 52 having the construction described above produces an AND value and a NAND value of the 16-bit signal A<0: 15> at a high speed and outputs the resulting values to the terminals GE<0: 15> and LE<0: 15>. Accordingly, since a carry (AND value of the bits A<0> to A<15>) necessary for counting up is successively delivered at a high speed to the next stage, for example, an increment circuit having a bit length longer than 16 bits can produce a carry, which appears as a result of addition of the 16 low order bits, at a high speed.

In this manner, the 16-bit carry generation circuit 52 is formed only from 4-bit carry generation circuits (52a, 52b, 52c and 52d) and cells A001 (53a, 53b, 54a and 54b), and repetitiveness of wiring patterns can be increased and the expandability can be raised. In other words, the 16-bit carry generation circuit 52 is advantageous in that it can be expanded to a carry generation circuit of N bits and the man-hours for circuit designing can be reduced significantly.

An increment circuit can be formed using such 16-bit carry generation circuit (CARRY002), cell A001 and cell A002 as described above. It is to be noted that a carry generation circuit of a universal bit length $n_3$ can be formed. The bit number $n_3$ is an integer equal to 2 to the $m_3$th power (here $m_3$ is an even number equal to or greater than 2). Thus, an increment circuit of the bit length $n_3$ where $n_3$ is $n_3$=64 is described below.

Figure 24:
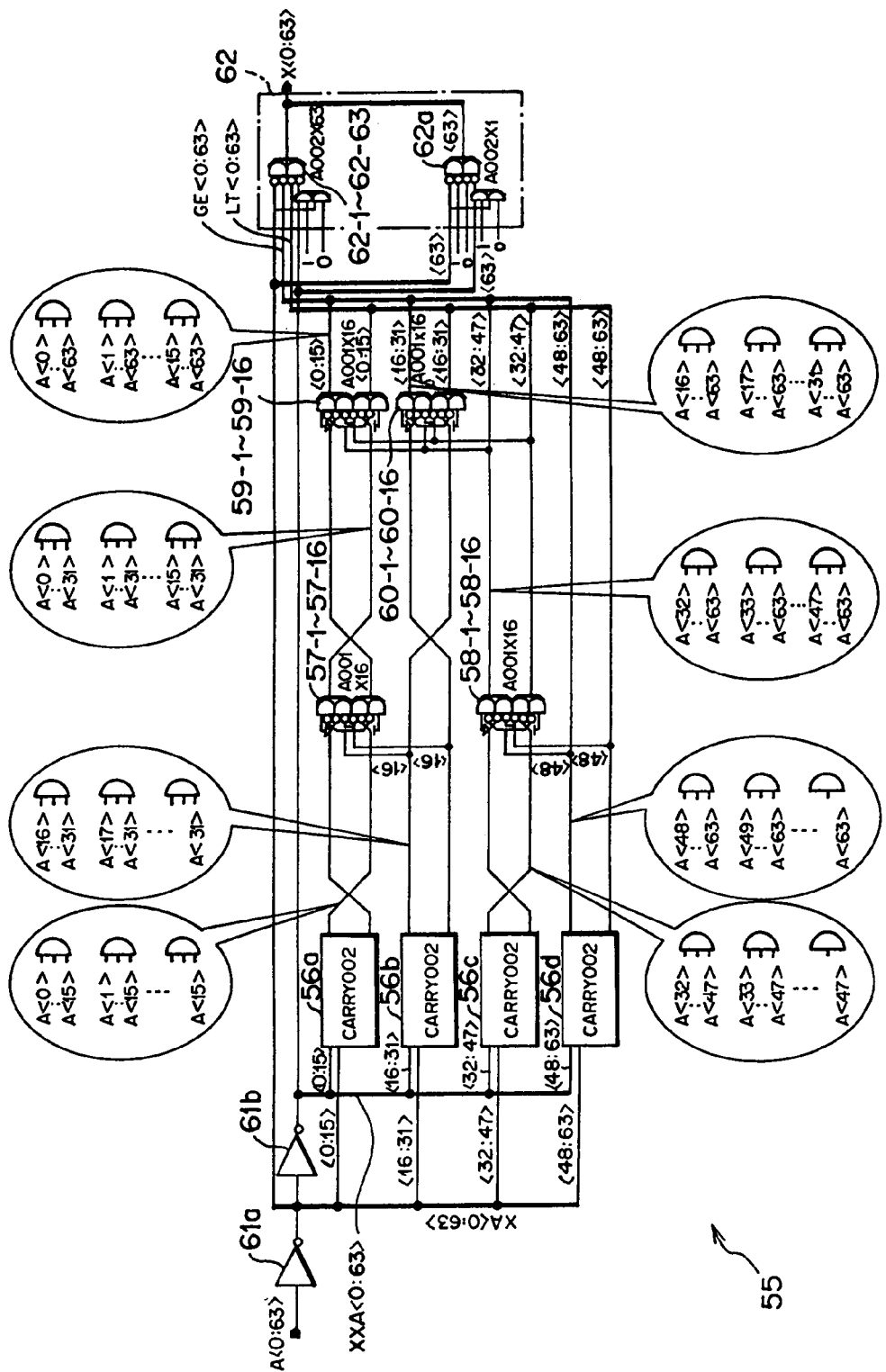
FIG. 24 is a block diagram showing a construction of a 64-bit increment circuit according to the embodiment of the present invention.

FIG. 24 is a block diagram showing a construction of a 64-bit increment circuit according to the embodiment of the present invention. Referring to FIG. 24, the 64-bit increment circuit 55 shown is a CMOS logic circuit for use with, for example, a command register for a processor and so forth and includes a pair of inverters 61a and 61b, a first carry generation section 56a, a second carry generation section 56b, a third carry generation section 56c, a fourth carry generation section 56d, a first logical AND generation section 57, a second logical AND generation section 58, a third logical AND generation section 59, and a fourth logical AND generation section 60 as well as a full addition arithmetic section 62.

It is to be noted that reference symbol A<0:63> on the input side shown in FIG. 24 is a signal name, and A and X of the inverters 61a and 61b are signal names. Further, reference symbols XA<0: 63> and XXA<0: 63> as well as <0: 15>, <16: 31>, <32: 47> and <48: 63> connected to the outputs of the inverters 61a and 61b are signal names. Meanwhile, reference symbols A<0: 15>, XA<0: 15>, GE<0: 15> and LT<0: 15> in the CARRY002, A1, XS, S, A2, X1 and X2 in the cell A001 and GE<0: 15> and LT<0: 15> which are outputs of the 16-bit carry generation circuit 52 denote terminals. It is to be noted that the first logical AND generation section 57, the second logical AND generation section 58, the third logical AND section 59 and reference symbols <16>, GE16–31<16: 31>, <48> and <32> on the input side of the fourth logical AND generation section 60 and <0: 62>, <1: 63> and <63> on the input side of the full addition arithmetic section 62 denote signals. Further, reference symbols XA, S, XS, A, I, XI and X in the full addition arithmetic section 62 denote terminals, and <0: 62> and <63> on the output sides of them denote signals.

Each of the inverters 61a and 61b outputs an inverted logical value of an inputted logic value and is formed from such an inverter as may be selected, for example, from within a standard library provided in a circuit designing tool. The first carry generation section 56a receives a first input signal A<0: 63> of 64 bits and an inverted signal XA<0: 63> of the first input signal of 64 bits as input signals and outputs a first logical AND result and a first logical AND inversion result as a logical AND result at least of the bits A<0> to A<15> from the signals A<0: 15> and XA<0: 15>. The first carry generation section 56a is formed from a 16-bit carry generation circuit (CARRY002) shown in FIG. 23. Similarly, the second carry generation section 56b produces from the bits A<16: 31> and XA<16: 31> and outputs a second logical AND result and a second logical AND inversion result as a logical AND result at least of the bits A<16> to A<31>; the third carry generation section 56c produces from the bits A<32: 47> and XA<32: 47> and outputs a third logical AND result and a third logical AND inversion result as a logical AND result at least of the bits A<32> to A<47>; and the fourth carry generation section 56d produces from the bits A<48: 63> and XA<48: 63> and outputs a fourth logical AND result and a fourth logical AND inversion result as a logical AND result at least of the bits A<48> to A<63>. Each of the carry generation sections 56a, 56b and 56c is formed from a 16-bit carry generation circuit (CARRY002).

The first logical AND generation section 57 receives the first logical AND result and the first logical AND inversion result as well as the second logical AND result and the second logical AND inversion result as inputs and outputs a fifth logical AND result and a fifth logical AND inversion result at least of the bits A<0> to A<31>. The first logical AND generation section 57 is composed of 16 cells A001 (denoted by 57-1 to 57-16). Similarly, the second logical AND generation section 58 receives the third logical AND result and the third logical AND inversion result as well as the fourth logical AND result and the fourth logical AND inversion result as inputs and outputs a sixth logical AND result and a sixth logical AND inversion result at least of the bits A<32> to A<47>. The second logical AND generation section 58 is composed of 16 cells A001 (denoted by 58-1 to 58-16). The third logical AND generation section 59 produces from the fifth logical AND result and the fifth logical AND inversion result as well as the sixth logical AND result and the sixth logical AND inversion result and outputs a seventh logical AND result and a seventh logical AND inversion result as a logical AND result at least of the bits A<0> to A<63>. The third logical AND generation section 59 is composed of 16 cells A001 (denoted by 59-1 to 59-16). The fourth logical AND generation section 60 produces from the second logical AND result and the second logical AND inversion result as well as the sixth logical AND result and the sixth logical AND inversion result and outputs an eighth logical AND result and an eighth logical AND inversion result as a logical AND result at least of the bits A<16> to A<63>. The fourth logical AND generation section 60 is composed of 16 cells A001 (denoted by 60-1 to 60-16).

The full addition arithmetic section 62 produces from a first gate signal of 64 bits composed of the seventh logical AND result, the eighth logical AND result, the sixth logical AND result and the fourth logical AND result and a second gate signal of 64 bits composed of the seventh logical AND inversion result, the eighth logical AND inversion result, the sixth logical AND inversion result and the fourth logical AND inversion result and outputs a full addition arithmetic result of 64 bits. The full addition arithmetic section 62 is formed from 63 cells A002 (denoted by 62-1 to 62-63).

In the 64-bit increment circuit 55 described above, an input signal A<0: 63> is inverted by the inverter 61a to produce an inverted signal XA<0: 63> and then is inverted by the inverter 61b again to obtain a signal XXA<0: 63> (that is, the signal A<0: 63>). From within the signals A<0: 63> and XA<0: 63>, the bits A<0: 15> and XA<0: 15> are inputted to the first carry generation section 56a. Similarly, the bits A<16: 31> and XA<16: 31> are inputted to the second carry generation section 56b; the bits A<32: 47> and XA<32: 47> are inputted to the third carry generation section 56c; and the bits A<48: 63> and XA<48: 63> are inputted to the fourth carry generation section 56d. Of the outputs of the first carry generation section 56a, at the output GE<0>, an AND value of the 16 bits A<0: 15> appears; at the output GE<1>, an AND value of the 15 bits A<1: 15> appears; . . . ; at the output GE<14>, an AND value of the 2 bits A<14: 15> appears; and at the output GE<15>, the bit value of the bit A<15> appears. Similarly, of the outputs of the second carry generation section 56b, at the output GE<0>, an AND value of the 16 bits A<16: 31> appears; at the output GE<1>, an AND value of the 15 bits A<17: 31> appears; . . . ; at the output GE<14>, an AND value of the 2 bits A<30: 31> appears; and at the output GE<15>, the bit value of the bit A<31> appears. Of the outputs of the third carry generation section 56c, at the output GE<0>, an AND value of the 16 bits A<32: 47> appears; at the output GE<1>, an AND value of the 15 bits A<33: 47> appears; . . . ; at the output GE<14>, an AND value of the 2 bits A<46: 47> appears; and at the output GE<15>, the bit value of the bit A<47> appears. Of the outputs of the fourth carry generation section 56d, at the output GE<0>, an AND value of the 16 bits A<48: 63> appears; at the output GE<1>, an AND value of the 15 bits A<49: 63> appears; . . . ; at the output GE<14>, an AND value of the 2 bits A<62: 63> appears; and at the output GE<15>, the bit value of the bit A<63> appears.

Then, the first logical AND generation section 57 (cells 57-1 to 57-16) and the second logical AND generation section 58 (cells 58-1 to 58-16) merge the outputs of the first carry generation section 56a and the outputs of the second carry generation section 56b. Thus, an AND value of the 32 bits A<0: 31> is outputted to the output X1 of the cell A001 (denoted by 57-1); an AND value of the 31 bits A<1: 31> is outputted to the output X1 of the cell A001 (denoted by 57-2); . . . ; and an AND value of the 17 bits A<15: 31> is outputted to the output X1 of the cell A001 (denoted by 57-16). Meanwhile, an AND value of the 32 bits A<32: 63> is outputted to the output X1 of the cell A001 (denoted by 58-1); an AND value of the 31 bits A<33: 63> is outputted to the output X1 of the cell A001 (denoted by 58-2); . . . ; and an AND value of the 17 bits A<47: 63> is outputted to the output X1 of the cell A001 (denoted by 58-16).

Further, the third logical AND generation section 59 (cells 59-1 to 59-16) and the fourth logical AND generation section 60 (cells 60-1 to 60-16) merge the outputs of the second logical AND generation section 57 and the outputs of the third logical AND generation section 58. Consequently, an AND value of the 64 bits <0: 63> is outputted to the output X1 of the cell A001 (denoted by 59-1); an AND value of the 63 bits <1: 63> is outputted to the output X1 of the cell A001 (denoted by 59-2); . . . , and an AND value of the 49 bits <15:63> is outputted to the output X1 of the cell A001 (denoted by 59-16). An AND value of the 48 bits <16: 63> is outputted to the output X1 of the cell A001 (denoted by 60-1); an AND value of the 47 bits <17: 63> is outputted to the output X1 of the cell A001 (denoted by 60-2); . . . , and an AND value of the 33 bits <31: 63> is outputted to the output X1 of the cell A001 (denoted by 60-16). In this manner, an AND value of all of the 64 bits A<0: 63> appears at the output GE<0> and an inverted value of the AND value of all of the 64 bits A<0: 63> appears at the output LT<0>; an AND value of all of the 63 bits A<1: 63> appears at the output GE<1> and an inverted value of the AND value of all of the 63 bits A<1: 63> appears at the output LT<1>; . . . ; an AND value of all of the 2 bits A<62: 63> appears at the output GE<14> and an inverted value of the AND value of all of the 2 bits A<62: 63> appears at the output LT<14>; and the value of the bit A<63> appears at the output GE<15> and an inverted value of the value of the bit A<63> appears at the output LT<15>.

The signals in which the carries of the low order bits are merged are logically exclusively ORed by the full addition arithmetic section 62. In particular, the original data A<0: 62> and the carry GE<1: 63> are logically exclusively ORed. More particularly, the cell A002 (denoted by 62-1) logically exclusively ORs the highest order bit A<0> and the carry GE<1> from the figure next to it and outputs a result of full addition arithmetic. Here, the logical value 1 is inputted to the terminal I of the cell A002 and the logical value 0 is inputted to the terminal X1 of the cell A002 so that the cell A002 may perform logical exclusive ORing arithmetic between the input signal S and the input signal A (refer to the logical value table of FIG. 21). Similarly, the cell A002 (denoted by 62-1) logically exclusively ORs the bit A<1> and the carry GE<2> from the figure next to it and outputs a result of full addition arithmetic; . . . ; and the cell A002 (denoted by 62-63) logically exclusively ORs the bit A<62> and the carry GE<63> from the lowest figure and outputs a result of full addition arithmetic. It is to be noted that arithmetic processing in the lowest figure is performed by the cell A002 (denoted by 62a). A result of incrementing with the input signal A<0: 63> appears at the output X<0: 63> of the full addition arithmetic section 62.

The 64-bit increment circuit 55 having such a construction as described above performs an incrementing operation. In particular, where the input to the increment circuit is A<0: 63>, the output of the increment circuit is X<0: 63>, the bit 0 is the highest order bit and the bit 63 is the lowest order bit, the value X<K> of the bit K ($0 \leq K < 63$) of the output X is determined as a logical exclusive OR of the bit A<K> and a carry GE<K+1> brought there from the lower order bits as a result of incrementing. Here, the carry GE<K+1> is an AND value of all of the bits A<K+1: 63>.

Since the 64-bit increment circuit 55 is formed from leaf cells of 16-bit carry generation circuits (CARRY002), cells A001 and cells A002 in this manner, the expandability is utilized. Further, since the 64-bit increment circuit 55 is simple in circuit configuration, a designer can design a circuit which is simple and efficient. Consequently, the layout man-hours upon development can be reduced significantly and the development man-hours can be reduced significantly. Further, since the number of parts can be suppressed, the time required for tuning of parts is reduced significantly when compared with a circuit which includes many parts. Further, since the same leaf cells can be used, the 64-bit increment circuit 55 is advantageous in that it contributes to augmentation of the yield and so forth upon production. Furthermore, since two kinds of signals of a regular phase signal and an inverted phase signal are normally produced and used in the inside of each of the leaf cells, there is an advantage that the entire circuit operates at a high speed.

Further, it is possible to add another adder circuit to the 64-bit increment circuit 55 to form an adder circuit of the 68+4-bit length. The "adder circuit of the 68+4-bit length" is a circuit which receives two kinds of signals including a 68-bit signal and a 4-bit signal as inputs thereto and performs addition arithmetic between the four low order bits of the 68-bit signal and the 4-bit signal. A value which corresponds to a command operand is placed in the four low order bits, and the value normally varies.

Figure 25:
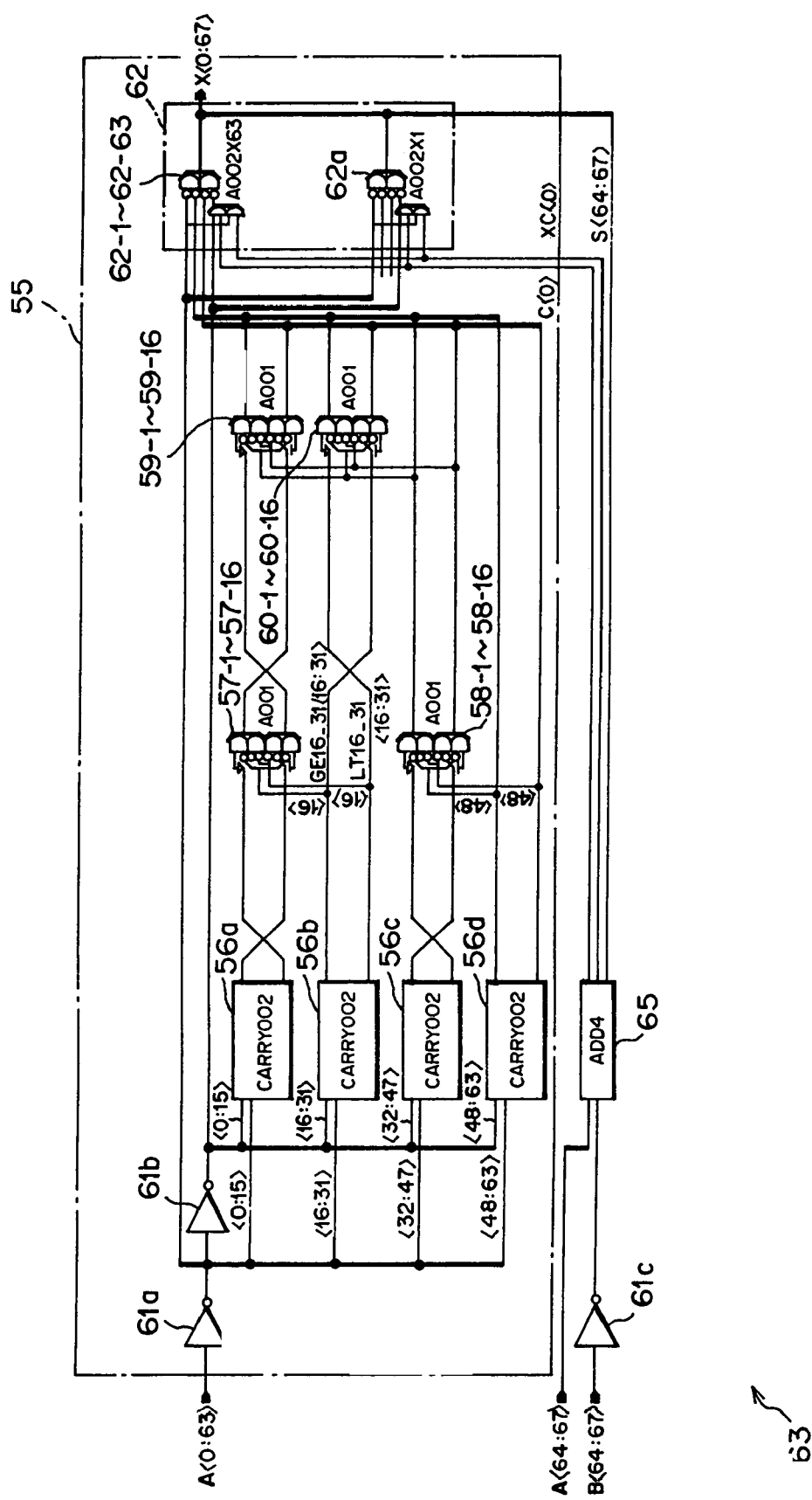
FIG. 25 is a block diagram showing a construction of a 68+bit+4-bit adder circuit according to the embodiment of the present invention.
Figure 26:
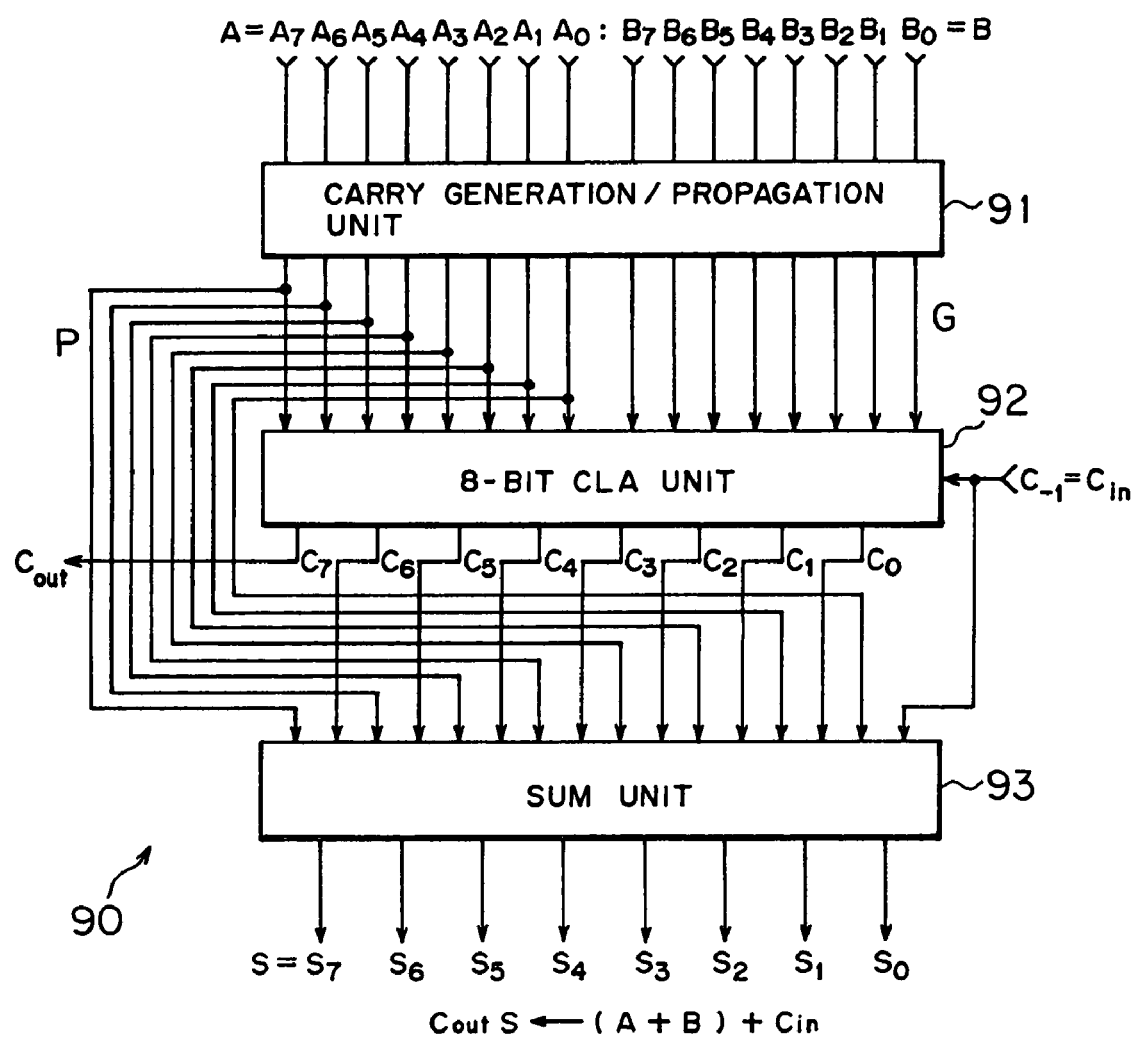
FIG. 26 is a block diagram showing an example of a functional block of an 8-bit look-ahead carry full adder circuit.
Figure 27:
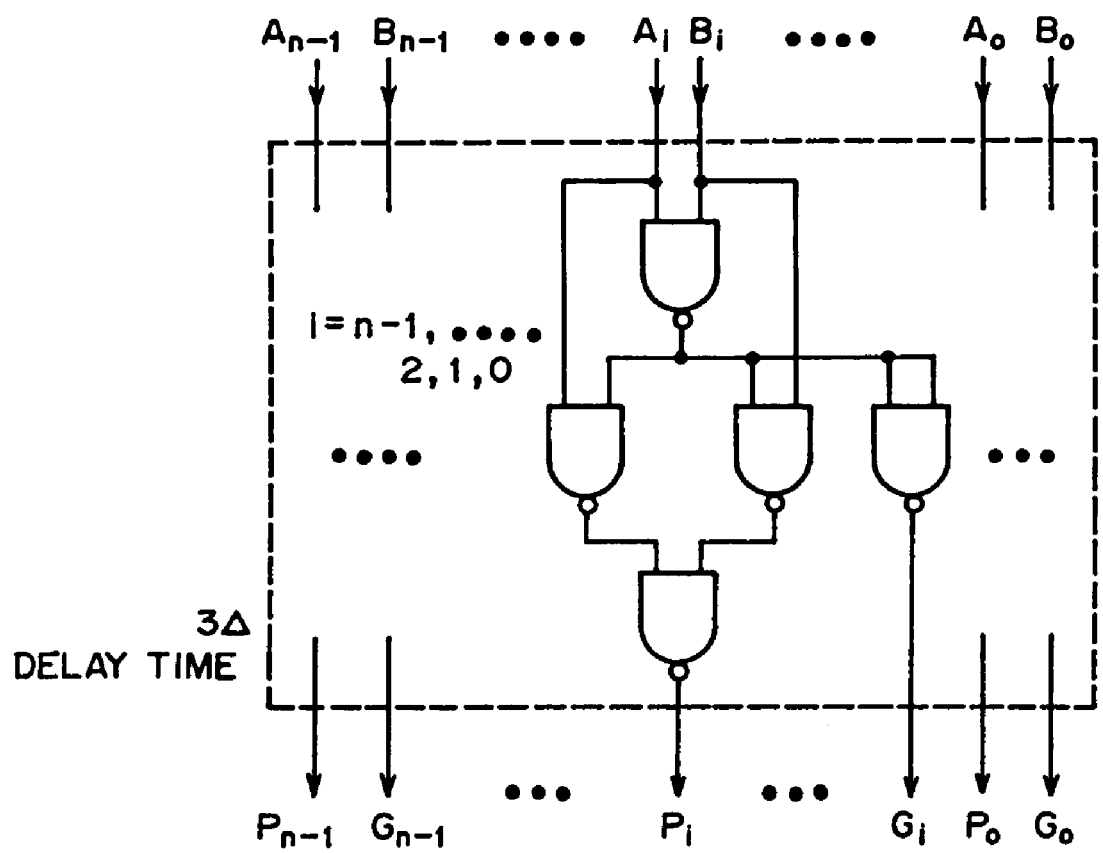
FIG. 27 is a block diagram showing a detailed construction of a carry generation/propagation unit.
Figure 28:
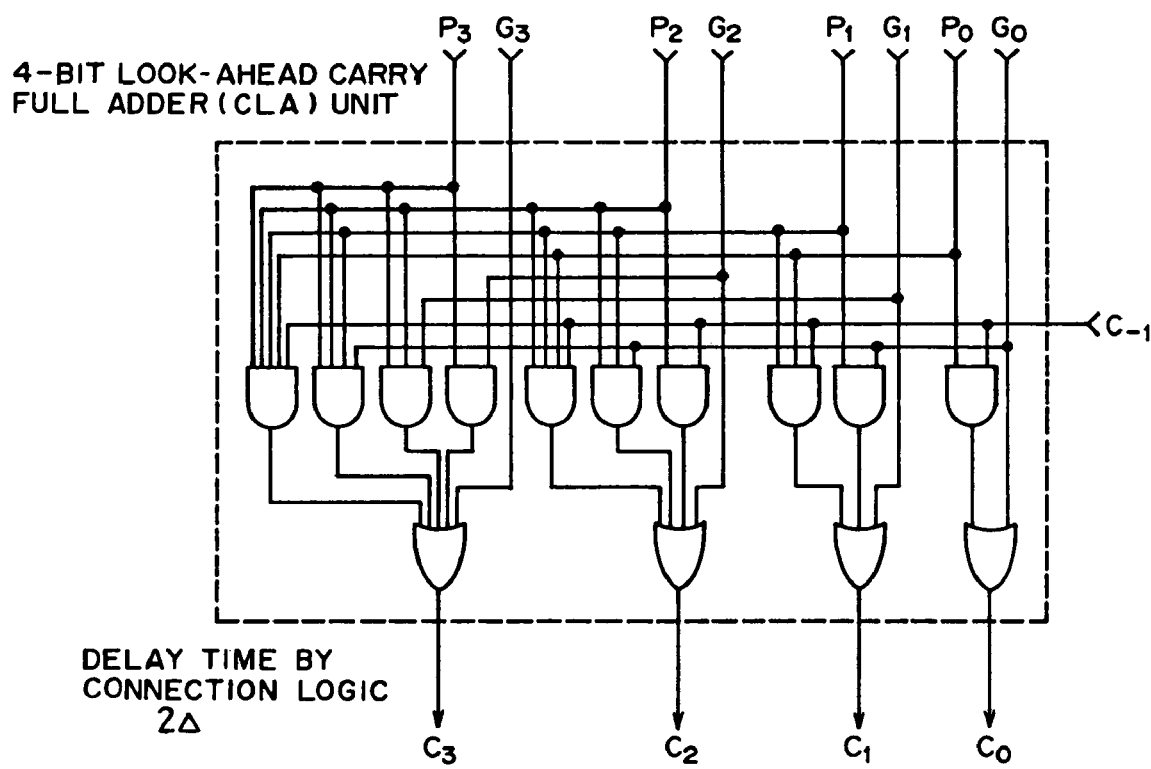
FIG. 28 is a block diagram showing a general construction of a 4-bit CLA unit.
Figure 29:
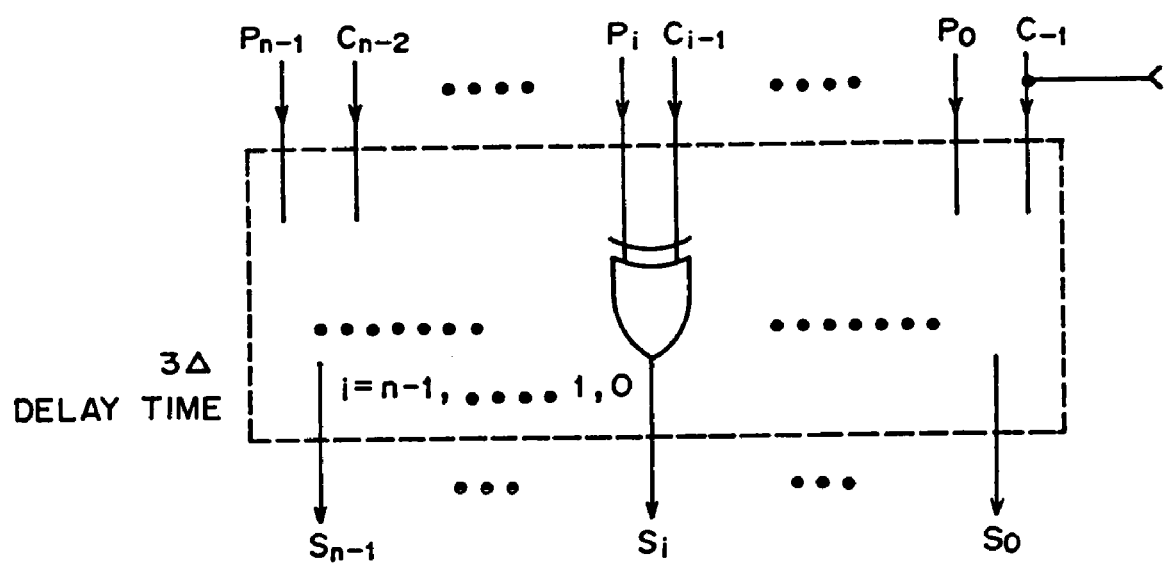
FIG. 29 is a block diagram showing details of a sum unit.
Figure 30:
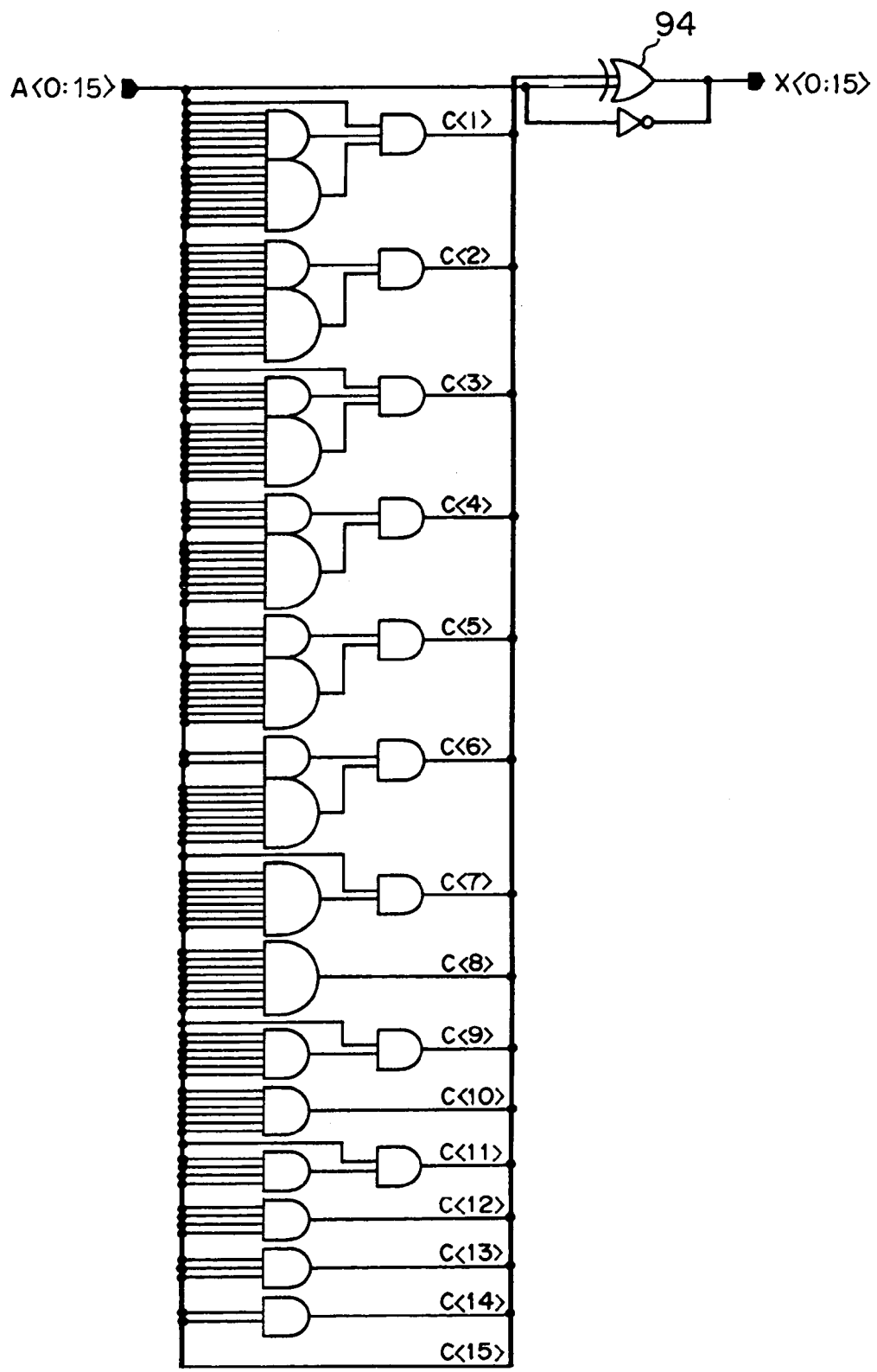
FIG. 30 is a block diagram showing a construction of a 16-bit increment circuit in which a multi-input AND gate is used.

FIG. 25 is a block diagram showing a construction of a 68-bit+4-bit adder circuit according to the embodiment of the present invention. Referring to FIG. 25, the 68-bit+4-bit adder circuit (68-bit+4-bit ADDER) 63 is an adder circuit which performs full addition arithmetic of an input signal A<0: 67> of 68 (64+4) bits and another input signal B<64: 67> of 4 bits, and is composed of a 64-bit increment circuit 55, an inverter 61c and a 4-bit full adder circuit 65.

It is to be noted that reference symbols A<0: 63>, A<64: 67> and B<64: 67> are signal names, and A and X of the inverter 61c denote an input terminal and an output terminal, respectively. Further, reference symbols A<0: 3>, XB<0: 3>, C<0>, XC<0> and S<0: 3> of the 4-bit full adder circuit 65 denote signals (or terminals). It is to be noted that reference symbols applied to the 64-bit increment circuit 55 are similar to those described hereinabove, and therefore, overlapping description of them is omitted here.

The inverter 61c inverts the input signal <64: 67> and outputs the inverted signal. The inverter 61c is formed from such an inverter as may be selected, for example, from within a standard library provided in a circuit designing tool. The 4-bit full adder circuit 65 performs full addition arithmetic of the four low order bits of the input signal A<0: 67> and the 4 bits from the inverter 61*c* and inputs a resulting carry generation signal C<0> to the full addition arithmetic section 62 of the 64-bit increment circuit 55. The 4-bit full adder circuit 65 is formed from a 4-bit full adder circuit (IADD4) described hereinabove. The carry generation signal C<0> is inputted to the input terminals I of the 63 cells A002 (denoted by 62-1 to 62-63) in the full addition arithmetic section 62 and the input terminal I of the cell A002 (denoted by 62*a*). Also an inverted signal XC<0> of the carry generation signal C<0> is inputted to the input terminals XI of the pertaining cells A002 similarly. It is to be noted that the 4-bit full adder circuit 65 may be formed from such an adder circuit which is selected, for example, from within a standard library provided in a circuit designing tool.

Flows of the input signals A<64: 67> and B<64: 67> in the 68-bit+4-bit adder circuit 63 described above are described below with reference to FIG. 25. First, the 4-bit full adder circuit 65 performs full addition arithmetic of the bits A<64: 67> and bits XB<64: 67> inverted by the inverter 61*c*, and a carry generation signal C<0> which thereupon appears from the 4-bit full adder circuit 65 is inputted to the cell A002 (denoted by 62-63) in the full addition arithmetic section 62. If the carry from the 4-bit full adder circuit 65 is 0, then the cell A002 receives 0 at the terminal I thereof and receives 1 at the terminal XI thereof, and consequently, the bits A<0: 63> are outputted as they are to the output terminal X<0: 63> of the cell A002. On the other hand, if the carry from the 4-bit full adder circuit 65 is 1, then the cell A002 receives 1 at the terminal I thereof and receives 0 at the terminal XI thereof, and consequently, a value equal to a sum of the bits A<0: 63> and 1 appears at the output terminal X<0: 63> of the cell A002.

In the 68-bit+4-bit adder circuit 63 having the construction described above, the carry C<0> which is a result of addition of the four low order bits A<64: 67> of the signal A<0: 67> and the bits <64: 67> is delivered to the lowest order bit A<63> of the bits A<0: 63> while a result of addition of the four lower order bits A<64: 67> and the bits B<64: 67> is obtained. Further, in each of the cells A002 in the full addition arithmetic section 62, logical exclusive ORing of a half addition arithmetic result at each of the 64 higher order figures and a carry brought there from the lower order figures is executed, and a full addition arithmetic result of the 64 higher order figures is outputted. Then, the 68-bit+4-bit adder circuit 63 outputs the outputs of the 64-bit increment circuit 55 as values of the 64 higher order figures and outputs the outputs of the 4-bit full adder circuit 65 as values of the four lower order figures.

In this manner, the full adder circuit of 64+4 bits is composed of the 64-bit increment circuit 55 and the 4-bit full adder circuit 65, and a terminal for a carry generation signal of the 4-bit full adder circuit 65 is connected to the terminal I of the cell A002 in the 64-bit increment circuit 55 while a terminal for an inverted signal of the carry generation signal is connected to the terminal XI of the cell A002. Further, since the full adder circuit has increased repetitiveness of wiring lines, the circuit configuration is simplified. Consequently, the full adder circuit is advantageous in that the man-hours for layout upon development can be reduced significantly and the period for development can be reduced significantly. Furthermore, since the number of parts can be suppressed and the expandability is raised, there is another advantage that the time required for tuning of parts is reduced significantly when compared with a circuit which includes many parts. Besides, since the component circuits described above are formed from leaf cells A001 and A002 and two kinds of signals of a regular phase signal and an inverted phase signal are normally produced in each of the leaf cells as described hereinabove, there is an advantage that high speed circuit operation can be achieved.

Further, since the bit number can be expanded in such a manner as described above, an $n_3$-bit increment circuit can be constructed and a universal (N+M)-bit+M-bit adder circuit (N and M are natural numbers) can be constructed.

It is to be noted that the positive and negative signs of the logical values appearing on the cells, the circuits and the logical value tables described hereinabove are mere examples, and inverted logical values of them may be used instead.

B. In connection with the foregoing description, the following items (1) to (6) are disclosed.

(1) A CMOS logic circuit of the present invention comprises a first carry generation section for receiving a first input signal of 4 bits and a second input signal of 4 bits, performing comparison of them in magnitude for each bit and outputting results of the comparison of the individual bits as a first comparison result, a second comparison result, a third comparison result and a fourth comparison result using a plurality of status signals, a second carry generation section for performing comparison in magnitude between two high order bits of the first input signal and two high order bits of the second input signal from the first comparison result and the second comparison result and outputting results of the comparison of the 2 bits as a fifth comparison result using the plurality of status signals and for performing comparison in magnitude between two low order bits of the first input signal and two low order bits of the second input signal from the third comparison result and the fourth comparison result and outputting results of the comparison of the 2 bits as a sixth comparison result using the plurality of status signals, and a third carry generation section for performing comparison in magnitude between the four bits of the first input signal and the four bits of the second input signal from the fifth comparison result and the sixth comparison result and outputting a result of the comparison of the 4 bits using the plurality of status signals.

The first carry generation section may include a plurality of magnitude discrimination circuits each of which is formed from a first inversion section for inverting the first input signal and outputting the inverted signal, a second inversion section for inverting the second input signal and outputting the inverted signal, and a transmission section capable of discriminating a magnitude relationship of one bit between the first input signal and the second input signal and outputting a result of the discrimination using the plurality of status signals.

Accordingly, the CMOS logic circuit of the present invention is advantageous in that it performs circuit operation at a high speed since the 4-bit magnitude comparison circuit is formed from cells LGEN and LSEL2 and each of the cells normally produces and uses two kinds of signals of a regular phase signal and an inverted phase signal in the inside thereof as described hereinabove. Further, since such cells LGEN and LSEL2 as described above are used, the CMOS logic circuit is advantageous in that it can be formed in a simple circuit configuration.

The second carry generation section may be composed of a first link selector circuit for receiving the first comparison result and the second comparison result as input signals and outputting the fifth comparison result, and a second link selector circuit for receiving the third comparison result and the fourth comparison result as input signals and outputting the sixth comparison result, and the third carry generation section may be composed of a third link selector circuit for receiving the fifth comparison result and the sixth comparison result as input signals and outputting a result of comparison of the four bits.

Each of the first link selector circuit, second link selector circuit and third link selector circuit may include a first branch section for receiving two kinds of comparison result information using four kinds of status signals and branching a first signal of one of the two kinds of comparison result information, a second branch section for branching a second signal of the one of the two kinds of comparison result information, a third branch section for branching a third signal of the one of the two kinds of comparison result information and a fourth branch section for branching a fourth signal of the one of the two kinds of comparison result information, a first selector circuit for receiving signals outputted from the first branch section, second branch section, third branch section and fourth branch section and a third signal and a fourth signal of the other of the two kinds of comparison result information, and a second selector circuit for receiving the signals outputted from the first branch section, second branch section, third branch section and fourth branch section and a first signal and a second signal of the other of the two kinds of comparison result information, the first selector circuit and the second selector circuit being formed from cells LSEL2.

Accordingly, by using the link selector circuits, a circuit having a high degree of expandability can be designed.

(2) Another CMOS logic circuit of the present invention comprises a first comparison section for receiving a first input signal of 16 bits and a second input signal of 16 bits, performing comparison in magnitude between 4 high order bits of the first input signal and 4 high order bits of the second input signal and outputting results of the comparison of the 4 bits as a first comparison result, a second comparison result, a third comparison result and a fourth comparison result using a plurality of status signals, a second comparison section for performing comparison in magnitude between 8 high order bits of the first input signal and 8 high order bits of the second input signal from the first comparison result and the second comparison result and outputting results of the comparison of the 8 high order bits as a fifth comparison result using the plurality of status signals and for performing comparison in magnitude between 8 low order bits of the first input signal and 8 low order bits of the second input signal from the third comparison result and the fourth comparison result and outputting a result of the comparison of the 8 low order bits as a sixth comparison result using the plurality of status signals, and a third comparison section for performing comparison in magnitude between the 16 bits of the first input signal and the 16 bits of the second input signal from the fifth comparison result and the sixth comparison result and outputting a result of the comparison of the 16 bits using the plurality of kinds of status signals.

The first comparison section may include a plurality of 4-bit magnitude comparison circuits, each of which is formed from a cell ICMP4 described hereinabove.

The CMOS logic circuit of the present invention is advantageous in that it can be formed with a simple circuit configuration since the 16-bit magnitude comparison circuit is constructed without varying the basic constructions of the 4-bit magnitude comparison circuits and the link selector circuits and besides makes much use of repetitiveness of wiring lines. Further, the layout man-hours upon development can be reduced significantly and the development man-hours can be reduced significantly, and besides it is possible to design a circuit having a high degree of expandability. Furthermore, since the number of parts can be suppressed, the time required for tuning of parts is reduced significantly when compared with a circuit which includes many parts. Besides, since the 4-bit magnitude comparison circuits and the link selector circuits are formed from cells LGEN and LSEL2, respectively, and each of the leaf cells normally produces two kinds of signals of a regular phase signal and an inverted phase signal in the inside thereof as described hereinabove, there is an advantage that the entire circuit operates at a high speed.

The second comparison section may be composed of a first link selector circuit for receiving the first comparison result and the second comparison result as input signals and outputting the fifth comparison result, and a second link selector circuit for receiving the third comparison result and the fourth comparison result as input signals and outputting the sixth comparison result, and the third comparison section may be composed of a third link selector circuit for receiving the fifth comparison result and the sixth comparison result as input signals and outputting a result of the comparison of the 16 bits.

Each of the first link selector circuit, second link selector circuit and third link selector circuit may include a first branch section for receiving two kinds of comparison result information using two kinds of status signals and branching a first signal of one of the two kinds of comparison result information, a second branch section for branching a second signal of the one of the two kinds of comparison result information, a third branch section for branching a third signal of the one of the two kinds of comparison result information and a fourth branch section for branching a fourth signal of the one of the two kinds of comparison result information, a first selector circuit for receiving signals outputted from the first branch section, second branch section, third branch section and fourth branch section and a third signal and a fourth signal of the other of the two kinds of comparison result information, and a second selector circuit for receiving the signals outputted from the first branch section, second branch section, third branch section and fourth branch section and a first signal and a second signal of the other of the two kinds of comparison result information, the first selector circuit and the second selector circuit being formed from cells LSEL2.

Accordingly, a circuit of a high degree of expandability can be designed by using link selector circuits.

(3) A further CMOS logic circuit of the present invention comprises a first carry generation section for receiving a first input signal of 4 bits and an inverted signal of a second input signal of 4 bits, performing magnitude comparison of them for each one bit and outputting results of the magnitude comparison of the individual bits as a first carry, a second carry, a third carry and a fourth carry using a plurality of status signals, a second carry generation section for outputting logical AND information of the first carry and the second carry as a fifth carry using a plurality of kinds of status signals and outputting logical AND information of the third carry and the fourth carry as a sixth carry using the plurality of kinds of status signals, and a third carry generation section for outputting logical AND information of the first carry, second carry, third carry and fourth carry as a seventh carry from the fifth carry and the sixth carry using the plurality of kinds of status signals and outputting logical AND information of the second carry, third carry and fourth carry as an eighth carry from the second carry and the sixth carry using the plurality of kinds of status signals, the fourth carry, the sixth carry, the seventy carry and the eighth carry being outputted using the plurality of status signals.

The first carry generation section may include a plurality of magnitude discrimination circuits, each of which is formed from a cell LGEN.

The CMOS logic circuit of the present invention is advantageous in that it performs circuit operation at a high speed and has a simplified circuit configuration since the 4-bit full adder circuit is formed from cells LGEN and LSEL2 and each of the cells normally produces and uses two kinds of signals of a regular phase signal and an inverted phase signal in the inside thereof.

The second carry generation section may be composed of a first link selector circuit for receiving the first carry and the second carry as input signals and outputting the fifth carry, and a second link selector circuit for receiving the third carry and the fourth carry as input signals and outputting the sixth carry, and the third carry generation section may be composed of a third link selector circuit for receiving the fifth carry and the sixth carry as input signals and outputting the seventh carry, and a fourth link selector for receiving the second carry and the sixth carry as input signals and outputting the eighth carry.

Each of the first link selector circuit, second link selector circuit, third link selector circuit and fourth link selector circuit may include a first branch section for receiving two kinds of comparison result information using a plurality of kinds of status signals and branching a first signal of one of the two kinds of comparison result information, a second branch section for branching a second signal of the one of the two kinds of comparison result information, a third branch section for branching a third signal of the one of the two kinds of comparison result information and a fourth branch section for branching a fourth signal of the one of the two kinds of comparison result information, a first selector circuit for receiving signals outputted from the first branch section, second branch section, third branch section and fourth branch section and a third signal and a fourth signal of the other of the two kinds of comparison result information, and a second selector circuit for receiving the signals outputted from the first branch section, second branch section, third branch section and fourth branch section and a first signal and a second signal of the other of the two kinds of comparison result information, the first selector circuit and the second selector circuit being formed from cells LSEL2.

Accordingly, a circuit of a high degree of expandability can be designed by using link selector circuits.

(4) A further CMOS logic circuit of the present invention comprises a half addition arithmetic section for receiving a first input signal of 16 bits and an inverted signal of a second input signal of 16 bits and performing half addition arithmetic of the first input signal and the inverted signal of the second input signal, a first arithmetic section for performing full addition arithmetic of the first input signal and the inverted signal of the second input signal separately for each four bits and outputting full addition arithmetic results for the four bits as a first carry, a second carry, a third carry and a fourth carry using a plurality of status signals, a second arithmetic section for outputting logical AND information of the first carry and the second carry as a fifth carry using the plurality of status signals and outputting logical AND information of the third carry and the fourth carry as a sixth carry using the plurality of status signals, a third arithmetic section for outputting logical AND information of all of the 16 bits at least from the fifth carry and the sixth carry as a seventh carry using the plurality of status signals, and a fourth arithmetic section for performing logical exclusive ORing of the output of the half addition arithmetic section and the seventh carry and outputting a full addition arithmetic result.

The first arithmetic section may be composed of a plurality of 4-bit full adder circuits, each of which is formed from a circuit IADD4. The second arithmetic section may be composed of a first link selector circuit for receiving the first carry and the second carry as input signals and outputting the fifth carry, and a second link selector circuit for receiving the third carry and the fourth carry as input signals and outputting the sixth carry, and the third arithmetic section may be composed of a third link selector circuit for receiving the fifth carry and the sixth carry as input signals and outputting the seventh carry, and a fourth link selector for receiving the second carry and the sixth carry as input signals and outputting the eighth carry.

Each of the first link selector circuit, second link selector circuit, third link selector circuit and fourth link selector circuit may include a first branch section for receiving two kinds of comparison result information using a plurality of kinds of status signals and branching a first signal of one of the two kinds of comparison result information, a second branch section for branching a second signal of the one of the two kinds of comparison result information, a third branch section for branching a third signal of the one of the two kinds of comparison result information and a fourth branch section for branching a fourth signal of the one of the two kinds of comparison result information, a first selector circuit for receiving signals outputted from the first branch section, second branch section, third branch section and fourth branch section and a third signal and a fourth signal of the other of the two kinds of comparison result information, and a second selector circuit for receiving the signals outputted from the first branch section, second branch section, third branch section and fourth branch section and a first signal and a second signal of the other of the two kinds of comparison result information, the first selector circuit and the second selector circuit being formed from cells LSEL2.

The half addition arithmetic section may include a first inversion section for outputting an inverted logic value of the first input signal, a second inversion section for outputting a second signal, and a half addition processing section for performing half addition arithmetic between the output of the first inversion section and the output of the second inversion section, and the half addition processing section may be formed from a cell LEOR. The fourth arithmetic section may include an inversion section for outputting an inverted logical value of an input signal, and a half addition arithmetic outputting section for performing half addition arithmetic between the output of the inversion section and the output of the third arithmetic section. The half addition arithmetic outputting section may be formed from a cell LEOR.

The CMOS logic circuit of the present invention is advantageous in that it is simple in circuit configuration making most of utilizing repetitiveness of wiring lines since the 16-bit full adder circuit is formed from 4-bit full adder circuits IADD4, cells LSEL2 and cells LEOR. Further, the 16-bit full adder circuit can be formed so as to receive a minimized number of input signals and so as to cope with various hierarchies from comparison of 1 bit to comparison of 16 bits. Consequently, the layout man-hours upon development can be reduced significantly and the development man-hours can be reduced significantly, and besides it is possible to design a circuit having a high degree of expandability. Further, since the number of parts can be suppressed, the time required for tuning of parts is reduced significantly when compared with a circuit which includes many parts. Furthermore, the man-hours for arrangement or layout of transistors upon development are reduced significantly. Further, since the same leaf cells can be used, the CMOS logic circuit is advantageous in that it contributes to augmentation of the yield and so forth upon production. Furthermore, since two kinds of signals of a regular phase signal and an inverted phase signal are normally produced and used in the inside of each of the leaf cells, there is an advantage that the entire circuit operates at a high speed. Further, by using the link selector circuits, a circuit having a high degree of expandability can be designed.

(5) A yet further CMOS logic circuit of the present invention comprises a first logical AND generation section for receiving two high order bits of a first input signal of 4 bits and two high order bits of an inverted signal of the first input signal of 4 bits as inputs and outputting a first logical AND result and a first logical AND inversion result as logical AND results of the two high order bits of the first input signal, a second logical AND generation section for receiving two low order bits of the first input signal and two low order bits of the inverted signal as inputs thereto and outputting a second logical AND result and a second logical AND inversion result as logical AND results of the two low order bits of the first input signal, a third logical AND generation section for receiving the first logical AND result and the first logical AND inversion result as well as the second logical AND result and the second logical AND inversion result as inputs thereto and outputting a third logical AND result and a third logical AND inversion result as logical AND results of the 4 bits of the first input signal, and a fourth logical AND generation section for receiving the second bit of the first input signal and the second bit of the second input signal as well as the third logical AND result and the third logical AND inversion result as inputs thereto and outputting a fourth logical AND result and a fourth logical AND inversion result as logical AND results of the three high order bits of the first input signal, the CMOS logic circuit outputting the third logical AND result, the fourth logical AND result, the second logical AND result and the fourth bit of the first input signal as a first gate signal of 4 bits while outputting the third logical AND inversion result, the fourth logical AND inversion result, the second logical AND inversion result and the fourth bit of the first input signal as a second gate signal of 4 bits.

The CMOS logic circuit of the present invention is advantageous in that carries can be produced at a high speed since the 4-bit carry generation circuit CARRY001 is formed from cells A001 and a carry necessary for counting up is successively delivered to a next stage at a high speed.

A yet further CMOS logic circuit of the present invention comprises a first carry generation section for receiving a first input signal A<0: 15> of 16 bits and an inverted signal XA<0: 15> of the first input signal of 16 bits as inputs thereto and outputting a logical AND value at least of the bits A<0> to A<3> and an inverted value of the logical AND value as a first logical AND result and a first logical AND inversion result, respectively, a second carry generation section for outputting a logical AND value at least of the bits A<4> to A<7> and an inverted value of the logical AND value as a second logical AND result and a second logical AND inversion result, respectively, a third carry generation section for outputting a logical AND value at least of the bits A<8> to A<11> and an inverted value of the logical AND value as a third logical AND result and a third logical AND inversion result, respectively, a fourth carry generation section for outputting a logical AND value at least of the bits A<12> to A<15> and an inverted value of the logical AND value as a fourth logical AND result and a fourth logical AND inversion result, respectively, a first logical AND generation section for producing from the first logical AND result and the second logical AND result and outputting a fifth logical AND result and a fifth logical AND inversion result as a result of a logical AND value at least of the bits A<0> to A<7>, a second logical AND generation section for producing from the third logical AND result and the fourth logical AND result and outputting a sixth logical AND result and a sixth logical AND inversion result as a result of a logical AND value at least of the bits A<8> to A<15>, a third logical AND generation section for producing from the fifth logical AND result, the fifth logical AND inversion result, the sixth logical AND result and the sixth logical AND inversion result and outputting a seventh logical AND result and a seventh logical AND inversion result as a result of a logical AND value at least of the bits A<0> to A<15>, and a fourth logical AND generation section for producing from the second logical AND result, the second logical AND inversion result, the sixth logical AND result and the sixth logical AND inversion result and outputting an eighth logical AND result and an eighth logical AND inversion result as a result of a logical AND value at least of the bits A<4> to A<15>, the CMOS logic circuit outputting the seventh logical AND result, the eighth logical AND result, the sixth logical AND result and the fourth logical AND result as a first gate signal of 16 bits while outputting the seventh logical AND inversion result, the eighth logical AND inversion result, the sixth logical AND inversion result and the fourth logical AND result as a second gate signal of 16 bits.

The first carry generation section, second carry generation section, third carry generation section and fourth carry generation section may each be formed from a 4-bit carry generation circuit CARRY001.

The CMOS logic circuit of the present invention is advantageous in that carries can be produced at a high speed since the 16-bit carry generation circuit CARRY002 is formed from 4-bit carry generation circuits CARRY001 and cells A001 and a carry necessary for counting up is successively delivered as a carry from the lower order bits to a next stage at a high speed. The CMOS logic circuit is advantageous also in that repetitiveness of wiring patterns can be increased and the CMOS logic circuit can be expanded to a CMOS logic circuit of N bits and the man-hours for circuit designing can be reduced significantly.

(6) In addition, as a yet further CMOS logic circuit of the present invention, in regard to the increment circuit described above, an adder circuit for performing full addition arithmetic of a first input signal of $(n_3+m_4)$ bits ($n_3$ is an integer equal to 2 to the $m_3$th power, here $m_3$ is an even number equal to or greater than 2; $m_4$ is an integer equal to or greater than 1) and a second input signal of $m_4$ bits, may comprise an $n_3$-bit increment circuit, an inversion section provided on the input side of the $n_3$-bit increment circuit for inverting the second input signal and outputting the inverted signal, and an $m_4$-bit full adder circuit for performing full addition arithmetic of low order $m_4$ bits of the first input signal and $m_4$ bits from the inversion section and inputting a carry generation signal produced upon the full addition arithmetic to a full addition arithmetic section of the $n_3$-bit increment circuit, an output of the $n_3$-bit increment circuit being outputted as a value of the high order $n_3$ bits while an output of the $m_4$-bit full addition circuit is outputted as a value of the low order $m_4$ bits.

The $m_4$-bit full adder circuit may be formed from a 4-bit full adder circuit IADD4.

With the CMOS logic circuit of the present invention, since the full adder circuit of 64+4 bits is composed of a 64-bit increment circuit and a 4-bit full adder circuit, there is an advantage that repetitiveness of wiring lines is increased and the circuit configuration is simplified, and consequently, the man-hours for layout upon development can be reduced significantly and the period for development can be reduced significantly. Further, since the number of parts can be suppressed and the expandability is raised, there is another advantage that the time required for tuning of parts is reduced significantly when compared with a circuit which includes many parts. Besides, since the component circuits described above are formed from leaf cells A001 and A002 and two kinds of signals of a regular phase signal and an inverted phase signal are normally produced in each of the leaf cells, there is an advantage that high speed circuit operation can be achieved. The CMOS logic circuit is advantageous also in that a full adder circuit for a first input signal of $(n_3+m_4)$ bits ($m_4$ is an integer equal to or greater than 1) and a second signal of $m_4$ bits can be constructed.

The present invention is not limited to the embodiment specifically described above, and variations and modifications can be made without departing from the scope of the present invention.

What is claimed is:

1. A logic circuit, comprising:
   a first inversion section for inverting a first input signal and outputting the inverted signal;
   a second inversion section for inverting the inverted signal of the first input signal and outputting a resulting signal;
   a first outputting section for performing NANDing arithmetic between the output of said first inversion section and a second input signal and outputting a first resulting signal; and
   a second outputting section for performing NANDing arithmetic between the output of said second inversion section and an inverted signal of the second input signal and outputting a second resulting signal;
   said first outputting section and said second outputting section being switched with the second input signal and the inverted signal of the second input signal, said first outputting section outputs the first resulting signal and said second outputting section outputs the second resulting signal.

* * * * *